(12) United States Patent
Naito et al.

(10) Patent No.: US 9,670,090 B2
(45) Date of Patent: Jun. 6, 2017

(54) LEAD-FREE LOW-MELTING GLASS COMPOSITION, LOW-TEMPERATURE SEALING GLASS FRIT, LOW-TEMPERATURE SEALING GLASS PASTE, CONDUCTIVE MATERIAL, AND CONDUCTIVE GLASS PASTE CONTAINING GLASS COMPOSITION, AND GLASS-SEALED COMPONENT AND ELECTRIC/ELECTRONIC COMPONENT PREPARED USING THE SAME

(71) Applicant: HITACHI CHEMICAL COMPANY, LTD., Tokyo (JP)

(72) Inventors: Takashi Naito, Tokyo (JP); Shinichi Tachizono, Tokyo (JP); Kei Yoshimura, Tokyo (JP); Yuji Hashiba, Tokyo (JP); Takuya Aoyagi, Tokyo (JP); Taigo Onodera, Tokyo (JP); Tatsuya Miyake, Tokyo (JP)

(73) Assignee: Hitachi Chemical Co., Ltd., Tokyo (JP)

(*) Notice: Subject to any disclaimer, the term of this patent is extended or adjusted under 35 U.S.C. 154(b) by 98 days.

(21) Appl. No.: 14/834,386

(22) Filed: Aug. 24, 2015

(65) Prior Publication Data

US 2016/0229737 A1     Aug. 11, 2016

(30) Foreign Application Priority Data

Aug. 29, 2014    (JP) ................................ 2014-175642

(51) Int. Cl.
| | |
|---|---|
| *C03C 3/21* | (2006.01) |
| *C03C 3/12* | (2006.01) |
| *C03C 8/02* | (2006.01) |
| *C03C 8/14* | (2006.01) |
| *H01L 31/068* | (2012.01) |
| *C03C 8/24* | (2006.01) |
| *H01L 31/0224* | (2006.01) |
| *H01L 31/0216* | (2014.01) |
| *H01L 51/52* | (2006.01) |
| *H01B 1/14* | (2006.01) |
| *H01L 41/053* | (2006.01) |
| *C03C 8/08* | (2006.01) |
| *C09D 5/24* | (2006.01) |
| *C03B 23/203* | (2006.01) |
| *C03C 3/14* | (2006.01) |
| *C03C 8/16* | (2006.01) |
| *C03C 8/18* | (2006.01) |

(Continued)

(52) U.S. Cl.
CPC .............. *C03C 8/24* (2013.01); *C03B 23/203* (2013.01); *C03C 3/122* (2013.01); *C03C 3/14* (2013.01); *C03C 3/21* (2013.01); *C03C 8/02* (2013.01); *C03C 8/08* (2013.01); *C03C 8/14* (2013.01); *C03C 8/16* (2013.01); *C03C 8/18* (2013.01); *C09D 5/24* (2013.01); *H01B 1/14* (2013.01); *H01L 31/02168* (2013.01); *H01L 31/022425* (2013.01); *H01L 31/068* (2013.01); *H01L 41/053* (2013.01); *H01L 51/5246* (2013.01); *H01L 2224/16225* (2013.01); *H01L 2924/16152* (2013.01); *H03H 3/02* (2013.01); *H03H 9/1014* (2013.01); *H03H 9/19* (2013.01); *H05K 1/092* (2013.01); *H05K 2203/1126* (2013.01)

(58) Field of Classification Search
CPC .. C03C 3/122; C03C 3/21; C03C 8/02; C03C 8/08; C03C 8/14; C03C 8/16; C03C 8/18; C03C 8/24; H01L 31/068; H01L 31/02168; H01L 51/5246; H01L 41/053; H01L 31/022425; H01L 2224/16225; H01L 2924/16152; H01B 1/14; C09D 5/24; C03B 23/203; H03H 9/19; H03H 3/02; H03H 9/1014; H03H 9/10; H05K 1/092; H05K 2203/1126; H05K 1/09; H01K 1/115

See application file for complete search history.

(56) References Cited

U.S. PATENT DOCUMENTS

| | | | | | |
|---|---|---|---|---|---|
| 3,798,114 | A | * | 3/1974 | Chvatal | ..................... C03C 3/12 428/433 |
| 3,853,568 | A | * | 12/1974 | Chvatal | ..................... C03C 3/12 252/625 |

(Continued)

FOREIGN PATENT DOCUMENTS

JP     2013-032255 A     2/2013

*Primary Examiner* — Elizabeth A Bolden

(74) *Attorney, Agent, or Firm* — Volpe and Koenig, P.C.

(57) ABSTRACT

An $Ag_2O$—$V_2O_5$—$TeO_2$ lead-free low-melting glass composition that is prevented or restrained from crystallization by heating so as to soften and flow more satisfactorily at a low temperature contains a principal component which includes a vanadium oxide, a tellurium oxide and a silver oxide; a secondary component which includes at least one selected from the group consisting of BaO, $WO_3$ and $P_2O_5$; and an additional component which includes at least one selected from the group consisting of oxides of elements in Group 13 of periodic table. A total component of the principal component is 85 mole percent or more in terms of $V_2O_5$, $TeO_2$ and $Ag_2O$. Contents of $TeO_2$ and $Ag_2O$ each is 1 to 2 times as much as a content of $V_2O_5$. A content of the secondary component is 0 to 13 mole percent. A content of the additional component is 0.1 to 3.0 mole percent.

20 Claims, 20 Drawing Sheets

(51) Int. Cl.
    *H03H 9/19*           (2006.01)
    *H03H 3/02*           (2006.01)
    *H03H 9/10*           (2006.01)
    *H05K 1/09*           (2006.01)

(56) References Cited

U.S. PATENT DOCUMENTS 4,945,071 A * 7/1990 Friesen ................. C03C 3/122
                                                                  106/1.14
2014/0145122 A1    5/2014 Sawai et al.

\* cited by examiner ($T_g$: GLASS TRANSITION POINT, $M_g$: YIELD POINT, $T_s$: SOFTENING POINT, $T_{cry}$: CRYSTALLIZATION ONSET TEMPERATURE)

LEAD-FREE LOW-MELTING GLASS COMPOSITION, LOW-TEMPERATURE SEALING GLASS FRIT, LOW-TEMPERATURE SEALING GLASS PASTE, CONDUCTIVE MATERIAL, AND CONDUCTIVE GLASS PASTE CONTAINING GLASS COMPOSITION, AND GLASS-SEALED COMPONENT AND ELECTRIC/ELECTRONIC COMPONENT PREPARED USING THE SAME

CLAIM OF PRIORITY

The present application claims priority from Japanese Patent application serial No. 2014-175642, filed on Aug. 29, 2014, the content of which is hereby incorporated by reference into this application.

BACKGROUND OF THE INVENTION

Field of the Invention

The present invention relates to lead-free low-melting glass compositions. Specifically, the present invention relates to a lead-free low-melting glass composition that is prevented or restrained from crystallization and can thereby soften and flow satisfactorily at a lower temperature. The present invention also relates to a low-temperature sealing glass frit, a low-temperature sealing glass paste, a conductive material, and a conductive glass paste, each of which contains the lead-free low-melting glass composition; and to a glass-sealed component and an electrical/electronic component prepared by using any of them.

Description of Related Art

In some articles, a low-temperature sealing glass frit including a low-melting glass composition and low-thermal-expansion ceramic particles is used typically for sealing and/or bonding. The articles are exemplified by vacuum-insulating double glass panels applied typically to window panes; display panels such as plasma display panels, organic electroluminescent display panels, and fluorescent display tubes; and electrical/electronic components such as quartz resonators, IC ceramic packages, and semiconductor sensors. The low-temperature sealing glass frit is often applied in the form of a low-temperature sealing glass paste. The low-temperature sealing glass paste is applied typically by a screen process printing or dispensing, dried, and fired for use in sealing and/or bonding. Upon the sealing and/or bonding, the low-melting glass composition contained in the low-temperature sealing glass frit or in the corresponding low-temperature sealing glass paste softens, flows, and thereby comes in intimate contact with a member to be sealed and/or to be bonded.

Likewise, a conductive material including a low-melting glass composition and metal particles is used to form an electrode and/or an interconnection in many electrical/electronic components such as solar cells, image display devices, multilayer capacitors, quartz resonators, LEDs (light-emitting diodes), and multilayered circuit boards. The conductive material is also used as a conductive bonding material for conduction. The conductive material is often applied in the form of a conductive glass paste, as with the low-temperature sealing glass frit. The conductive glass paste is applied typically by a screen process printing or dispensing, dried, and fired to form an electrode, an interconnection, and/or a conductive junction. Also upon the formation, the low-melting glass composition contained in the conductive material or in the corresponding conductive glass paste softens, flows, and thereby allows the metal particles to sinter or to be brought into intimate contact with a substrate.

The low-melting glass compositions to be contained in the low-temperature sealing glass frit or the corresponding low-temperature sealing glass paste, as well as the conductive material and the corresponding conductive glass paste have often employed PbO—$B_2O_3$ low-melting glass compositions containing a very large amount of lead oxide. The PbO—$B_2O_3$ low-melting glass compositions have a low softening point of 350° C. to 400° C., can soften and flow satisfactorily at 400° C. to 450° C., and still have relatively high chemical stability. The "softening point" refers to a second endothermic peak temperature as determined by a differential thermal analysis "DTA".

However, more safe materials have been demanded in the electrical and electronic equipment industry in accordance with the recent global trend toward green procurement/green design. Typically, the Directive on the restriction of the use of certain hazardous substances in electrical and electronic equipment (RoHS directive) took effective on 1 Jul. 2006 by the European Union. The RoHS directive restricts the use of six hazardous materials, i.e., lead, mercury, cadmium, hexavalent chromium, polybrominated biphenyls, and polybrominated diphenyl ether.

The PbO—$B_2O_3$ low-melting glass compositions contain a large amount of lead that is restricted by the RoHS directive and are hardly applied to low-temperature sealing glass frits, corresponding low-temperature sealing glass pastes, conductive materials, and corresponding conductive pastes. Thereby, the development of novel lead-free low-melting glass compositions has proceeded. In addition, strong demands have been made to develop lead-free low-melting glass compositions that soften and flow at a lower temperature as compared with the PbO—$B_2O_3$ low-melting glass compositions and still have good chemical stability. These demands have been made so as to allow various glass-sealed components and electrical/electronic components to less undergo thermal damage (to have higher functions) and to have better productivity (with reduced takt time). Specifically, demands have been made to provide lead-free low-melting glass compositions that soften and flow at a temperature of 350° C. or lower, preferably 300° C. or lower, and are applicable typically to sealing and/or bonding or to the formation of electrodes/interconnections and conductive junctions.

Japanese Patent Application Laid-Open No. 2013-32255 (Patent Literature 1) discloses a lead-free low-melting glass composition. The glass composition contains, in terms of oxides, 10 to 60 mass percent of $Ag_2O$, 5 to 65 mass percent of $V_2O_5$, and 15 to 50 mass percent of $TeO_2$. The glass composition contains $Ag_2O$, $V_2O_5$, and $TeO_2$ in a total content of 75 mass percent to less than 100 mass percent, with the remainder being at least one of $P_2O_5$, BaO, $K_2O$, $WO_3$, $Fe_2O_3$, $MnO_2$, $Sb_2O_3$, and ZnO in a content of greater than 0 mass percent to 25 mass percent. The patent literature mentions that the $Ag_2O$—$V_2O_5$—$TeO_2$ lead-free low-melting glass composition has a low softening point of 320° C. or lower, softens and flows at a lower temperature as compared with the conventional PbO—$B_2O_3$ low-melting glass compositions, and still has good chemical stability, where the softening point is determined from the second endothermic peak temperature by the differential thermal analysis (DTA). In addition, Patent Literature 1 proposes a low-temperature sealing glass frit, a low-temperature sealing glass paste, a conductive material, and a conductive glass paste each containing the $Ag_2O$—$V_2O_5$—$TeO_2$ lead-free low-melting glass composition; and an electrical/electronic component prepared using any of them.

SUMMARY OF THE INVENTION

The present invention provides, in an embodiment, a lead-free low-melting glass composition containing a principal component which includes a vanadium oxide, a tellurium oxide and a silver oxide; a secondary component which includes at least one selected from the group consisting of BaO, HO$_3$ and P$_2$O$_5$; and an additional component which includes at least one selected from the group consisting of oxides of elements in Group 13 of periodic table, in which a total component of the principal component is 85 mole percent or more in terms of V$_2$O$_5$, TeO$_2$ and Ag$_2$O, contents of TeO$_2$ and Ag$_2$O each is 1 to 2 times as much as a content of V$_2$O$_5$, and in which a content of the secondary component is 0 to 13 mole percent, and a content of the additional component is 0.1 to 3.0 mole percent.

The present invention allows a lead-free low-melting glass composition containing a vanadium oxide, a tellurium oxide, and a silver oxide to have a smaller crystallization tendency and to be prevented or restrained from crystallization upon heating-firing. This provides a lead-free low-melting glass composition that softens and flows more satisfactorily at a temperature of 350° C. or lower, and preferably 300° C. or lower, still has excellent chemical stability, and meets the RoHS directive.

The lead-free low-melting glass composition according to the embodiment of the present invention, when combined with ceramic particles and/or metal particles, can give a low-temperature sealing glass frit, a low-temperature sealing glass paste, a conductive material, and a conductive glass paste each of which can enjoy advantageous effects of the lead-free low-melting glass composition according to the embodiment of the present invention.

The low-temperature sealing glass frit, low-temperature sealing glass paste, conductive material, and conductive paste each containing the lead-free low-melting glass composition according to the embodiment of the present invention, when applied, can give a glass-sealed component and an electrical/electronic component that includes an electrode/interconnection or a conductive junction. The glass-sealed component, the electrode/interconnection, and the conductive junction are sealed, bonded, or formed at a firing temperature of 350° C. or lower, and preferably 300° C. or lower. These components are obtained after consideration of influence on the environmental burden. Specifically, use of the lead-free low-melting glass composition according to the embodiment of the present invention allows the glass-sealed component and the electrical/electronic component to less undergo thermal damage (to have higher functions), to have better productivity (to require reduced takt time) and better reliability (chemical stability at certain level), and to put less burden on the environment.

DETAILED DESCRIPTION OF THE PREFERRED EMBODIMENTS

Figure 1:
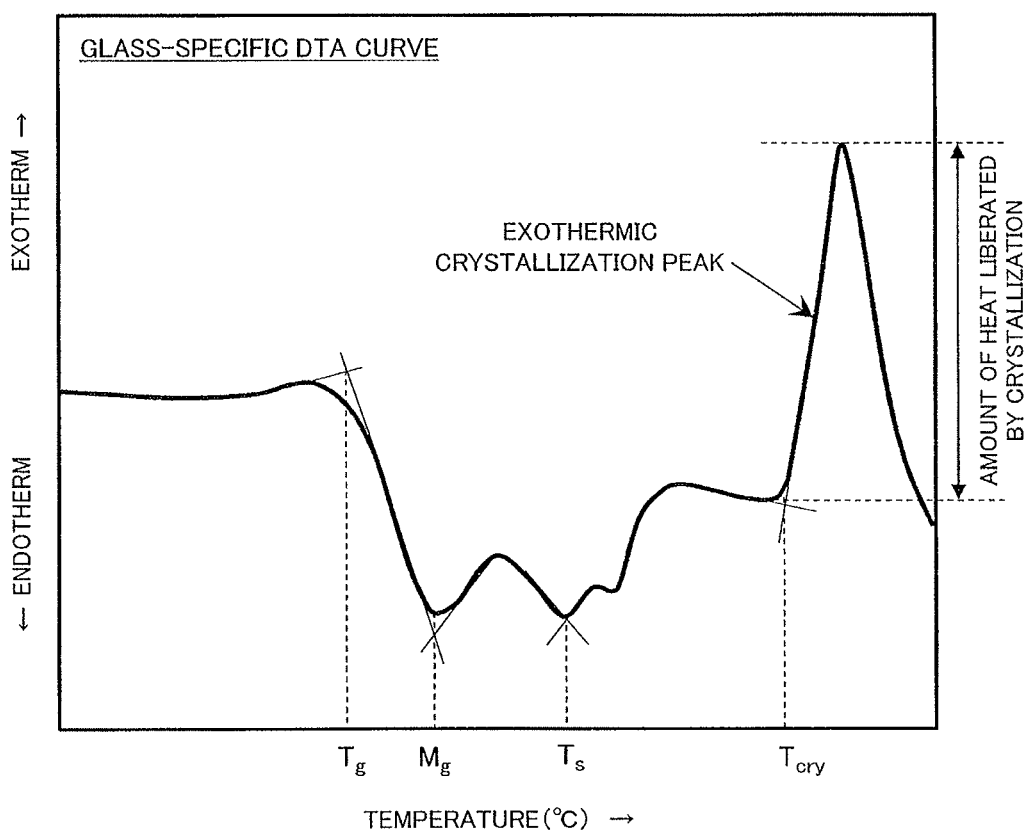
FIG. 1 is a glass-specific differential thermal analysis (DTA) curve on a typical glass formulation.

The $Ag_2O—V_2O_5—TeO_2$ lead-free low-melting glass composition disclosed in Patent Literature 1 certainly has a lower softening point as compared with the conventional $PbO—B_2O_3$ low-melting glass compositions, but has a tendency to crystallize and thereby softens and flows unsatisfactorily due to the crystallization tendency upon heating-firing. Specifically, with insufficient consideration on the crystallization tendency, the glass composition disadvantageously softens and flows unsatisfactorily at a low temperature of 350° C. or lower, and preferably 300° C. lower. Assume that the glass composition is mixed with low-thermal-expansion ceramic particles or metal particles or is formed into a paste upon usage. In this case, the glass composition more significantly undergoes crystallization. This causes the glass composition to be hardly expanded into low-temperature sealing glass frits, low-temperature sealing glass pastes, conductive materials, and conductive pastes and to be hardly applied to glass-sealed components and electrical/electronic components obtained using any of them.

It is an object of the present invention to prevent or restrain the crystallization of a $Ag_2O—V_2O_5—TeO_2$ lead-free low-melting glass composition and to thereby provide a lead-free low-melting glass composition that satisfactorily softens and flows at a temperature of 350° C. or lower, and preferably 300° C. or lower. It is another object of the present invention to provide, based on the above, a lead-free low-melting glass composition that has a smaller crystallization tendency even when mixed with low-thermal-expansion ceramic particles or metal particles, or formed into a paste. It is yet another object of the present invention to expand the lead-free low-melting glass composition so as to provide a low-temperature sealing glass frit, a low-temperature sealing glass paste, a conductive material, and a conductive glass paste; and a glass-sealed component and an electrical/electronic component obtained using any of them.

The present invention provides a lead-free low-melting glass composition that contains a principal component, 0 to 13 mole percent of a secondary component, and 0.1 to 3.0 mole percent, in terms of oxide, of an additional component. The principal component includes a vanadium oxide, a tellurium oxide, and a silver oxide. The total content of the principal component is 85 mole percent or more in terms of $V_2$, $TeO_2$, and $Ag_2O$. The contents of $TeO_2$ and $Ag_2O$ are each 1 to 2 times as much as the content of $V_7O_5$. The secondary component includes at least one selected from the group consisting of BaO, $WO_3$, and $P_2O_5$. The additional component includes at least one selected from oxides of elements in Group 13 of the periodic table. As used herein the term "lead-free" also refers to and includes one containing the restricted materials in contents at the restricted levels or lower as restricted in the RoHS directive (that took effective on 1 Jul. 2006). The restricted level is 1000 ppm or less for lead (Pb).

The glass composition preferably contains, as the additional component, at least one selected from the group consisting of $B_2O_3$, $Al_2O_3$, $Ga_2O_3$ and $In_2O_3$ in a content (total content) in terms of oxide of 0.1 to 2.0 mole percent. In particular, the glass composition may effectively contain at least one selected from the group consisting of $Al_2O_3$, $Ga_2O_3$ and $In_2O_3$ as the additional component. The glass composition more preferably contains the additional component in the content of 0.1 to 1.0 mole percent.

The lead-free low-melting glass composition according to the embodiment of the present invention may have a softening point of 280° C. or lower, where the softening point is determined by a differential thermal analysis (DTA) as a second endothermic peak temperature. The glass composition may have a crystallization onset temperature higher than the second endothermic peak temperature (softening point) by 60° C. or more, where the crystallization onset temperature is determined by the differential thermal analysis (DTA).

The present invention provides, in another embodiment, low-temperature sealing glass frit containing 40 to 100 volume percent of the lead-free low-melting glass composition and 0 to 60 volume percent of low-thermal-expansion ceramic particles. Herein, the low-temperature sealing glass frit contains the lead-free low-melting glass composition and the low-thermal-expansion ceramic particles. Hence, the content of the lead-free low-melting glass composition is actually less than 100 volume percent, and the content of the low-thermal-expansion ceramic particles is actually more than 0 volume percent. The same applies in the following numerical ranges.

The low-thermal-expansion ceramic particles preferably include at least one selected from the group consisting of zirconium phosphate tungstate ($Zr_2(WO_4)(PO_4)_2$), quartz glass ($SiO_2$), zirconium silicate ($ZrSiO_4$), aluminum oxide ($Al_2O_3$), mullite ($3Al_2O_3 \cdot 2SiO_2$), and niobium oxide ($Nb_2O_5$). In particular, the low-thermal-expansion ceramic particles are preferably particles of zirconium phosphate tungstate ($Zr_2(WO_4)(PO_4)_2$) and/or particles of a compound containing mainly zirconium phosphate tungstate ($Zr_2(WO_4)(PO_4)_2$). The glass frit effectively contains 30 to 50 volume percent of the low-thermal-expansion ceramic particles.

The low-temperature sealing glass frit may be prepared from a low-temperature sealing glass paste that contains the lead-free low-melting glass composition according to the embodiment of the present invention in the form of particles, low-thermal-expansion ceramic particles, coda solvent. In the low-temperature sealing glass paste, the low-thermal-expansion ceramic particles preferably include at least one selected from the group consisting of zirconium phosphate tungstate ($Zr_2(WO(PO_4)_2)$), quartz glass ($SiO_2$), zirconium silicate ($ZrSiO_4$), aluminum oxide ($Al_2O_3$), mullite ($3Al_2O_3 \cdot 2SiO_2$), and niobium oxide ($Nb_2O_5$), and the solvent preferably includes α-terpineol and/or diethylene glycol n-butyl ether acetate (e.g., Butyl CARBITOL Acetate). In particular, the low-thermal-expansion ceramic particles effectively include zirconium phosphate tungstate ($Zr_2(WO_4)(PO_4)_2$) and/or a compound containing mainly zirconium phosphate tungstate ($Zr_2(WO_4)(PO_4)_2$) and the solvent effectively includes α-terpineol.

The present invention provides, in yet another embodiment, a conductive material containing 5 to 100 volume percent of the lead-free low-melting glass composition, and 0 to 95 volume percent of metal particles. The conductive material preferably contains, as the metal particles, at least one selected from the group consisting of silver (Ag), silver alloys, copper (Cu), copper alloys, aluminum (Al), aluminum alloys, tin (Sn), and tin alloys. In particular, the conductive material preferably contains at least one of silver (Ag) and aluminum (Al) as the metal particles. The content of the metal particles is effectively 10 to 90 volume percent.

The conductive material may be formed from a conductive glass paste that contains the lead-free low-melting glass composition according to the embodiment of the present invention in the form of particles, and a solvent. The conductive glass paste may further contain metal particles. The metal particles may include at least one selected from the group consisting of silver (Ag), silver alloys, copper (Cu), copper alloys, aluminum (Al), aluminum alloys, tin (Sn), and tin alloys. The solvent preferably includes α-terpineol and/or diethylene glycol n-butyl ether acetate. In an effective embodiment, the metal particles may include silver (Ag) and/or aluminum (Al), and the solvent may include α-terpineol.

The present invention provides, in still another embodiment, a glass-sealed component including a seal portion containing a lead-free low-melting glass phase. The seal portion contains 40 to 100 volume percent of the lead-free low-melting glass phase. The lead-free low-melting glass phase may be derived from the lead-free low-melting glass composition according to the embodiment of the present invention. The glass-sealed component can be effectively expanded typically into vacuum-insulating double glass panels and display panels.

The present invention provides, in another embodiment, an electrical/electronic component including at least one unit selected from electrodes, interconnections, and conductive junctions, where the at least one unit contains the lead-free low-melting glass phase. The unit contains 5 to 100 volume percent of the lead-free low-melting glass phase and 0 to 95 volume percent of metal particles. The electrical/electronic component can be effectively expanded typically into solar cells, image display devices, multilayer capacitors, quartz resonators, LEDs (light-emitting diodes), and multilayered circuit boards.

The present invention will be illustrated in further detail with reference to certain embodiments thereof and the attached drawings. It should be noted, however, that the embodiments are never construed to limit the scope of the present invention; and that various combinations, changes, modifications, and improvements are possible without deviating from the spirit and scope of the present invention.

(Glass Composition)

In general, a low-melting glass composition more satisfactorily softens and flows at a low temperature with a decreasing characteristic temperature (e.g., glass transition point, yield point, or softening point). In contrast, the low-melting glass composition has a higher crystallization tendency, becomes more susceptible to crystallization upon heating-firing, and, contrarily, softens and flows unsatisfactorily at a low temperature with an excessively low characteristic temperature. In addition, a glass having a lower characteristic temperature has inferior chemical stability such as water resistance and acid resistance. This glass also has a tendency to put a larger burden on the environment. Typically, with an increasing content of hazardous PbO, the conventional $PbO$—$B_2O_3$ low-melting glass compositions can have lower characteristic temperatures, but have a higher crystallization tendency and lower chemical stability, and put larger burden on the environment.

The present inventors made intensive investigations on a glass composition that is a low-melting glass composition containing approximately no lead, but can soften and flow satisfactorily at a lower temperature as compared with the conventional $PbO$—$B_2O_3$ low-melting glass compositions, and still has good chemical stability. As a result, the present inventors have found that a novel low-melting glass composition meets the requirements simultaneously. The present invention has been made based on these findings.

As described above, the lead-free low-melting glass composition according to the embodiment of the present invention is a lead-free low-melting glass composition that contains a vanadium oxide, a tellurium oxide, and a silver oxide as principal components. The total content of the principal components is 85 mole percent or more in terms of $V_2O_5$, $TeO_2$, and $Ag_2O$. The contents of $TeO_2$ and $Ag_2O$ are each 1 to 2 times as much as the content of $V_2O_5$. The glass composition further contains 0 to 13 mole percent of a secondary component including at least one selected from the group consisting of BaO, $WO_3$, and $P_2O_5$. The glass composition still further contains 0.1 to 3.0 mole percent of an additional component including at least one selected from oxides of elements in Group 13 of the periodic table. The present inventors have found that the $V_2O_5$—$TeO_2$—$Ag_2O$ lead-free low-melting glass composition can have a lower crystallization tendency, when combined with a small amount of at least one selected from oxides of elements in Group 13 of the periodic table. Specifically, the oxides of elements in Group 13 of the periodic table are exemplified by $B_2O_3$, $Al_2O_3$, $Ga_2O_3$, and $Tl_2O_3$. The content of the additional component may effectively fall the additional component in the content within the range of 0.1 to 3.0 mole percent. The additional component may little contribute to a lower crystallization tendency, if containing the additional component in the content less than 0.1 mole percent. In contrast, the additional component may cause the glass composition to have a higher characteristic temperature such as softening point and/or to have a higher crystallization tendency contrarily, if containing the additional component in the content greater than 3.0 mole percent. $Tl_2O_3$, one of the oxides of elements in Group 13 of the periodic table, is not restricted by the RoHS directive, but is a toxic substance, and its use should be avoided as much as possible even in a small amount. For this reason, of the oxides of elements in Group 13 of the periodic table, at least one of $B_2O_3$, $Al_2O_3$, $Ga_2O_3$, and $In_2O_3$ is preferred. For a still lower crystallization tendency, the glass composition preferably contains the additional component in a content of 0.1 to 2.0 mole percent. Among them, the glass composition more effectively contains at least one of $Al_2O_3$, $Ga_2O_3$, and $In_2O_3$ so as to prevent or restrain crystallization. The content of the additional component is more effectively 0.1 to 1.0 mole percent.

Next, it will be illustrated how the vanadium oxide ($V_2O_5$), tellurium oxide ($TeO_2$) and silver oxide ($Ag_2O$) which are the principal components act in the lead-free low-melting glass composition.

$Ag_2O$ is added so as to allow the glass composition to have lower characteristic temperatures such as glass transition point, yield point, and softening point and to have better chemical stability. $V_2O_5$ is added so as to prevent $Ag_2O$ from reduction and from precipitation as metal silver (Ag) upon glass production. $Ag_2O$ contained as a glass component may fail to effectively offer characteristic temperatures at desired low levels unless it is present in the form of $Ag^+$ ion in the glass. The glass composition can offer lower characteristic temperatures with an increasing content of the silver oxide, i.e., with an increasing amount of silver ions in the glass. However, this requires a higher content of $V_2O_5$ so as to prevent or restrain the precipitation of metal silver (Ag). The glass can contain $Ag^+$ ion in a number of up to 2 per one $V^{5+}$ ion upon its production. $TeO_2$ acts as a vitrification component so as to cause vitrification upon glass production. The glass composition fails to form glass, if containing no $TeO_2$. The glass composition may have a higher crystallization tendency, if the glass composition containing $TeO_2$ in an excessively low content. However, the $Te^{4+}$ ion can act effectively when contained in a number up to 1 per one $V^{5+}$ ion. If the number is greater than 1, a compound between Te and Ag may precipitate.

In consideration of the above-described functions and actions of the vanadium oxide, tellurium oxide, and silver oxide, the lead-free low-melting glass composition according to the embodiment of the present invention effectively has such a basic formulation that the total content of $V_2O_5$, $TeO_2$, and $Ag_2O$ in terms of the oxides is 85 mole percent or more, and the contents of $TeO_2$ and $Ag_2O$ are each 1 to 2 times as much as the content of $V_2O_5$. Disadvantageously, if the glass composition has a basic formulation lower than or higher than the range, the glass composition may cause a metal silver precipitation upon glass production, may have less effectively lowered characteristic temperatures, may undergo a significant crystallization upon heating-firing, or may have an inferior chemical stability. In addition, the glass composition preferably further contains a secondary component including at least one of BaO, $WO_3$, and $P_2O_5$ in the content in terms of the oxides of greater than 0 to 13 mole percent. This is preferred for the lead-free low-melting glass composition according to the embodiment of the present invention to form glass in a homogeneous vitreous state (amorphous state) and for the resulting glass to have a smaller crystallization tendency. However, the glass composition may have higher characteristic temperatures, if containing the secondary component in the content greater than 13 mole percent.

As having the above-mentioned configuration, the lead-free low-melting glass composition according to the embodiment of the present invention can have a softening point of 280° C. or lower, where the softening point is determined by the differential thermal analysis (DTA) as a second endothermic peak temperature. In addition, the glass composition can have a crystallization onset temperature higher than the second endothermic peak temperature (softening point) by 60° C. or more, where the crystallization onset temperature is determined by the DTA. The lead-free low-melting glass composition according to the embodiment of the present invention preferably has a lower softening point and, in contrast, a higher crystallization onset temperature. This allows the glass composition to soften and flow at a low temperature more satisfactorily. This is preferred so as to expand the glass composition into low-temperature sealing glass frits, low-temperature sealing glass pastes, conductive materials, and conductive pastes and to apply them to glass-sealed components and electrical/electronic components. However, conventional low-melting glass compositions may often suffer from a lower crystallization onset temperature, when designed to have a lower softening point.

The characteristic temperatures in the present invention will be described below. The characteristic temperatures herein are measured by the differential thermal analysis (DTA). FIG. 1 is an exemplary DTA curve specific to glass on a typical glass formulation. Measurement of glass by the DTA is generally performed using glass particles having a particle diameter of about several tens of micrometers with high purity aluminum oxide ($\alpha$-$Al_2O_3$) particles as a reference standard. The measurement may be performed in the air at a rate of temperature rise of 5° C. per minute. As illustrated in FIG. 1, the onset temperature of a first endothermic peak is defined as the glass transition point $T_g$; the peak temperature of the first endothermic peak is defined as the yield point (deformation point) $M_g$; the second endothermic peak temperature is defined as the softening point $T_s$; and the onset temperature of the exothermic crystallization peak is defined as the crystallization onset temperature $T_{cry}$. The characteristic temperatures are each generally determined by the tangent method. The characteristic temperatures $T_g$, $M_g$, and $T_s$ are defined by the glass viscosity and are temperatures respectively corresponding to viscosities of $10^{13.3}$ poise, $10^{11.0}$ poise, and $10^{7.65}$ poise. The crystallization tendency may be determined by the crystallization onset temperature $T_{cry}$ and the size of the exothermic crystallization peak, i.e., the amount of heat liberated by crystallization. It can be said that glass is less susceptible to crystallization when having a higher crystallization onset temperature $T_{cry}$, i.e., a larger difference between the softening point $T_s$ and the crystallization onset temperature $T_{cry}$ and having a smaller amount of heat liberated by crystallization.

Assume that a low-melting glass composition is used to seal and/or bond various parts or components or to form electrodes/interconnections and conductive junctions. In this process, the low-melting glass composition is fired generally frequently at a preset temperature higher than the softening point $T_s$ by about 20° C. to about 60° C., although the firing temperature may vary depending typically on the type, content, and particle diameter of the contained low-thermal-expansion ceramic particles or metal particles, and on the firing conditions such as rate of temperature rise, atmosphere, and pressure. The low-melting glass composition has to satisfactorily soften and flow at that firing temperature. It is therefore very important to minimize the crystallization of the low-melting glass composition at the firing temperature.

(Low-Temperature Sealing Glass Frit and Low-Temperature Sealing Glass Paste)

The low-temperature sealing glass frit according to an embodiment of the present invention contains 40 to 100 volume percent of the lead-free low-melting glass composition according to the embodiment of the present invention, and 0 to 60 volume percent of low-thermal-expansion ceramic particles. The low-temperature sealing glass paste according to an embodiment of the present invention contains the lead-free low-melting glass composition according to the embodiment of the present invention in the form of particles, low-thermal-expansion ceramic particles, and a solvent. The glass frit may fail to achieve good sealing and/or bonding, if containing the lead-free low-melting glass composition according to the embodiment of the present invention in the content less than 40 volume percent, or if containing the low-thermal-expansion ceramic particles in the content greater than 60 volume percent.

Some low-thermal-expansion ceramic particles allow the lead-free low-melting glass composition according to the embodiment of the present invention to less undergo crystallization. The glass frit or glass paste may preferably contain, as such low-thermal-expansion ceramic particles, at least one selected from the group consisting of zirconium phosphate tungstate ($Zr_2(WO_4)(PO_4)_2$), quartz glass ($SiO_2$), zirconium silicate ($ZrSiO_4$), aluminum oxide ($Al_2O_3$), mullite ($3Al_2O_3 \cdot 2SiO_2$), and niobium oxide ($Nb_2O_5$). Among these low-thermal-expansion ceramic particles, zirconium phosphate tungstate ($Zr_2(WO_4)(PO_4)_2$) and/or a compound containing mainly zirconium phosphate tungstate ($Zr_2(WO_4)(PO_4)_2$) is effective to allow the low-temperature sealing glass frit according to the embodiment of the present invention to less undergo thermal expansion. The glass frit preferably contains at least one of the components in a content of 30 to 50 volume percent. Some solvents allow the lead-free low-melting glass composition according to the embodiment of the present invention to less undergo crystallization. Such solvents are exemplified by α-terpineol and diethylene glycol n-butyl ether acetate, of which α-terpineol is particularly effective. The low-temperature sealing glass paste may further contain one or more additives such as viscosity modifier and wetting agents as needed so as to control the stability and coatability.

Assume that the low-temperature sealing glass frit or low-temperature sealing glass paste according to the embodiment of the present invention is used for sealing and/or bonding to forma glass-sealed component. In this case, the low-temperature sealing glass frit or low-temperature sealing glass paste is arranged in or applied to a portion of an article to be sealed or to be bonded, and is fired at a temperature higher than the softening point $T_s$ of the contained lead-free low-melting glass composition by about 20° C. to about 60° C. The low-temperature sealing glass frit and low-temperature sealing glass paste according to the embodiments of the present invention each contain the lead-free low-melting glass composition having a lower softening point and having a smaller crystallization tendency, can thereby soften and flow more satisfactorily at a low temperature, and can be fired at a lower temperature. This reduces the burden on the environment and still allows the glass-sealed component to less undergo thermal damage (to have higher functions) and to offer better productivity (with reduced takt time). In addition, the lead-free low-melting glass composition according to the embodiment of the present invention has good chemical stability. This allows the glass-sealed component to have reliability at certain level.

(Conductive Material and Conductive Glass Paste)

The conductive material according to an embodiment of the present invention contains 5 to 100 volume percent of the lead-free low-melting glass composition according to the embodiment of the present invention, and 0 to 95 volume percent of metal particles. The conductive glass paste according to the embodiment of the present invention contains the lead-free low-melting glass composition according to the embodiment of the present invention in the form of particles, metal particles, and a solvent. The conductive material, if containing the lead-free low-melting glass composition according to the embodiment of the present invention in a content less than 5 volume percent, or if containing the metal particles in a content greater than 95 volume percent, may cause insufficient sintering between the metal particles or may offer insufficient bonding (adhesion) to a substrate.

Some metal particles offer good conductivity when mixed with the lead-free low-melting glass composition according to the embodiment of the present invention. Such metal particles may include at least one selected from the group consisting of silver (Ag), silver alloys, copper (Cu), copper alloys, aluminum (Al), aluminum alloys, tin (Sn), and tin alloys. Of these metal particles, silver (Ag) and/or aluminum (Al) particles are effective for allowing the conductive material according to the embodiment of the present invention to have a lower electric resistance. The conductive material may contain at least one of silver (Ag) and aluminum (Al) preferably in the content of 10 to 90 volume percent. The resulting lead-free low-melting glass composition according to the embodiment of the present invention can accelerate the sintering of silver (Ag) particles and can remove a surface oxide film from aluminum (Al) particles. Alpha-terpineol and diethylene glycol n-butyl ether acetate (e.g., Butyl CARBITOL Acetate) are preferred as the solvent for the lead-free low-melting glass composition according to the embodiment of the present invention, of which α-terpineol is particularly effective, as with the low-temperature sealing glass paste according to the embodiment of the present invention. The conductive glass paste may further contain one or more additives such as viscosity modifiers and wetting agents as needed so as to control the stability and coatability.

Assume that the conductive material or conductive glass paste according to the embodiment of the present invention is used so as to form an electrode/interconnection and/or a conductive junction in an electrical/electronic component. In this case, the conductive material or conductive glass paste may be arranged in or applied to a predetermined portion typically of a substrate, and is fired at a temperature higher than the softening point $T_s$ of the contained lead-free low-melting glass composition by about 20° C. to about 60° C. Assume that the metal particles to be used include a metal that is susceptible to oxidation. In this case, the firing is preferably performed in an inert gas atmosphere or in a vacuum atmosphere so as to prevent the metal particles from oxidation.

The conductive material and conductive glass paste according to embodiments of the present invention contain the lead-free low-melting glass composition having a lower softening point and a smaller crystallization tendency, can thereby soften and flow more satisfactorily at a low temperature, and can be fired at a lower temperature. Specifically, the conductive material and conductive glass paste can form the electrode/interconnection and/or the conductive junction at a lower temperature, namely, can be fired at a lower temperature. This reduces the burden on the environment and still allows the electrical/electronic component to undergo less thermal damage (to have higher functions) and to offer better productivity (with reduced takt time). In addition, the lead-free low-melting glass composition according to the embodiment of the present invention has good chemical stability. This allows the electrical/electronic component to have reliability at a certain level.

(Glass-sealed Component)

The glass-sealed component according to an embodiment of the present invention is not limited, as long as including a portion sealed and/or bonded with any of the low-temperature sealing glass frit and low-temperature sealing glass paste according to the embodiments of the present invention. Preferred examples of the glass-sealed component include vacuum-insulating double glass panels applied typically to window panes; as well as display panels such as plasma display panels, organic electroluminescent display panels, and fluorescent display tubes. The glass frit and glass paste can also be expanded typically into bonding in electrical/electronic components such as quartz resonators, IC ceramic packages, and semiconductor sensors.

(Electrical/Electronic Component)

The electrical/electronic component according to an embodiment of the present invention is not limited, as long as including an electrode/interconnection and/or a conductive junction formed using any of the conductive material and conductive glass paste according to embodiments of the present invention. Preferred examples of the electrical/electronic component include solar cells, image display devices, multilayer capacitors, quartz resonators, LEDs, and multilayered circuit boards.

EXAMPLES

The present invention will be illustrated in further detail with reference to specific experimental examples below. It should be noted, however, that the experimental examples are never construed to limit the scope of the present invention; and that various modifications and variations are possible without deviating from the spirit and scope of the present invention.

Experimental Example 1

In this experimental example, a trace amount of any of oxides of elements in Group 13 of the periodic table was added as an additional component to a lead-free low-melting glass composition containing a vanadium oxide, a tellurium oxide, and a silver oxide as principal components. In this process, how the addition affects the glass properties was examined. The lead-free low-melting glass composition basically contains $21V_2O_5$-$38TeO_2$-$37Ag_2O$-$3BaO$-$1WO_3$ (mole percent) as a formulation upon glass production. The oxides of elements in Group 13 of the periodic table used herein were $B_2O_3$, $Al_2O_3$, $Ga_2O_3$, $In_2O_3$, and $Tl_2O_3$. The lead-free low-melting glass composition contained any one of these oxides in a content of 0.3 mole percent. The additional component was added while replacing part of $WO_3$. Namely, the $WO_3$ content herein was set to 0.7 mole percent.

In this experimental example, six different lead-free low-melting glass compositions VTA-100 to VTA-105 including one having the basic formulation were prepared. The resulting lead-free low-melting glass compositions were examined and evaluated on vitrification, characteristic temperatures in relation to crystallization tendency, and chemical stability. VTA-100 had the basic glass formulation of $21V_2O_5$-$38TeO_2$-$37Ag_2O$-$3BaO$-$1WO_3$ (mole percent). VTA-101 to VTA-105 are glass compositions containing $WO_3$ in the content of 0.7 mole percent and respectively containing $B_2O_3$, $Al_2O_3$, $Ga_2O_3$, $In_2O_3$, and $Tl_2O_3$ in the content of 0.3 mole percent.

(Preparation of Lead-Free Low-Melting Glass Composition)

Lead-free low-melting glass compositions VTA-100 to VTA-105 as in Table 1 were prepared. The formulations given in Table 1 are formulations upon glass production. Starting materials used herein were powders of $V_2O_5$ (Shinko Chemical Co., Ltd.), $TeO_2$ (Kojundo Chemical Laboratory Co., Ltd.), $Ag_2O$ (Wako Pure Chemical Industries, Ltd.), $BaCO_3$ (Kojundo Chemical Laboratory Co., Ltd.), and $WO_3$ (Kojundo Chemical Laboratory Co., Ltd.). The oxides of elements in Group 13 of the periodic table used herein were powders of $B_2O_3$, $Al_2O_3$, $Ga_2O_3$, $In_2O_3$, and $Tl_2O_3$ each supplied by Kojundo Chemical Laboratory Co., Ltd.

Individual starting material powders were weighed, formulated, and mixed to a total amount of about 200 g, and the mixture was placed in a quartz glass crucible. The quartz glass crucible housing the starting material powder mixture was placed in a glass melter, heated to a temperature of 700° C. to 750° C. at a rate of temperature rise of about 10° C. per minute, and held at the temperature for one hour with stirring using an aluminum oxide rod so as to uniformize the formulation of the melt in the quartz glass crucible. The quartz glass crucible was retrieved from the glass melter, the melt was poured into a stainless steel mold previously heated to about 120° C., and thereby yielded the lead-free low-melting glass compositions VTA-100 to VTA-105. Next, each of the prepared lead-free low-melting glass compositions was pulverized to a size of about 10 μm.

TABLE 1

Vitrification, characteristic temperatures, crystallization tendency, and chemical stability of lead-free low-melting glass compositions

| | | Glass number | Additional component (0.3 mole percent) | Vitrification | Characteristic temperatures (° C.) | | | | Amount of heat liberated by crystallization (μV) | Reduction of crystallization tendency | Chemical stability | |
| | | | | | Glass transition Point Tg | Yield point Mg | Softening point Ts | Crystallization onset temperature Tcry | | | Water resistance test | Acid resistance test |
|---|---|---|---|---|---|---|---|---|---|---|---|---|
| Comparative Example | Basic formulation[1] | VTA-100 | None | Accepted | 167 | 182 | 216 | 260 | 12 | — | Accepted | Accepted |

TABLE 1-continued

Vitrification, characteristic temperatures, crystallization tendency, and chemical stability of lead-free low-melting glass compositions

| | Glass number | | Additional component (0.3 mole percent) | Vitrification | Characteristic temperatures (° C.) | | | | Amount of heat liberated by crystallization (µV) | Reduction of crystallization tendency | Chemical stability | |
| | | | | | Glass transition Point Tg | Yield point Mg | Softening point Ts | Crystallization onset temperature Tcry | | | Water resistance test | Acid resistance test |
|---|---|---|---|---|---|---|---|---|---|---|---|---|
| Example | Oxide of element of Group 13 in the periodic table[2] | VTA-101 | $B_2O_3$ | Accepted | 167 | 181 | 215 | 260 | 5.2 | 3 | Accepted | Accepted |
| | | VTA-102 | $Al_2O_3$ | Accepted | 168 | 184 | 220 | No exothermic crystallization peak | 0 | 5 | Accepted | Accepted |
| | | VTA-103 | $Ga_2O_3$ | Accepted | 166 | 183 | 219 | 288 | 0.5 | 4 | Accepted | Accepted |
| | | VTA-104 | $In_2O_3$ | Accepted | 166 | 181 | 218 | 280 | 2.2 | 4 | Accepted | Accepted |
| | | VTA-105 | $Tl_2O_3$ | Accepted | 162 | 180 | 217 | 261 | 3.5 | 3 | Accepted | Accepted |
| Comparative Example | Conventional lead-containing glass[3] | PB-100 | None | Accepted | 313 | 332 | 386 | — | — | — | Rejected | Rejected |

[1] $21V_2O_5$—$38TeO_2$—$38Ag_2O$—$3BaO$—$1WO_3$ (mole percent)
[2] $21V_2O_5$—$38TeO_2$—$38Ag_2O$—$3BaO$—$0.7WO_3$—$0.3$ additional component (mole percent)
[3] $84PbO$—$13B_2O_3$—$2SiO_2$—$1Al_2O_3$ (mass percent)

(Evaluation of Vitrification)

The prepared lead-free low-melting glass compositions VTA-100 to VTA-105 were subjected to X-ray diffractometry to determine whether crystallization occurred in each glass composition in the form of powder and to evaluate the vitrification. A sample suffering from no crystallization was considered to be vitrified satisfactorily and evaluated as "accepted". In contrast, a sample suffering from crystallization was considered to fail to have a homogeneous amorphous state as a result of vitrification and evaluated as "rejected".

(Evaluation of Characteristic Temperatures and Crystallization Tendency)

The prepared lead-free low-melting glass compositions VTA-100 to VTA-1.05 were subjected to differential thermal analysis (DTA) using a powder of each glass composition to evaluate or determine their characteristic temperatures and crystallization tendency. The DTA was performed with a macrocell system, where about 500 mg of a sample glass powder was placed in the macrocell, heated in the air from room temperature up to 400° C. at a rate of temperature rise of 5° C. per minute to plot a DTA curve as illustrated in FIG. 1. Based on the plotted DTA curve, the glass transition point $T_g$, yield point $M_g$, softening point $T_s$, and crystallization onset temperature $T_{cry}$ were determined. In addition, the size of the exothermic crystallization peak was measured to determine the amount of heat liberated by crystallization. How the crystallization tendency was effectively reduced was evaluated in five grades based on the crystallization onset temperature $T_{cry}$ and the amount of heat liberated by crystallization. A sample offering no exothermic crystallization peak as compared with the VTA-100 glass having the basic formulation was evaluated as extremely good and rated "5". A sample apparently offering both a higher crystallization onset temperature $T_{cry}$ and a smaller amount of liberated heat was evaluated as very good and rated "4", and a sample apparently offering one of the two factors was evaluated as good and rated "3". In contrast, a sample apparently offering both a lower crystallization onset temperature $T_{cry}$ and a larger amount of liberated heat was evaluated as very faulty and rated "1", and a sample apparently offering one of the two factors was evaluated as faulty and rated "2". Samples having a rating "3" or greater were regarded as having an effectively reduced crystallization tendency.

(Evaluation of Chemical Stability)

The prepared lead-free low-melting glass compositions VTA-100 to VTA-105 were each subjected to a water resistance test and an acid resistance test to evaluate a chemical stability. Glass test specimens were cullet having a size of about 10 to about 20 mm before pulverization. In the water resistance test, the cullet was immersed in pure water at 50° C. for 48 hours. In the acid resistance test, the cullet was immersed in a 1 N aqueous nitric acid solution at room temperature for 24 hours. The cullet specimens after the two tests were visually observed on appearance. A sample offering no change in appearance was evaluated as "accepted", whereas a sample offering a change in appearance was evaluated as "rejected". As a comparative example, cullet of conventional lead-containing low-melting glass composition PB-100 was subjected to the tests as above. The lead-containing low-melting glass composition PB-100 used as a comparative example had a formulation of $84PbO$-$13B_2O_3$-$2SiO_2$-$1Al_2O_3$ (mass percent), a glass transition point $T_g$ of 313° C., a yield point $M_g$ of 332° C., and a softening point $T_s$ of 386° C.

Table 1 shows the evaluation results of the vitrification, characteristic temperatures in relation to crystallization tendency, and chemical stability of the lead-free low-melting glass compositions VTA-100 to VTA-105. Table 1 also shows the evaluation results of the conventional lead-containing low-melting glass composition PB-100.

The lead-free low-melting glass composition VTA-100 (comparative example) having the basic formulation had significantly low characteristic temperatures $T_g$, $M_g$, and $T_s$ and can soften and flow at a significantly low temperature as compared with the lead-containing low-melting glass composition PB-100 (comparative example). The sample VTA-100 had very high chemical stability in spite of having low characteristic temperatures. The sample, however, had a crystallization tendency at a temperature around 260° C. The sample had a difference between the temperatures $T_{cry}$ and $T_s$ of about 40° C., but offered a relatively large amount of heat liberated by crystallization, and could less satisfactorily soften and flow upon heating-firing. It was difficult to expand the sample into the sealing and/or bonding and into the formation of electrodes/interconnections and conductive junctions. In contrast, the lead-free low-melting glass compositions VTA-101 to VTA-105 (examples) containing a trace amount of any of oxides of elements in Group 13 of the periodic table had a still lower crystallization tendency as compared with the comparative example VTA-100. In addition, the examples VTA-101 to VTA-105 had little rise in the characteristic temperatures $T_g$, $M_g$, and $T_s$ and suffered from approximately no deterioration in chemical stability.

However, $Tl_2O_3$ contained in VTA-105 is a toxic substance, and its use should be avoided as much as possible even in a trace amount. For this reason, of the oxides of elements in Group 13 of the periodic table, $B_2O_3$, $Al_2O_3$, $Ga_2O_3$, and $In_2O_3$ are preferably used as in VTA-101 to VTA-104. The data demonstrated as follows. Among them, particularly in VTA-103 to VTA-105, the presence of $Al_2O_3$, $Ga_2O_3$, and $In_2O_3$ is significantly effective for a lower crystallization tendency, of which $Al_2O_3$ is most effective, followed by $Ga_2O_3$ and $In_2O_3$ in this order.

These data and considerations demonstrated as follows. Assume that lead-free low-melting glass compositions contain a vanadium oxide ($V_2O_5$), a tellurium oxide ($TeO_2$), and a silver oxide ($Ag_2O$) as principal components. These lead-free low-melting glass compositions, when further containing at least one of oxides of elements in Group 13 of the periodic table as an additional component, can particularly have a lower crystallization tendency without significant rise in the softening point $T_s$ and without deterioration in chemical stability. In consideration of influence on the environmental burden, of the oxides of elements in Group 13 of the periodic table, preferred to be contained are $B_2O_3$, $Al_2O_3$, $Ga_2O_3$, and $In_2O_3$, of which $Al_2O_3$, $Ga_2O_3$, and $In_2O_3$ significantly effectively contributed to a lower crystallization tendency. Among them, $Al_2O_3$ was most effective, followed by $Ga_2O_3$ and $In_2O_3$ in this order, for the lower crystallization tendency.

Experimental Example 2

In this experimental example, lead-free low-melting glass compositions containing a vanadium oxide ($V_2O_5$), a tellurium oxide ($TeO_2$), and a silver oxide ($Ag_2O$) as principal components and further containing any of oxides of elements in Group 13 of the periodic table were prepared. How the content of any of the oxides of elements in Group 13 of the periodic table affects the vitrification, characteristic temperatures in relation to crystallization tendency, and chemical stability was investigated. The oxides of elements in Group 13 of the periodic table used herein were $Al_2O_3$, $Ga_2O_3$, and $In_2O_3$, each of which was contained in a content of 0 to 5 mole percent.

The investigated formulations (mole percent) of the lead-free low-melting glass compositions are given in Table 2. The lead-free low-melting glass compositions were examined to evaluate the vitrification, characteristic temperatures in relation to crystallization tendency, and chemical stability, and the results are given in Table 3. The lead-free low-melting glass compositions were prepared and evaluated by the procedure of Experimental Example 1. VTA-106 and VTA-118 to VTA-122 in Tables 2 and 3 are lead-free low-melting glass compositions containing none of oxides of elements in Group 13 of the periodic table and were used as comparative examples. Other lead-free low-melting glass compositions contained at least one of $Al_2O_3$, $Ga_2O_3$, and $In_2O_3$.

TABLE 2

| Formulation (mole percent) of lead-free low-melting glass composition | | | | | | | | | |
|---|---|---|---|---|---|---|---|---|---|
| Glass | Principal component | | | Secondary component | | | Additional component | | |
| number | $V_2O_5$ | $TeO_2$ | $Ag_2O$ | BaO | $WO_3$ | $P_2O_5$ | $Al_2O_3$ | $Ga_2O_3$ | $In_2O_3$ |
| VTA-106 | 20.0 | 40.0 | 40.0 | — | — | — | 0.0 | — | — | Comparative Example |
| VTA-107 | 20.0 | 40.0 | 39.9 | — | — | — | 0.1 | — | — |
| VTA-108 | 20.0 | 40.0 | 39.9 | — | — | — | — | 0.1 | — |
| VTA-109 | 20.0 | 39.7 | 40.0 | — | — | — | 0.3 | — | — |
| VTA-110 | 20.0 | 40.0 | 39.5 | — | — | — | 0.5 | — | — |
| VTA-111 | 20.0 | 40.0 | 39.5 | — | — | — | — | 0.5 | — |
| VTA-112 | 20.0 | 40.0 | 39.0 | — | — | — | 1.0 | — | — |
| VTA-113 | 20.0 | 40.0 | 39.0 | — | — | — | 0.5 | 0.5 | — |
| VTA-114 | 20.0 | 40.0 | 38.0 | — | — | — | 2.0 | — | — |
| VTA-115 | 20.0 | 40.0 | 38.0 | — | — | — | 1.0 | 1.0 | — |
| VTA-116 | 20.0 | 39.0 | 38.0 | — | — | — | 3.0 | — | — |
| VTA-117 | 20.0 | 39.0 | 36.0 | — | — | — | 5.0 | — | — | Comparative Example |
| VTA-118 | 20.0 | 39.0 | 36.0 | 5.0 | — | — | — | — | — | Comparative Example |
| VTA-119 | 20.0 | 39.0 | 36.0 | — | 5.0 | — | — | — | — | Comparative Example |
| VTA-120 | 20.0 | 37.0 | 33.0 | 5.0 | 5.0 | — | — | — | — | Comparative Example |
| VTA-121 | 20.0 | 40.0 | 30.0 | 5.0 | 5.0 | — | — | — | — | Comparative Example |
| VTA-122 | 30.0 | 30.0 | 30.0 | 5.0 | — | 5.0 | — | — | — | Comparative Example |
| VTA-123 | 20.0 | 38.9 | 36.0 | 5.0 | — | — | 0.1 | — | — |
| VTA-124 | 20.0 | 39.9 | 30.0 | 5.0 | 5.0 | — | 0.1 | — | — |
| VTA-125 | 20.0 | 38.0 | 36.0 | 5.0 | 0.7 | — | 0.3 | — | — |
| VTA-126 | 20.0 | 38.0 | 36.0 | 5.0 | 0.7 | — | — | 0.3 | — |
| VTA-127 | 20.0 | 38.5 | 36.0 | 5.0 | — | — | 0.5 | — | — |
| VTA-128 | 20.0 | 38.5 | 36.0 | — | 5.0 | — | 0.5 | — | — |
| VTA-129 | 20.0 | 39.5 | 30.0 | 5.0 | 5.0 | — | 0.5 | — | — |
| VTA-130 | 20.0 | 37.5 | 35.0 | 5.0 | 2.0 | — | 0.5 | — | — |

TABLE 2-continued

Formulation (mole percent) of lead-free low-melting glass composition

| Glass number | Principal component | | Secondary component | | | Additional component | | | |
|---|---|---|---|---|---|---|---|---|---|
| | $V_2O_5$ | $TeO_2$ | $Ag_2O$ | BaO | $WO_3$ | $P_2O_5$ | $Al_2O_3$ | $Ga_2O_3$ | $In_2O_3$ | |
| VTA-131 | 20.0 | 36.5 | 33.0 | 5.0 | 5.0 | — | 0.5 | — | — | |
| VTA-132 | 20.0 | 37.5 | 35.0 | 5.0 | — | 2.0 | 0.5 | — | — | |
| VTA-133 | 27.0 | 35.0 | 27.0 | — | 4.0 | 6.5 | 0.5 | — | — | |
| VTA-134 | 19.0 | 37.5 | 33.0 | 4.0 | 4.0 | 2.0 | 0.5 | — | — | |
| VTA-135 | 20.0 | 40.0 | 26.5 | 13.0 | — | — | — | 0.5 | — | |
| VTA-136 | 20.0 | 35.0 | 40.0 | 2.0 | 1.0 | 2.0 | — | 0.5 | — | |
| VTA-137 | 20.0 | 36.5 | 30.0 | 5.0 | 5.0 | 3.0 | — | 0.5 | — | |
| VTA-138 | 20.0 | 36.5 | 30.0 | 3.0 | 7.0 | 3.0 | — | 0.5 | — | |
| VTA-139 | 20.0 | 38.5 | 35.5 | 5.0 | — | — | 1.0 | — | — | |
| VTA-140 | 20.0 | 38.5 | 35.5 | — | — | 5.0 | 1.0 | — | — | |
| VTA-141 | 20.0 | 36.0 | 32.0 | 6.0 | 5.0 | — | 1.0 | — | — | |
| VTA-142 | 20.0 | 38.0 | 28.0 | 5.0 | 8.0 | — | 1.0 | — | — | |
| VTA-143 | 25.5 | 35.0 | 25.5 | — | 8.0 | 5.0 | 1.0 | — | — | |
| VTA-144 | 20.0 | 40.0 | 36.0 | 1.0 | 1.0 | 1.0 | — | 1.0 | — | |
| VTA-145 | 20.0 | 38.5 | 35.5 | 5.0 | — | — | 0.5 | 0.5 | — | |
| VTA-146 | 20.0 | 40.0 | 29.0 | 5.0 | 5.0 | — | 0.5 | 0.5 | — | |
| VTA-147 | 20.0 | 36.0 | 33.0 | 5.0 | 5.0 | — | 0.5 | 0.5 | — | |
| VTA-148 | 20.0 | 36.0 | 33.0 | 5.0 | 5.0 | — | 0.5 | — | 0.5 | |
| VTA-149 | 20.0 | 36.0 | 33.0 | 5.0 | 5.0 | — | 0.5 | 0.5 | 0.5 | |
| VTA-150 | 20.0 | 38.0 | 35.0 | 5.0 | — | — | 2.0 | — | — | |
| VTA-151 | 20.0 | 37.0 | 31.0 | 5.0 | 5.0 | — | 2.0 | — | — | |
| VTA-152 | 17.0 | 34.0 | 34.0 | 6.0 | 5.0 | 2.0 | 1.0 | 1.0 | — | |
| VTA-153 | 20.0 | 37.0 | 35.0 | 5.0 | — | — | 3.0 | | — | |
| VTA-154 | 20.0 | 37.0 | 30.0 | 5.0 | 5.0 | — | 3.0 | — | — | |
| VTA-155 | 20.0 | 37.0 | 30.0 | 5.0 | 5.0 | — | — | 3.0 | — | |
| VTA-156 | 20.0 | 37.0 | 30.0 | 5.0 | 5.0 | — | 1.0 | 1.0 | 1.0 | |
| VTA-157 | 20.0 | 35.0 | 35.0 | 5.0 | — | — | 5.0 | — | — | Comparative Example |
| VTA-158 | 20.0 | 37.0 | 28.0 | 5.0 | 5.0 | — | 5.0 | — | — | Comparative Example |
| VTA-159 | 20.0 | 37.0 | 28.0 | 5.0 | 5.0 | — | — | 5.0 | — | Comparative Example |
| VTA-160 | 20.0 | 37.0 | 28.0 | 5.0 | 5.0 | — | 2.0 | 2.0 | 1.0 | Comparative Example |

TABLE 3

Vitrification, characteristic temperatures, crystallization tendency, and chemical stability of lead-free low-melting glass compositions

| Glass number | Vitrification | Characteristic temperature (° C.) | | | | Amount of heat liberated by crystallization (μV) | Reduction of crystallization tendency | Chemical stability | | |
|---|---|---|---|---|---|---|---|---|---|---|
| | | Glass transition Point Tg | Yield point Mg | Softening point Ts | Crystallization onset temperature Tcry | | | Water resistance test | Acid resistance test | |
| VTA-106 | Accepted | 153 | 168 | 196 | 260 | 150 | — | Accepted | Accepted | Comparative Example |
| VTA-107 | Accepted | 155 | 169 | 197 | 295 | 27 | 4 | Accepted | Accepted | |
| VTA-108 | Accepted | 152 | 167 | 194 | 278 | 35 | 4 | Accepted | Accepted | |
| VTA-109 | Accepted | 153 | 166 | 195 | 293 | 17 | 4 | Accepted | Accepted | |
| VTA-110 | Accepted | 156 | 172 | 199 | 299 | 3 | 4 | Accepted | Accepted | |
| VTA-111 | Accepted | 155 | 170 | 196 | 285 | 15 | 4 | Accepted | Accepted | |
| VTA-112 | Accepted | 158 | 175 | 207 | 305 | 2 | 4 | Accepted | Accepted | |
| VTA-113 | Accepted | 157 | 174 | 203 | 301 | 2 | 4 | Accepted | Accepted | |
| VTA-114 | Accepted | 162 | 180 | 214 | 303 | 3 | 4 | Accepted | Accepted | |
| VTA-115 | Accepted | 159 | 176 | 209 | 306 | 5 | 4 | Accepted | Accepted | |
| VTA-116 | Accepted | 165 | 188 | 224 | 310 | 11 | 4 | Accepted | Accepted | |
| VTA-117 | Accepted | 168 | 192 | 234 | 255 | 47 | 2 | Accepted | Accepted | Comparative Example |
| VTA-118 | Accepted | 167 | 180 | 218 | 258 | 33 | — | Accepted | Accepted | Comparative Example |
| VTA-119 | Accepted | 175 | 184 | 225 | 283 | 12 | — | Accepted | Accepted | Comparative Example |
| VTA-120 | Accepted | 186 | 203 | 236 | 285 | 26 | — | Accepted | Accepted | Comparative Example |
| VTA-121 | Accepted | 191 | 208 | 242 | 305 | 14 | — | Accepted | Accepted | Comparative Example |
| VTA-122 | Accepted | 224 | 247 | 284 | 337 | 7 | — | Accepted | Accepted | Comparative Example |
| VTA-123 | Accepted | 168 | 178 | 219 | 288 | 4 | 4 | Accepted | Accepted | |
| VTA-124 | Accepted | 190 | 205 | 242 | 325 | 2 | 4 | Accepted | Accepted | |
| VTA-125 | Accepted | 173 | 188 | 227 | No exothermic peak | 0 | 5 | Accepted | Accepted | |
| VTA-126 | Accepted | 170 | 186 | 222 | No exothermic peak | 0 | 5 | Accepted | Accepted | |
| VTA-127 | Accepted | 172 | 182 | 224 | No exothermic peak | 0 | 5 | Accepted | Accepted | |
| VTA-128 | Accepted | 179 | 189 | 229 | 326 | 1 | 4 | Accepted | Accepted | |
| VTA-129 | Accepted | 193 | 215 | 255 | No exothermic peak | 0 | 5 | Accepted | Accepted | |
| VTA-130 | Accepted | 177 | 195 | 235 | No exothermic peak | 0 | 5 | Accepted | Accepted | |
| VTA-131 | Accepted | 189 | 205 | 244 | No exothermic peak | 0 | 5 | Accepted | Accepted | |

TABLE 3-continued

Vitrification, characteristic temperatures, crystallization tendency, and chemical stability of lead-free low-melting glass compositions

| Glass number | Vitrification | Characteristic temperature (° C.) | | | | Amount of heat liberated by crystallization (μV) | Reduction of crystallization tendency | Chemical stability | | |
|---|---|---|---|---|---|---|---|---|---|---|
| | | Glass transition Point Tg | Yield point Mg | Softening point Ts | Crystallization onset temperature Tcry | | | Water resistance test | Acid resistance test | |
| VTA-132 | Accepted | 179 | 199 | 240 | No exothermic peak | 0 | 5 | Accepted | Accepted | |
| VTA-133 | Accepted | 223 | 234 | 277 | No exothermic peak | 0 | 5 | Accepted | Accepted | |
| VTA-134 | Accepted | 200 | 212 | 263 | No exothermic peak | 0 | 5 | Accepted | Accepted | |
| VTA-135 | Accepted | 212 | 242 | 279 | No exothermic peak | 0 | 5 | Accepted | Accepted | |
| VTA-136 | Accepted | 187 | 204 | 236 | 316 | 1 | 4 | Accepted | Accepted | |
| VTA-137 | Accepted | 221 | 245 | 280 | No exothermic peak | 0 | 5 | Accepted | Accepted | |
| VTA-138 | Accepted | 220 | 241 | 278 | No exothermic peak | 0 | 5 | Accepted | Accepted | |
| VTA-139 | Accepted | 171 | 191 | 230 | No exothermic peak | 0 | 5 | Accepted | Accepted | |
| VTA-140 | Accepted | 174 | 192 | 237 | No exothermic peak | 0 | 5 | Accepted | Accepted | |
| VTA-141 | Accepted | 193 | 210 | 250 | No exothermic peak | 0 | 5 | Accepted | Accepted | |
| VTA-142 | Accepted | 226 | 238 | 280 | No exothermic peak | 0 | 5 | Accepted | Accepted | |
| VTA-143 | Accepted | 228 | 241 | 280 | No exothermic peak | 0 | 5 | Accepted | Accepted | |
| VTA-144 | Accepted | 177 | 193 | 226 | 313 | 2 | 4 | Accepted | Accepted | |
| VTA-145 | Accepted | 170 | 195 | 232 | No exothermic peak | 0 | 5 | Accepted | Accepted | |
| VTA-146 | Accepted | 197 | 213 | 253 | No exothermic peak | 0 | 5 | Accepted | Accepted | |
| VTA-147 | Accepted | 190 | 205 | 248 | No exothermic peak | 0 | 5 | Accepted | Accepted | |
| VTA-148 | Accepted | 190 | 203 | 247 | No exothermic peak | 0 | 5 | Accepted | Accepted | |
| VTA-149 | Accepted | 193 | 202 | 252 | 348 | 2 | 4 | Accepted | Accepted | |
| VTA-150 | Accepted | 177 | 202 | 245 | 365 | 0.4 | 4 | Accepted | Accepted | |
| VTA-151 | Accepted | 197 | 207 | 256 | 364 | 0.7 | 4 | Accepted | Accepted | |
| VTA-152 | Accepted | 222 | 236 | 280 | 385 | 0.5 | 4 | Accepted | Accepted | |
| VTA-153 | Accepted | 173 | 202 | 238 | 265 | 5 | 3 | Accepted | Accepted | |
| VTA-154 | Accepted | 201 | 211 | 254 | 315 | 3 | 3 | Accepted | Accepted | |
| VTA-155 | Accepted | 197 | 208 | 251 | 317 | 7 | 3 | Accepted | Accepted | |
| VTA-156 | Accepted | 200 | 209 | 253 | 313 | 6 | 3 | Accepted | Accepted | |
| VTA-157 | Accepted | 209 | 248 | 290 | 342 | 18 | 2 | Accepted | Accepted | Comparative Example |
| VTA-158 | Accepted | 207 | 221 | 265 | 295 | 6 | 2 | Accepted | Accepted | Comparative Example |
| VTA-159 | Accepted | 202 | 215 | 257 | 282 | 9 | 2 | Accepted | Accepted | Comparative Example |
| VTA-160 | Accepted | 203 | 216 | 260 | 285 | 7 | 2 | Accepted | Accepted | Comparative Example |

The lead-free low-melting glass compositions VTA-1 VTA-117 were $V_2O_5$—$TeO_2$—$Ag_2O$ ternary compositions. Among them, VTA-107 to VTA-117 further contained, as an additional component, at least one of $Al_2O_3$ and $Ga_2O_3$ in a content of 0.1 to 5.0 mole percent, where $Al_2O_3$ and $Ga_2O_3$ are oxides of elements in Group 13 of the periodic table. VTA-107 to VTA-117 were compared with VTA-106 containing none of oxides of elements in Group 13 of the periodic table. The comparison demonstrated that VTA-107 to VTA-116 containing at least one of $Al_2O_3$ and $Ga_2O_3$ in a content of 0.1 to 3.0 mole percent had a higher crystallization onset temperature $T_{cry}$ and a smaller amount of heat liberated by crystallization and could have a lower crystallization tendency. In contrast, VTA-117 containing 5 mole percent of $Al_2O_3$ could have an amount of heat liberated by crystallization as small as about one third that of VTA-106, but had a tendency to have a lower crystallization onset temperature $T_{cry}$ as compared with VTA-106. VTA-107 to VTA-117 had a softening point $T_s$ at a target level, i.e., equal to or lower than 280° C., although they had a tendency to have a higher softening point $T_s$ with an increasing content of at least one of $Al_2O_3$ and $Ga_2O_3$ as compared with VTA-106. VTA-107 to VTA-117 offered no deterioration in chemical stability as compared with VTA-106. The softening point $T_s$, crystallization onset temperature $T_{cry}$, amount of heat liberated by crystallization, and chemical stability of VTA-107 to VTA-117 were synthetically evaluated. This demonstrated that at least one of $Al_2O_3$ and $Ga_2O_3$ is effective when contained in a total content of 0.1 to 3.0 mole percent.

The lead-free low-melting glass compositions VTA-1.18 to VTA-160 contained a secondary component including at least one selected from BaO, $WO_3$, and $P_2O_5$, in addition to the principal components $V_2O_5$, $TeO_2$, and $Ag_2O$. Among them, VTA-123 to VTA-160 further contained an additional component including at least one of oxides of elements in Group 13 of the periodic table selected from $Al_2O_3$, $Ga_2O_3$, and $In_2O_3$ in a total content of 0.1 to 5.0 mole percent. The lead-free low-melting glass compositions VTA-118 to VTA-122 are comparative examples containing none of oxides of elements in Group 13 of the periodic table. These comparative examples had a smaller amount of heat liberated by crystallization and offered a lower crystallization tendency as compared with the comparative example VTA-106, as the comparative examples containing at least one of BaO, $WO_3$ and $P_2O_5$ as a secondary component. Based on the formulations of the lead-free low-melting glass compositions VTA-118 to VTA-122, at least one of $Al_2O_3$, $Ga_2O_3$, and $In_2O_3$ was added to the formulations. As a result, the lead-free low-melting glass compositions had a higher crystallization onset temperature $T_{cry}$ and a smaller amount of heat liberated by crystallization when the lead-free low-ting glass compositions contain at least one of the components in a total content of 0.1 to 3.0 mole percent as in VTA-123 to VTA-156. And the lead-free low-melting glass compositions could have a lower crystallization tendency.

Of VTA-123 to VTA-156, VTA-123 to VTA-152 had a particularly effectively lowered crystallization tendency. These samples had a total content of $Al_2O_3$, $Ga_2O_3$, and $In_2O_3$ of 0.1 to 2.0 mole percent. In addition, VTA-125 to VTA-127, VTA-129 to VTA-135, VTA-137 to VTA-143, and VTA-145 to VTA-148 could have such a remarkably lower crystallization tendency as to offer no exothermic crystallization peak. This is because these samples contained at least one of BaO, $WO_3$ and $P_2O_5$ as a secondary component, in addition to the additional component including at least one of $Al_2O_3$, $Ga_2O_3$ and $In_2O_3$.

The other samples VTA-123, VTA-124, VTA-128, VTA-136, and VTA-144 offered an exothermic crystallization peak, but had a significantly lower crystallization tendency as compared with VTA-118 to VTA-122 containing none of oxides of elements in Group 13 of the periodic table. The data demonstrated that at least one of $Al_2O_3$, $Ga_2O_3$ and $In_2O_3$, when contained in a total content of 0.1 to 1.0 mole percent, most effectively contributed to a lower crystallization tendency. VTA-157 to VTA-160 containing at least one of $Al_2O_3$, $Ga_2O_3$, and $In_2O_3$ in a total content of 5 mole percent could have a significantly smaller amount of heat liberated by crystallization, but had a tendency to have an equal or somewhat lower crystallization onset temperature $T_{cry}$ as compared with VTA-118 to VTA-122. VTA-123 to VTA-160 offered no deterioration in chemical stability as compared with VTA-118 to VTA-122.

VTA-123 to VTA-160 had a tendency to have an increasing softening point $T_s$ with an increasing total content of at least one of $Al_2O_3$, $Ga_2O_3$ and $In_2O_3$. VTA-118 to VTA-156 having a total content of at least one of $Al_2O_3$, $Ga_2O_3$ and $In_2O_3$ of 0.1 to 3.0 mole percent could have a softening point $T_s$ at a target level, i.e., 280° C. or lower. However, VTA-157 having a total content of at least one of $Al_2O_3$, $Ga_2O_3$ and $In_2O_3$ of 5.0 mole percent failed to reach the target. The softening point $T_s$, crystallization onset temperature $T_{cry}$, amount of heat liberated by crystallization, and chemical stability were synthetically evaluated. This demonstrated that at least one of $Al_2O_3$, $Ga_2O_3$ and $In_2O_3$ is most effective when contained in a total content of 0.1 to 1.0 mole percent as in VTA-123 to VTA-148.

These data and considerations demonstrated as follows. Assume that lead-free low-melting glass compositions contain a vanadium oxide ($V_2O_5$), a tellurium oxide ($TeO_2$), and a silver oxide ($Ag_2O$) as principal components. These lead-free low-melting glass compositions, when further containing at least one of oxides of elements in Group 13 of the periodic table in a total content of 0.1 to 3.0 mole percent, can effectively have a lower crystallization tendency. The content of at least one of oxides of elements in Group 13 of the periodic table is more preferably 0.1 to 2.0 mole percent, and is most effectively and preferably 0.1 to 1.0 mole percent when the softening point $T_s$, crystallization onset temperature $T_{cry}$, amount of heat liberated by crystallization, and chemical stability of the samples are synthetically evaluated. In addition, the glass compositions, when further containing at least one selected from BaO, $WO_3$, and $P_2O_5$ as a secondary component, can more effectively have a still lower crystallization tendency.

Lead-free low-melting glass compositions, when further containing at least one of oxides of elements in Group 13 of the periodic table, can have a lower crystallization tendency regardless of their glass formulations, as long as containing a vanadium oxide ($V_2O_5$), a tellurium oxide ($TeO_2$), and a silver oxide ($Ag_2O$) as principal components. However, there can be preferred content ranges (formulation ranges) on the principal components of $V_2O_5$, $TeO_2$, and $Ag_2O$ and on the secondary components of BaO, $WO_3$, and $P_2O_5$, in order to expand the glass compositions into the sealing and/or bonding of glass-sealed components and electrical/electronic components and into the formation of electrodes/interconnections and conductive junctions. For the principal components, Tables 2 and 3 demonstrated that the total content of $V_2O_5$, $TeO_2$, and $Ag_2O$ are effectively 85 mole percent or more, and the contents of $TeO_2$ and $Ag_2O$ are each effectively 1 to 2 times as much as the content of $V_2O_5$. For the secondary component, Tables 2 and 3 also demonstrated that the glass compositions effectively contain at least one selected from BaO, $WO_3$, and $P_2O_5$ in a content of 13 mole percent or less. These can provide lead-free low-melting glass compositions having a softening point $T_s$ of 280° C. or lower and having a crystallization onset temperature $T_{cry}$ higher than the softening point $T_s$ by 60° C. or more.

Experimental Example 3

In this experimental example, low-temperature sealing glass frits each containing a lead-free low-melting glass composition according to an embodiment of the present invention and low-thermal-expansion ceramic particles were prepared. Using the frits, a pair of metal substrates, a pair of glass substrates, or a pair of ceramic substrates, each of the same kind, was bonded, and how the pair of substrates was bonded was evaluated with shear stress. The lead-free low-melting glass compositions used herein were two different glass compositions VTA-126 and VTA-131 (see Tables 2 and 3) in the form of particles. The low-thermal-expansion ceramic particles used herein were seven different particles of CF-01 to CF-07 (see Table 4).

Table 4 also shows the density and coefficient of thermal expansion of the low-thermal-expansion ceramic particles. The lead-free low-melting glass compositions in Tables 2 and 3 had a density of 5.0 to 6.0 g/cm³ and a coefficient of thermal expansion of $160 \times 10^{-7}$ to $195 \times 10^{-7}$ per degree centigrade at temperatures in the range of room temperature to 150° C. The metal substrates used herein were aluminum (Al), silver (Ag), copper (Cu), nickel (Ni), and iron (Fe) substrates. The glass substrate was a soda-lime glass substrate, and the ceramic substrate was an aluminum oxide ($Al_2O_3$) substrate. Each evaluation sample was prepared in the following manner. Initially, a low-temperature sealing glass paste containing a lead-free low-melting glass composition in the form of particles, low-thermal-expansion ceramic particles, and a solvent was prepared. The paste was applied to each substrate, dried, and preliminarily fired. The pair of the substrates was then laminated, heated, and thereby bonded.

TABLE 4

Density and coefficient of thermal expansion of tested low-thermal-expansion ceramic particles

| No. | Low-thermal-expansion ceramic particles | Density (g/cm³) | Coefficient of thermal expansion (×10⁻⁷/° C.) |
|---|---|---|---|
| CF-01 | Zirconium phosphate tungstate $Zr_2(WO_4)(PO_4)_2$ | 3.8 | −32 |
| CF-02 | Zirconium phosphate tungstate containing trace amount of iron tungstate $Zr_2(WO_4)(PO_4)_2$ containing trace amount of $FeWO_4$ | 3.8 | −30 |
| CF-03 | Quartz glass $SiO_2$ | 2.2 | 5 |
| CF-04 | Zirconium silicate $ZrSiO_4$ | 4.6 | 45 |
| CF-05 | Aluminum oxide $Al_2O_3$ | 4.0 | 81 |
| CF-06 | Mullite $3Al_2O_3 \cdot 2SiO_2$ | 3.2 | 33 |

TABLE 4-continued

Density and coefficient of thermal expansion of tested low-thermal-expansion ceramic particles

| No. | Low-thermal-expansion ceramic particles | Density (g/cm$^3$) | Coefficient of thermal expansion (×10$^{-7}$/° C.) |
|---|---|---|---|
| CF-07 | Niobium oxide Nb$_2$O$_5$ | 4.6 | 12 |

(Preparation of Low-Temperature Sealing Glass Paste)

A lead-free low-melting glass composition in the form of particles, low-thermal-expansion ceramic particles, and a solvent were blended, mixed, and yielded a series of low-temperature sealing glass pastes. The lead-free low-melting glass composition particles were VTA-126 and VTA-131 in the form of particles having a particle diameter of about 10 μm. The low-thermal-expansion ceramic particles were particles of: zirconium phosphate tungstate (CF-01), zirconium phosphate tungstate containing a trace amount of iron tungstate (CF-02), quartz glass (CF-03), zirconium silicate (CF-04), aluminum oxide (CF-05), mullite (CF-06), and niobium oxide (CF-07), each of which had a particle diameter of about 10 to about 30 μm.

Samples to be heated and fired in an inert gas or vacuum atmosphere contained α-terpineol as the solvent and further contained isobornylcyclohexanol as a viscosity modifier. Samples to be fired in the air contained diethylene glycol n-butyl ether acetate as the solvent and further contained ethyl cellulose as a resin binder. The lead-free low-melting glass composition particles and the low-thermal-expansion ceramic particles were blended in eight different ratios (in volume percent) of 100:0, 90:10, 80:20, 70:30, 60:40, 50:50, 40:60, and 30:70 to give corresponding low-temperature sealing glass pastes. The low-temperature sealing glass pastes were prepared so as to have a solids content of about 80 mass percent. The "solids content" refers to the total content of the lead-free low-melting glass composition particles and the low-thermal-expansion ceramic particles.

(Preparation of Evaluation Sample)

Figure 2:
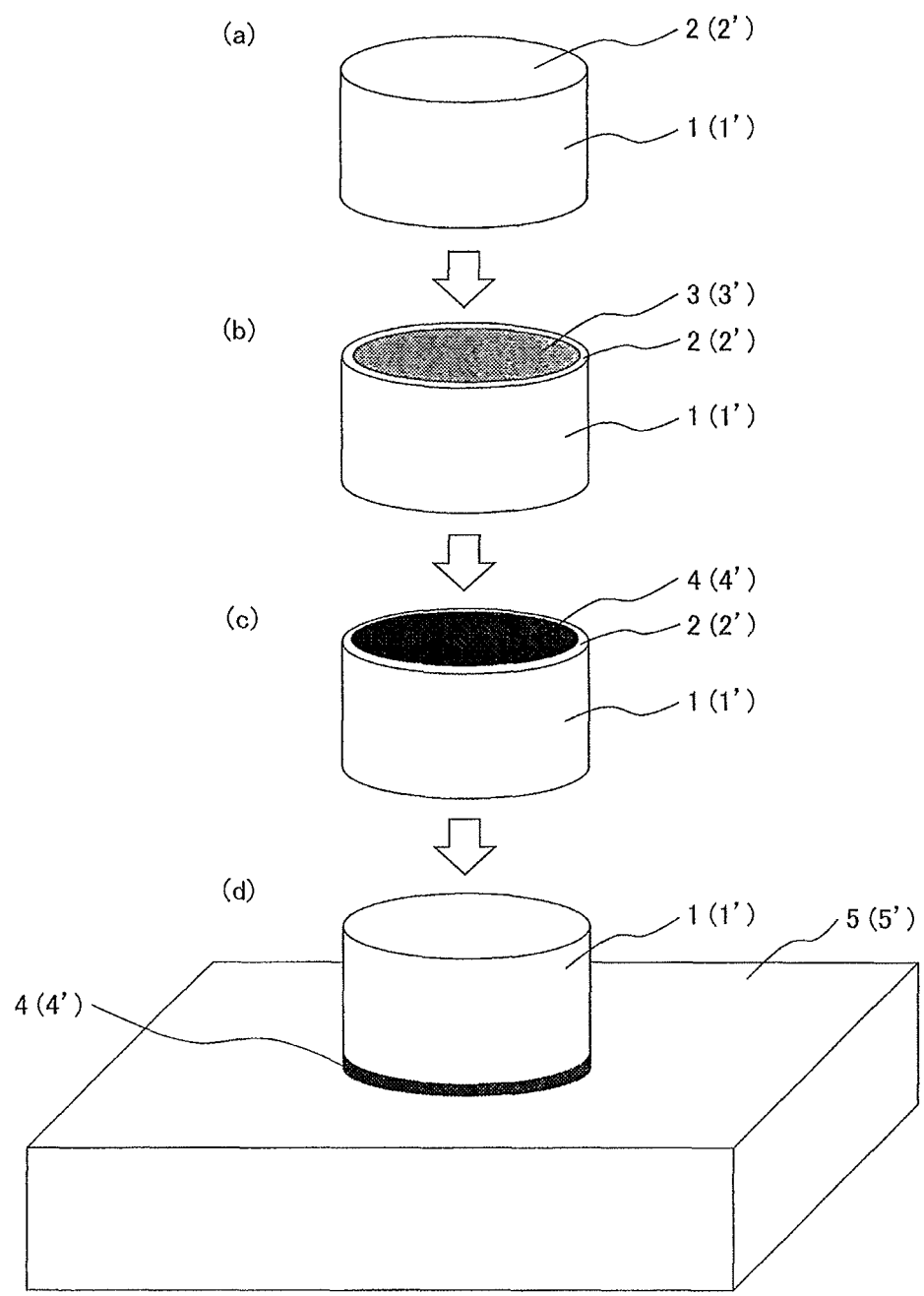
FIG. 2 is a schematic diagram illustrating how to prepare a bonded article for shear stress measurement.

FIG. 2 illustrates how to prepare each evaluation sample. Initially, a cylindrical substrate 1 including a bonding plane 2 and having a diameter of 5 mm and a thickness of 5 mm was prepared (step (a)).

Next, the bonding plane 2 of the cylindrical substrate 1 was coated with a low-temperature sealing glass paste 3 by dispensing (step (b)).

The resulting article was dried at 120° C. to 150° C. in the air. This was placed in an electric furnace, heated up to 220° C. at a rate of temperature rise of 10° C. per minute in an inert gas (nitrogen) or in the air, held for 15 minutes, heated up to a temperature higher than the softening point T$_s$ of the contained lead-free low-melting glass composition by about 50° C. at the same rate of temperature rise as above, held for 15 minutes, and thereby formed a low-temperature sealing glass frit 4 on the bonding plane 2 of the cylindrical substrate 1 (step (c)). Specifically, the glass pastes containing the lead-free low-melting glass compositions VTA-126 and VTA-131 were heated respectively up to 270° C. and 295° C.

The resulting article was placed on a plate substrate 5 having a thickness of 3 to 5 mm and including a material of the same type with the cylindrical substrate 1, fastened thereon with a heat-resistant clip, heated up to 270° C. or 295° C. in an inert gas (nitrogen) or in the air at a rate of temperature rise of 10° C. per minute, held for 15 minutes, and yielded a bonded article (step (d)).

The bonded article was subjected to shear stress measurement. Samples using a copper (Cu) or iron (Fe) substrate were heated in the inert gas (nitrogen) atmosphere, and samples using the other substrates were heated in the air. The blending ratio between the lead-free low-melting glass composition particles and the low-thermal-expansion ceramic particles in the low-temperature sealing glass paste, and the type of the low-thermal-expansion ceramic particles were selected in consideration of the coefficient of thermal expansion of the substrate to be bonded. The coefficients of thermal expansion of the substrates used are 224×10$^{-7}$ degree centigrade (aluminum (Al)), 197×10$^{-7}$ per degree centigrade (silver (Ag)), 164×10$^{-7}$ degree centigrade (copper (Cu)), 133×10$^{-7}$ per degree centigrade (nickel (Ni)), 127×10$^{-7}$ per degree centigrade (iron (Fe)), 88×10$^{-7}$ degree centigrade (soda-lime glass), and 81×10$^{-7}$ per degree centigrade (aluminum oxide (Al$_2$O$_3$)).

(Evaluation of Bonding)

Each of the bonded articles prepared using the low-temperature sealing glass pastes was examined to measure and evaluate a shear stress. In the shear stress evaluation, the sample having the shear stress of 30 MPa or more was evaluated as "excellent", the sample having the shear stress of 20 to 30 MPa was evaluated as "good", the sample having the shear stress of 10 to 20 MPa was evaluated as "moderate", and the sample having the shear stress less than 10 MPa was evaluated as "rejected".

The results of the evaluation of the shear stress in the bonded articles including the different substrates are shown in Tables 5 to 11. The evaluation results are shown in Table 5 for bonded articles between aluminum (Al) substrates; in Table 6 for bonded articles between silver (Ag) substrates; in Table 7 for bonded articles between copper (Cu) substrates; in Table 8 for bonded articles between nickel (Ni) substrates; in Table 9 for bonded articles between iron (Fe) substrates; in Table 10 for bonded articles between soda-lime glass substrates; and in Table 11 for bonded articles between aluminum oxide (Al$_2$O) substrates.

TABLE 5

Evaluated shear stress of bonded articles between aluminum substrates

| | | 100 | 90 | 80 |
|---|---|---|---|---|
| Amount (in volume percent) of lead-free low-melting glass composition | | | | |
| Amount (in volume percent) of low-thermal-expansion ceramic particles | | 0 | 10 | 20 |
| VTA-126 | CF-04 | Excellent | Excellent | Excellent |
| | CF-05 | Excellent | Excellent | Excellent |
| | CF-06 | Excellent | Excellent | Excellent |
| VTA-131 | CF-04 | Excellent | Excellent | Excellent |
| | CF-05 | Excellent | Excellent | Excellent |
| | CF-06 | Excellent | Excellent | Excellent |

TABLE 6

Evaluated shear stress of bonded articles between silver substrates

| | | | | |
|---|---|---|---|---|
| Amount (in volume percent) of lead-free low-melting glass composition | | 100 | 90 | 80 |
| Amount (in volume percent) of low-thermal-expansion ceramic particles | | 0 | 10 | 20 |
| VTA-126 | CF-04 | Excellent | Excellent | Excellent |
| | CF-05 | Excellent | Excellent | Excellent |
| | CF-06 | Excellent | Excellent | Excellent |
| VTA-131 | CF-04 | Excellent | Excellent | Excellent |
| | CF-05 | Excellent | Excellent | Excellent |
| | CF-06 | Excellent | Excellent | Excellent |

TABLE 7

Evaluated shear stress of bonded articles between copper substrates

| | | | | |
|---|---|---|---|---|
| Amount (in volume percent) of lead-free low-melting glass composition | | 80 | 70 | 60 |
| Amount (in volume percent) of low-thermal-expansion ceramic particles | | 20 | 30 | 40 |
| VTA-126 | CF-04 | Good | Excellent | Excellent |
| | CF-06 | Good | Excellent | Excellent |
| | CF-07 | Excellent | Excellent | Good |
| VTA-131 | CF-04 | Good | Good | Good |
| | CF-06 | Good | Good | Good |
| | CF-07 | Good | Good | Good |

TABLE 8

Evaluated shear stress of bonded articles between nickel substrates

| | | | | |
|---|---|---|---|---|
| Amount (in volume percent) of lead-free low-melting glass composition | | 70 | 60 | 50 |
| Amount (in volume percent) of low-thermal-expansion ceramic particles | | 30 | 40 | 50 |
| VTA-126 | CF-03 | Good | Excellent | Good |
| | CF-06 | Good | Good | Excellent |
| | CF-07 | Good | Excellent | Excellent |
| VTA-131 | CF-03 | Good | Excellent | Good |
| | CF-06 | Good | Good | Excellent |
| | CF-07 | Good | Excellent | Excellent |

TABLE 9

Evaluated shear stress of bonded articles between iron substrates

| | | | | |
|---|---|---|---|---|
| Amount (in volume percent) of lead-free low-melting glass composition | | 70 | 60 | 50 |
| Amount (in volume percent) of low-thermal-expansion ceramic particles | | 30 | 40 | 50 |
| VTA-126 | CF-01 | Excellent | Excellent | Excellent |
| | CF-02 | Excellent | Excellent | Excellent |
| | CF-03 | Good | Good | Excellent |
| VTA-131 | CF-01 | Excellent | Excellent | Excellent |
| | CF-02 | Excellent | Excellent | Excellent |
| | CF-03 | Good | Good | Excellent |

TABLE 10

Evaluated shear stress of bonded articles between soda-lime glass substrates

| | | | | | |
|---|---|---|---|---|---|
| Amount (in volume percent) of lead-free low-melting glass composition | | 60 | 50 | 40 | 30 |
| Amount (in volume percent) of low-thermal-expansion ceramic particles | | 40 | 50 | 60 | 70 |
| VTA-126 | CF-01 | Good | Excellent | Good | Rejected |
| | CF-02 | Good | Excellent | Good | Rejected |
| VTA-131 | CF-01 | Good | Excellent | Good | Rejected |
| | CF-02 | Good | Excellent | Good | Rejected |

TABLE 11

Evaluated shear stress of bonded articles between aluminum oxide substrates

| | | | | | |
|---|---|---|---|---|---|
| Amount (in volume percent) of lead-free low-melting glass composition | | 60 | 50 | 40 | 30 |
| Amount (in volume percent) of low-thermal-expansion ceramic particles | | 40 | 50 | 60 | 70 |
| VTA-126 | CF-01 | Good | Excellent | Good | Rejected |
| | CF-02 | Good | Excellent | Good | Rejected |
| VTA-131 | CF-01 | Good | Excellent | Good | Rejected |
| | CF-02 | Good | Excellent | Good | Rejected |

With reference to Table 5, the tested bonded articles between aluminum (Al) substrates employed the low-thermal-expansion ceramic particles CF-04 or CF-05 (see Table 4) in different contents (blending amounts) of 0 to 20 volume percent and employed the lead-free low-melting glass composition VTA-126 or VTA-131 in different contents of 100 to 80 volume percent. The data demonstrated that these samples offered excellent results under all the conditions, had a very high bond strength and very good adhesion to aluminum (Al), and offered similar results even when using either of VTA-126 and VTA-131. With reference to Table 6, the bonded articles between silver (Ag) substrates also offered excellent results, and the constitutive glass frits had a very high bond strength and very good adhesion to silver (Ag), as with aluminum (Al).

With reference to Table 7, the tested bonded articles between copper (Cu) substrates employed the low-thermalexpansion ceramic particles CF-04, CF-05, and CF-06 (see Table 4) in different contents (blending amounts) of 20 to 40 volume percent and employed the lead-free low-melting glass compositions VTA-126 and VTA-131 in different contents of 80 to 60 volume percent. These samples offered good or higher results under all the conditions. The glass frits employing VTA-126, when further containing an increasing content (amount) of CF-04 or CF-06, offered a higher bond strength and better adhesion to copper (Cu) This is because the glass frits came to have a coefficient of thermal expansion conformable to that of copper (Cu). In contrast, the glass frits using CF-07 offered opposite results. This is because CF-07 has a very low coefficient of thermal expansion as compared with CF-04 and CF-06. In contrast, the samples using VTA-131 did not offer a significant difference in shear stress among blending ratios, unlike the samples using VTA-126. This is probably because the samples using VTA-131 were heated and bonded at a higher temperature, and this accelerated the oxidation of copper (Cu) by VTA-131.

With reference to Table 8, the tested bonded articles between nickel (Ni) substrates employed low-thermal-expansion ceramic particles CF-03, CF-06, and CF-07 (see Table 4) in different contents (amounts) of 30 to 50 volume percent and employed the lead-free low-melting glass compositions VTA-126 and VTA-131 in different contents of 70 to 50 volume percent. The samples offered good or higher results under all the conditions and offered similar results even when using either of VTA-126 and VTA-131. The samples using CF-03, when containing CF-03 in a content (amount) of 40 volume percent, had a highest shear stress and offered a very high bond strength and very good adhesion to the nickel (Ni) substrates. The data demonstrated that the samples using CF-06 and CF-07 in increasing contents (amounts) had a higher (increasing) shear stress and offered a higher bond strength and better adhesion to the nickel (Ni) substrates. This is probably because the samples came to have a coefficient of thermal expansion conformable to that of nickel (Ni).

With reference to Table 9, the tested bonded articles between iron (Fe) substrates employed the low-thermal-expansion ceramic particles CF-01 to CF-03 (see Table 4) in different contents (amounts) of 30 to 50 volume percent and employed the lead-free low-melting glass compositions VTA-126 and VTA-131 in different contents of 70 to 50 volume percent. The samples offered good or higher results under all the conditions and offered similar results even when using either of VTA-126 and VTA-131. The data demonstrated that the samples using CF-01 and CF-02 had a high shear stress regardless of their contents (amounts) and offered a very high bond strength and very good adhesion to iron (Fe). This is probably because as follows. CF-01 and CF-02 have coefficients of thermal expansion as ones of the lowest in the ceramic particles in Table 4 and still have good wettability with and adhesion to VTA-126 and VTA-131. The resulting low-temperature sealing glass frits can easily have efficiently lowered coefficients of thermal expansion conformable to the coefficient of thermal expansion of the iron (Fe) substrates. The data also demonstrated that the samples using CF-03 did not have so significant results as compared with the samples using CF-01 and CF-02, had an increasing shear stress, and offered a higher bond strength and better adhesion to the iron (Fe) substrate with an increasing content (amount) of CF-03. This is also because the samples came to have a coefficient of thermal expansion conformable to that of iron (Fe).

With reference to Table 10, the tested bonded articles between soda-lime glass substrates employed the low-thermal-expansion ceramic particles CF-01 and CF-02 (see Table 4) in different contents (amounts) of 40 to 70 volume percent and employed the lead-free low-melting glass compositions VTA-126 and VTA-131 in different contents of 60 to 30 volume percent. There was little difference in shear stress between CF-01 and CF-02, and between VTA-126 and VTA-131. The samples offered good or higher results under all the conditions when containing CF-01 or CF-02 in the content (amount) of 40 to 60 volume percent and VTA-126 or VTA-131 in the content (amount) of 60 to 40 volume percent. The samples, when containing CF-01 or CF-02 in a content of 50 volume percent, had a largest shear stress and offered a very high bond strength and very good adhesion to the soda-lime glass substrates. The samples, when containing CF-01 or CF-02 in the content (amount) of 60 volume percent or more, had a lower shear stress and were evaluated as rejected at a content of 70 volume percent. This is because as follows. Assume that glass frits contain VTA-126 or VTA-131 in an excessively low content (amount) with respect to the content (amount) of CF-01 or CF-02. In this case, the glass frits soften and flow unsatisfactorily as low-temperature sealing glass frits, have inferior adhesion and bonding properties to the soda-lime glass substrates, and fail to have a good shear stress. With reference to Table 11, the bonded articles between aluminum oxide ($Al_2O_3$) substrates also offered shear stress evaluation results similar to those of the bonded articles between soda-lime glass substrates. This is because the aluminum oxide ($Al_2O_3$) and soda-lime glass have coefficients of thermal expansion at similar levels. These results and considerations demonstrated that it is important to design low-temperature sealing glass frits to contain the lead-free low-melting glass composition according to the embodiment of the present invention in a content (amount) of 40 volume percent or more, and low-thermal-expansion ceramic particles in the content (amount) of 60 volume percent or less. The tested bonding between the soda-lime glass substrates and between the aluminum oxide ($Al_2O_3$) substrates employed the low-temperature sealing glass paste containing diethylene glycol n-butyl ether acetate as a solvent and ethyl cellulose as a resin binder. For further testing, bonded articles were prepared by preparing a low-temperature sealing glass paste containing α-terpineol as a solvent and isobornylcyclohexanol as a viscosity modifier instead of the above components, and performing heating in the air. The prepared bonded articles were subjected to shear stress evaluation in a similar manner and were found to readily have a higher shear stress. This is because the low-temperature sealing glass frit at the junction (bonded portion) contained smaller amounts of residual air bubbles. The data indicate that α-terpineol is as the solvent effective not only in an inert gas atmosphere, but also in the air.

These data demonstrated that the low-temperature sealing glass frit according to the embodiment of the present invention effectively contains 40 to 100 volume percent of the lead-free low-melting glass composition according to the embodiment of the present invention and 0 to 60 volume percent of the low-thermal-expansion ceramic particles. The data also demonstrated that the low-thermal-expansion ceramic particles can be selected from zirconium phosphate tungstate ($Zr_2(WO_4)(PO_4)_2$), quartz glass ($SiO_2$), zirconium silicate ($ZrSiO_4$), aluminum oxide ($Al_2O_3$), mullite ($3Al_2O_3.2SiO_2$), and niobium oxide ($Nb_2O_5$) each in particle form. In particular, the low-temperature sealing glass frit more effectively contains zirconium phosphate tungstate ($Zr_2(WO_4)(PO_4)_2$) and/or a compound containing mainly zirconium phosphate tungstate ($Zr_2(WO_4)(PO_4)_2$) so as to still less undergo thermal expansion. The content of this component is preferably 30 to 50 volume percent. The low-temperature sealing glass paste according to the embodiment of the present invention may contain a solvent that can be selected from α-terpineol and diethylene glycol n-butyl ether acetate, of which α-terpineol is more effective.

Experimental Example 4

In this experimental example, conductive materials containing the lead-free low-melting glass composition according to the embodiment of the present invention and metal particles were prepared. Pairs of metal substrates of the same kind were bonded using the conductive materials, and how the metal substrates were bonded was evaluated with electric resistance (contact resistance) between the metal substrates. The lead-free low-melting glass composition used herein was VTA-130 (see Tables 2 and 3), and the metal particles were four different particles of silver (Ag), copper (Cu), aluminum (Al), and tin (Sn). The metal substrates were substrates of aluminum (Al), silver (Ag) and copper (Cu). Each evaluation sample was prepared in the following manner. Initially, a conductive glass paste containing the lead-free low-melting glass composition particles, the metal particles, and a solvent was prepared. This was applied to both of a pair of the substrates, dried, preliminarily fired. The both substrates were then laminated, heated, and thereby bonded.

(Preparation of Conductive Glass Paste)

The lead-free low-melting glass composition particles, the metal particles, and the solvent were blended and mixed to give each conductive glass paste. The lead-free low-melting glass composition particles used herein were VTA-130 in the form of particles having a particle diameter of about 10 μm. The metal particles were spherical (globular) silver (Ag) particles having an average particle diameter of about 1.5 μm, spherical copper (Cu) particles having an average particle diameter of about 20 μm, spherical aluminum (Al) particles having an average particle diameter of about 10 μm, and spherical tin (Sn) particles having an average particle diameter of about 25 μm. The solvent was α-terpineol, added with isobornylcyclohexanol as a viscosity modifier. The lead-free low-melting glass composition particles and the metal particles were blended in five different blending ratios (in volume percent) of 100:0, 80:20, 60:40, 40:60, and 20:80 to prepare corresponding conductive glass pastes. The conductive glass pastes were prepared so as to have a solids content of about 80 mass percent. The "solids content" refers to the total content of the lead-free low-melting glass composition particles and the metal particles.

(Preparation of Evaluation Sample)

The contact resistance between each pair of metal substrates was measured by preparing an evaluation sample as in Experimental Example 3 by the procedure of Experimental Example 3. Specifically, this experimental example employed the evaluation sample and its preparation method similar to those illustrated in FIG. 2.

Initially, a cylindrical metal substrate 1' including a bonding plane 2' and having a diameter of 5 mm and a thickness of 5 mm was prepared (step (a)).

Next, the bonding plane 2' of the cylindrical metal substrate 1' was coated with a low-temperature sealing glass paste 3' by dispensing (step (b)).

The resulting article was dried at 120° C. to 150° C. in the air. This was placed in an electric furnace, heated up to 220° C. at a rate of temperature rise of 10° C. per minute in an inert gas (nitrogen or argon), held for 15 minutes, heated up to a temperature higher than the softening point $T_s$ of the contained lead-free low-melting glass composition by about 40° C. at the same rate of temperature rise as above, held for 10 minutes, and thereby formed a low-temperature sealing glass frit 4' on the bonding plane 2' of the cylindrical metal substrate 1' (step (c)). This experimental example employed the lead-free low-melting glass composition VTA-130, and the heating was performed up to a temperature of 280° C. that is higher than the softening point $T_s$ by about 40° C. The resulting article was placed on a plate metal substrate 5' having a thickness of 1 to 3 mm and including a material of the same type with the cylindrical metal substrate 1', fastened thereon with a heat-resistant clip, heated up to 280° C. in an inert gas (nitrogen) at a rate of temperature rise of 10° C. per minute held for 30 minutes, and yielded a bonded article (step (d)).

The bonded article was subjected to measurement of contact resistance between metal substrates.

(Evaluation of Bonding)

Each of the prepared bonded articles was examined to measure contact resistance (electric resistance) between the metal substrates by the four probe method. As a comparison, bonding of metal substrates using a lead-free tin solder was also performed. The contact resistance of bonded articles bonded with the solder was $3.2 \times 10^{-3}$ $\Omega/mm^2$ for bonding between the aluminum (Al)) substrates (Al/Al bonding), $4.7 \times 10^{-6}$ $\Omega/mm^2$ for bonding between the silver (Ag) substrates (Ag/Ag bonding), and $5.0 \times 10^{-6}$ $\Omega/mm^2$ for bonding between the copper (Cu) substrates (Cu/Cu bonding). The Al/Al bonding had a contact resistance higher than those of the Ag/Ag bonding and the Cu/Cu bonding by about three orders of magnitude. This is because a natural oxide layer having a high electric resistance was formed on the Al substrate surfaces.

Figure 3:
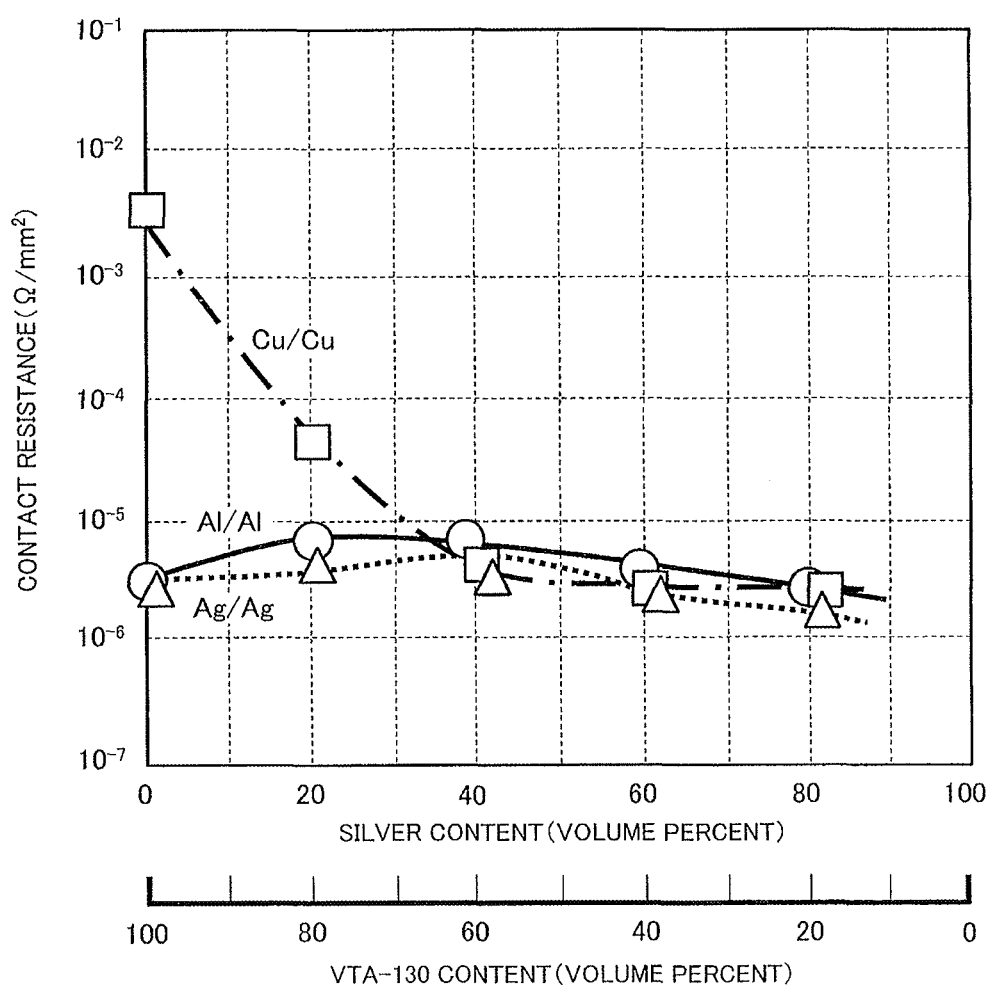
FIG. 3 is a graph illustrating how a contact resistance varies depending on the contents of a lead-free low-melting glass composition according to an embodiment of the present invention and Ag particles contained in a conductive material, where the contact resistance is determined in an Al/Al bonded article, a Ag/Ag bonded article, and a Cu/Cu bonded article each of which is assembled and bonded using the conductive material.

Typically, Al/Al bonding, Ag/Ag bonding, and Cu/Cu bonding were performed using conductive materials each containing the lead-free low-melting glass composition VTA-130 and Ag metal particles. FIG. 3 illustrates how the contact resistance varies depending on the contents of VTA-130 and Ag. In the Al/Al bonding and Ag/Ag bonding, the contact resistance reached the order of $10^{-6}$ $\Omega/mm^2$ within a wide range of the contents of VTA-130 and Ag with little dependency on the contents. In contrast, in the Cu/Cu bonding, the contact resistance decreased with an increasing Ag content and a decreasing VTA-130 content and reached the order of $10^{-6}$ $\Omega/mm^2$ at the Ag content of about 30 volume percent or more and the VTA-130 content of about 70 volume percent or less. In the Al/Al bonding, VTA-130 reacted with the Al substrates to remove a natural oxide layer on the Al substrate surfaces and to form $Al_3V$ or another alloy between Al and V at the interface. VTA-130, as reacted with Al to release V (vanadium), underwent precipitation of metal Ag therefrom. When the Al substrates were bonded at a small distance therebetween, the precipitated metal Ag established connection between the Al substrates. For this reason, even a glass paste containing not Ag particles, but VTA-130 alone offered a low contact resistance. In addition, eating data demonstrated that, when a glass paste further containing Ag particles was used, VTA-130 reacts with the Ag particles to promote the necking among the Ag particles. This is probably because Ag has certain solubility in VTA-130 and, upon bonding by heating, is dissolved in VTA-130 that softens and flows as a result of heating. Ag is precipitated with temperature fall and causes necking among the Ag particles. In the Al/Al bonding, the above-mentioned two reactions relating to the lead-free low-melting glass composition according to the embodiment of the present invention probably contributed to a contact resistance on the order of $10^{-6}$ $\Omega/mm^2$ in wide ranges of the VTA-130 content and Ag content with little dependency on the contents. The contact resistance in the Ag/Ag bonding behaved in a similar manner to the Al/Al bonding. This is because the second reaction in the Al/Al bonding, namely, the reaction between the Ag particles and VTA-130 also occurred with respect to the Ag substrates, and metal Ag was precipitated at the interface between the Ag substrate and VTA-130. When the Ag substrates were bonded with a small distance therebetween, the precipitated metal Ag established connection between the Ag substrates. For this reason, even a glass paste containing not Ag particles, but VTA-130 alone offered a low contact resistance. Even when a conductive glass paste further containing Ag particles was used, VTA-130 promoted necking among the Ag particles as in the Al/Al bonding, and this achieved a contact resistance on the order of $10^{-6}$ $\Omega/mm^2$ in wide ranges of VTA-130 content and Ag content with little dependency on the contents. In the Cu/Cu bonding, the necking of the Ag particles mainly contributes to the formation of conduction paths, unlike the Al/Al bonding and Ag/Ag bonding. Thus, the contact resistance decreased with an increasing content of Ag particles and reached the order of $10^{-6}$ $\Omega/mm^2$ at a content of Ag particles of 30 volume percent or more.

Figure 4:
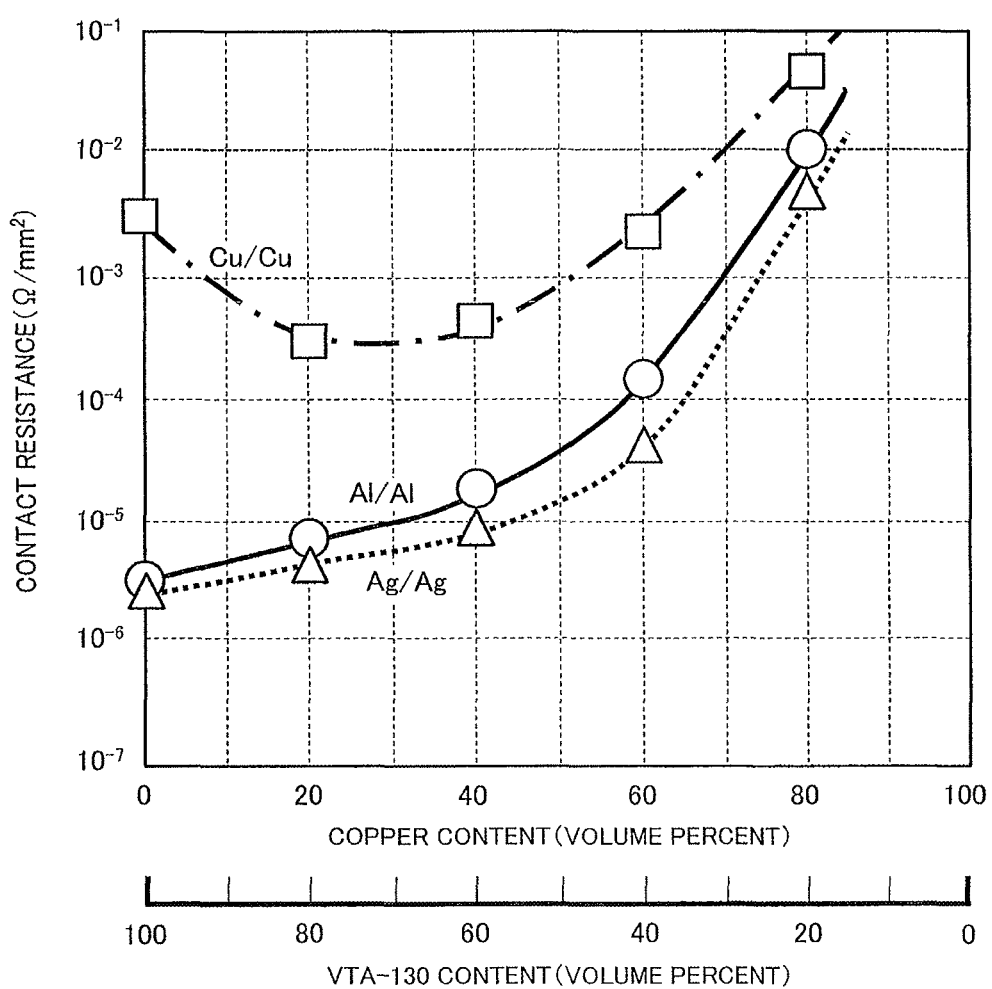
FIG. 4 is a graph illustrating how a contact resistance varies depending on the contents of the lead-free low-melting glass composition according to the embodiment of the present invention and Cu particles contained in a conductive material, where the contact resistance is determined in an Al/Al bonded article, a Ag/Ag bonded article, and a Cu/Cu bonded article each of which is assembled and bonded using the conductive material.

Separately, Al/Al bonding, Ag/Ag bonding, and Cu/Cu bonding were performed using conductive materials each containing the lead-free low-melting glass composition VTA-130 and Cu metal particles. FIG. 4 shows how the contact resistance varies depending on the contents of VTA-130 and Cu in the conductive materials. In the Al/Al bonding and Ag/Ag bonding, the contact resistance gradually increased with an increasing Cu content and a decreasing VTA-130 content and significantly decreased at a Cu content of 40 volume percent or more and a VTA-130 content of 60 volume percent or less. In contrast, the contact resistance reached the order of $10^{-6}$ $\Omega/mm^2$ at the Cu content of about 30 volume Percent or less and the VTA-130 content of about 70 volume percent or more. In the Cu/Cu bonding, the contact resistance once decreased with an increasing Cu content and a decreasing VTA-130 content, but significantly increased at a Cu content of 40 volume percent or more and a VTA-130 content of 60 volume percent or less, as in the Al/Al bonding and Ag/Ag bonding. The Cu/Cu bonding offered a higher contact resistance as compared to the Al/Al bonding and Ag/Ag bonding. This phenomenon occurred because VTA-130 softens, flows, and thereby oxidizes the Cu particles and Cu substrates to form an oxide layer on their surfaces.

Figure 5:
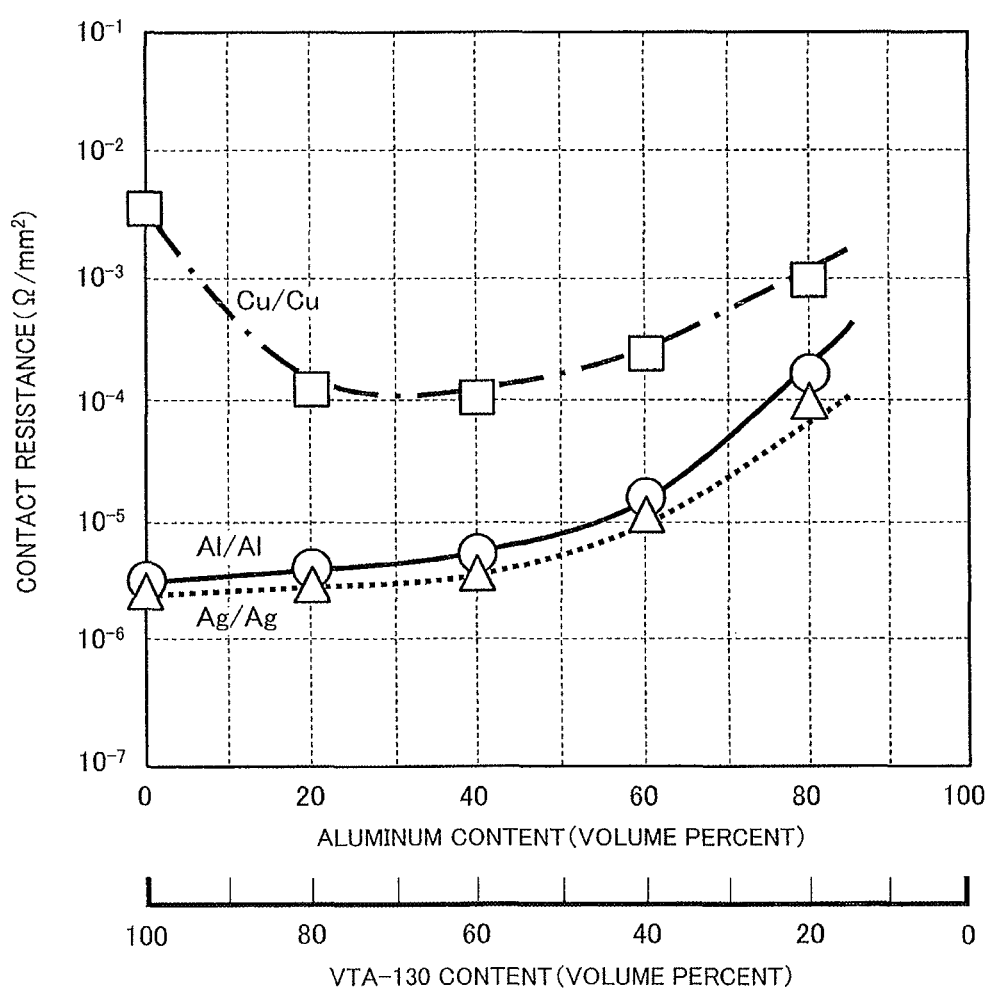
FIG. 5 is a graph illustrating how a contact resistance varies depending on the contents of the lead-free low-melting glass composition according to the embodiment of the present invention and Al particles contained in a conductive material, where the contact resistance is determined in an Al/Al bonded article, a Ag/Ag bonded article, and a Cu/Cu bonded article each of which is assembled and bonded using the conductive material.

Al/Al bonding, Ag/Ag bonding, and Cu/Cu bonding were also performed using conductive materials each containing the lead-free low-melting glass composition VTA-130 and Al metal particles. FIG. 5 illustrates how the contact resistance varies depending on the contents of VTA-130 and Al in the conductive materials. In the Al/Al bonding, Ag/Ag bonding, and Cu/Cu bonding using VTA-130 and the Al particles, the contact resistance varied and behaved in a similar manner as in the samples using Cu metal particles, but was lower as compared with the samples using the Cu metal particles. In particular in the Al/Al bonding and Ag/Ag bonding, the contact resistance reached the order of $10^{-6}$ $\Omega/mm^2$ at an Al content of about 60 volume percent or less and a VTA-130 content of about 40 volume percent or more. In the Cu/Cu bonding, the contact resistance was higher as compared with the Al/Al bonding and Ag/Ag bonding, as in the samples using the Cu particles, but lower as compared with the samples using the Cu particles. This is because the Cu particles are more susceptible to oxidation by the lead-free low-melting glass composition according to the embodiment of the present invention. The samples herein had a higher contact resistance as compared with the samples using the Ag metal particles at the Al content of 40 volume percent or more and the VTA-130 content of 60 volume percent or less. This is because the Ag particles are more susceptible to necking by the lead-free low-melting glass composition as compared with the Al particles.

Figure 6:
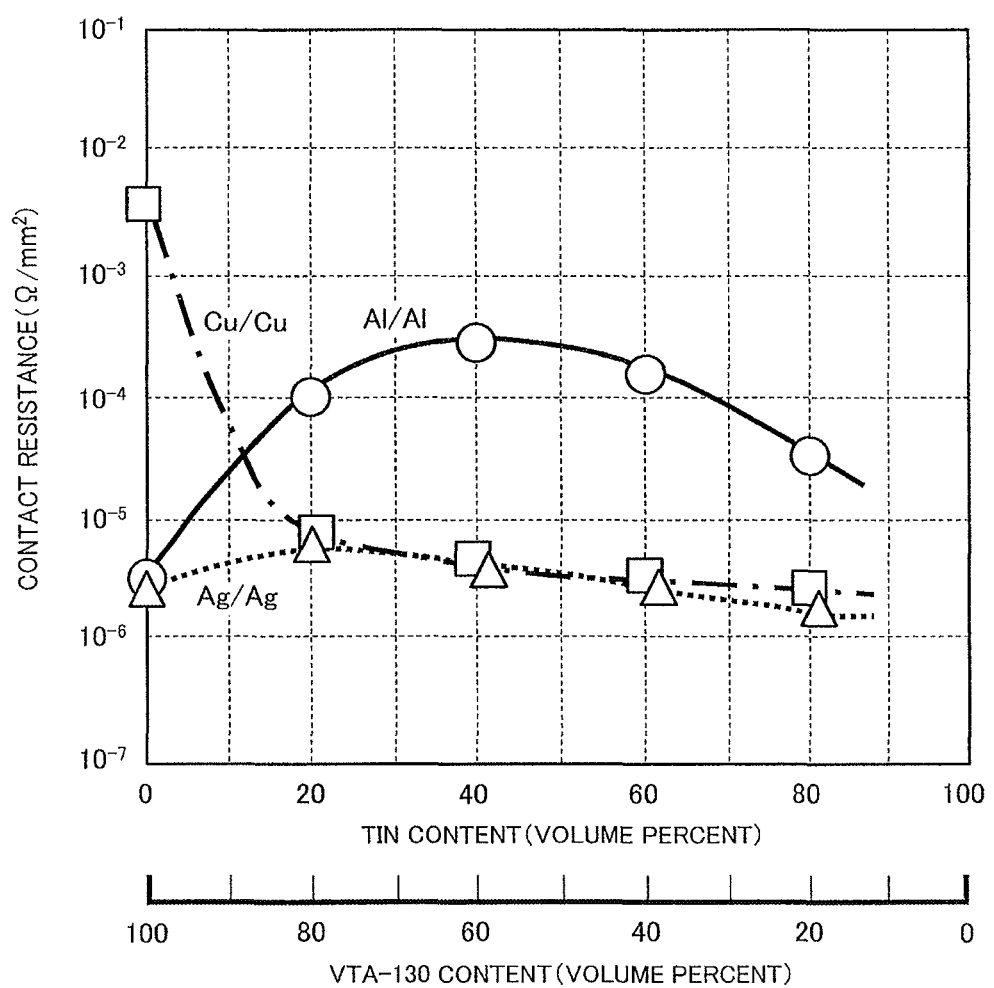
FIG. 6 is a graph illustrating how a contact resistance varies depending on the contents of the lead-free low-melting glass composition according to the embodiment of the present invention and Sn particles contained in a conductive material, where the contact resistance is determined in an Al/Al bonded article, a Ag/Ag bonded article, and a Cu/Cu bonded article each of which is assembled and bonded using the conductive material.

Al/Al bonding, Ag/Ag bonding, and Cu/Cu bonding were also performed using conductive materials each containing the lead-free low-melting glass composition VTA-130 and Sn metal particles. FIG. 6 illustrates how the contact resistance varies depending on the contents of VTA-130 and Sn in the conductive materials. The contact resistance in the Ag/Ag bonding and Cu/Cu bonding using VTA-130 and the Sn particles offered similar results to the samples using the Ag metal particles. In the Ag/Ag bonding, the contact resistance reached the order of $10^{-6}$ $\Omega/mm^2$ in wide ranges of contents of VTA-130 and Sn with little dependency on the contents. In the Cu/Cu bonding, the contact resistance reached the order of $10^{-6}$ $\Omega/mm^2$ at the Sn content of 20 volume percent or more and the VTA-130 content of 80 volume percent or less. These are because metal Sn has a melting point of 232° C., and particles thereof melt upon bonding by heating to bond to the Ag substrates or Cu substrates, as with a solder. In the Al/Al bonding, the Al substrate surface bears a natural oxide layer. Owing to this, the bonding with the solder failed to give good conductivity, but the samples containing both VTA-130 and Sn could offer a lower contact resistance by the presence of VTA-130. The contact resistance behaved as follows. The contact resistance increased with an increasing Sn content and a decreasing VTA-130 content, but decreased at the Sn content of about 60 volume percent or more and the VTA-130 content of about 40 volume percent or less.

These results and considerations demonstrate that the lead-free low-melting glass composition according to the embodiment of the present invention can be expanded into conductive materials and corresponding conductive glass pastes so as to form conductive junctions to establish connection (conduction) between metal substrates. In this experimental example, VTA-130 has been described representatively as a lead-free low-melting glass composition according to an embodiment of the present invention. Obviously, other lead-free low-melting glass compositions according to embodiments of the present invention can also develop similar performance. Likewise, Ag, Cu, Al, and Sn have been described representatively as metal particles to be contained in conductive materials or corresponding conductive glass pastes. It should be noted, however, that the present invention can provide similar performance on not only these metals, but also on alloys of them. Solder is generally applied to form a conductive junction between metal substrates. In consideration of differentiation from the solder, Ag particles and Al particles are effective as the metal particles to be contained in the conductive material or in the corresponding conductive glass paste. The solder hardly establish good conductive junction on Al substrates and other metal substrates bearing a natural oxide layer on the surface. In contrast, the conductive material and conductive glass paste according to the embodiments of the present invention can establish good conductive bonding (conductive junction) even on such metal substrates. This is archived by the action of the constitutive lead-free low-melting glass composition according to the embodiment of the present invention.

The data demonstrated that the conductive material and corresponding conductive glass paste according to embodiments of the present invention are very effective for the low-temperature formation of conductive junctions in various electronic components. When a portion to be bonded or sealed may have conductivity, the conductive material and corresponding conductive glass paste according to embodiments of the present invention are usable also as a low-temperature sealing glass frit and a corresponding low-temperature sealing glass paste as described in Experimental Example 3.

Experimental Example 5

In this experimental example, conductive materials each containing a lead-free low-melting glass composition according to the embodiment of the present invention and metal particles were prepared. Using the conductive materials, an electrode/interconnection was formed on different substrates and was examined to evaluate electric resistance (interconnect resistance) and adhesion to the substrates. The lead-free low-melting glass composition and the metal particles used herein were respectively VTA-141 (see Tables 2 and 3) and silver (Ag) particles. The substrates used were an aluminum oxide ($Al_2O_3$) substrate, a borosilicate glass substrate, a silicon (Si) substrate, a ferrite substrate, and a polyimide substrate. Each evaluation sample was prepared in the following manner. Initially, a conductive glass paste containing the lead-free low-melting glass composition particles, the metal particles, and a solvent was prepared. The conductive glass paste was applied to each substrate, dried, and preliminarily fired to form an electrode/interconnection.

(Preparation of Conductive Glass Paste)

The lead-free low-melting glass composition particles, the metal particles, and the solvent were blended, mixed, and yielded a series of conductive glass pastes. The lead-free low-melting glass composition particles used herein were VTA-141 particles having a particle diameter of about 10 µm, and the metal particles were spherical silver (Ag) particles having an average particle diameter of about 1.5 µm. The solvent was α-terpineol, added with isobornylcyclohexanol as a viscosity modifier. Table 12 shows blending ratios between the lead-free low-melting glass composition VTA-141 particles and the Ag metal particles. Seven different conductive glass pastes were prepared in the blending ratios given in Table 12. The conductive glass pastes were prepared so as to have a solids content of about 80 mass percent. The "solids content" refers to the total content of the lead-free low-melting glass composition particles and the metal particles.

(Preparation of Evaluation Sample)

Figure 7:
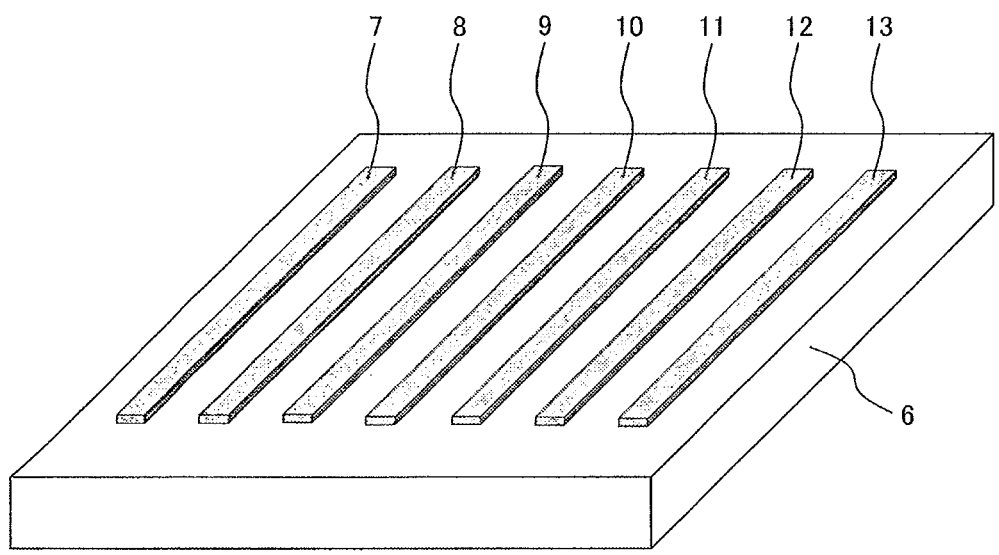
FIG. 7 is a schematic perspective view of an interconnection pattern for interconnect resistance and peel test measurements of formed electrodes/interconnections.

Using the seven conductive glass pastes EP-01 to EP-07 as in Table 12, electrodes/interconnections were formed in an interconnection pattern illustrated in FIG. 7. With reference to FIG. 7, a substrate 6 used herein was any of the aluminum oxide ($Al_2O_3$) substrate, borosilicate glass substrate, silicon (Si) substrate, ferrite substrate, and polyimide substrate. Interconnections 7 to 13 correspond respectively to EP-01 to EP-07 in Table 12. Initially, the individual conductive glass pastes were applied onto each of the substrates by a screen process printing to form patterns of a size of 2 mm by 30 mm, and dried at 120° C. to 150° C. in the air. The patterns in this process had a thickness of 30 to 40 µm. This was placed in an electric furnace, heated up to 220° C. at a rate of temperature rise of 10° C. per minute, held for 30 minutes, further heated up to a temperature higher than the softening point $T_s$ of the corresponding lead-free low-melting glass composition by about 50° C. at the same rate of temperature rise as above, held for 20 minutes, and thereby formed interconnections 7 to 13 on the substrate 6. This experimental example employed the lead-free low-melting glass composition VTA-141, and the samples were heated up to 300° C., i.e., a temperature higher than the softening point $T_s$ by about 50° C.

(Evaluation of Interconnect Resistance)

As described above, the interconnections 7 to 13 were formed on each substrate using the seven conductive glass pastes EP-01 to EP-07 having blending ratios given in Table 12. The interconnect resistance of each of the interconnections was measured by the four probe method.

TABLE 12

Content (amount) of lead-free low-melting glass composition and metal particles in electrode/interconnection

| Electrode/interconnection number | Lead-free low-melting glass composition VTA-141 (in volume percent) | Ag metal particles (in volume percent) | Remarks |
| --- | --- | --- | --- |
| EP-01 | 5 | 95 | Interconnection 7 in FIG. 7 |
| EP-02 | 10 | 90 | Interconnection 8 in FIG. 7 |
| EP-03 | 15 | 85 | Interconnection 9 in FIG. 7 |
| EP-04 | 20 | 80 | Interconnection 10 in FIG. 7 |
| EP-05 | 30 | 70 | Interconnection 11 in FIG. 7 |
| EP-06 | 40 | 60 | Interconnection 12 in FIG. 7 |
| EP-07 | 50 | 50 | Interconnection 13 in FIG. 7 |

(Evaluation of Adhesion)

The interconnections 7 to 13 were subjected to a peel test to evaluate adhesion to the substrates. A peeling tape was applied to each interconnection on the substrate and then peeled off. A sample suffering from neither peeling of the interconnection from the substrate nor break was evaluated as "accepted". In contrast, a sample suffering from peeling and/or break in the interconnection was evaluated as "rejected".

Figure 8:
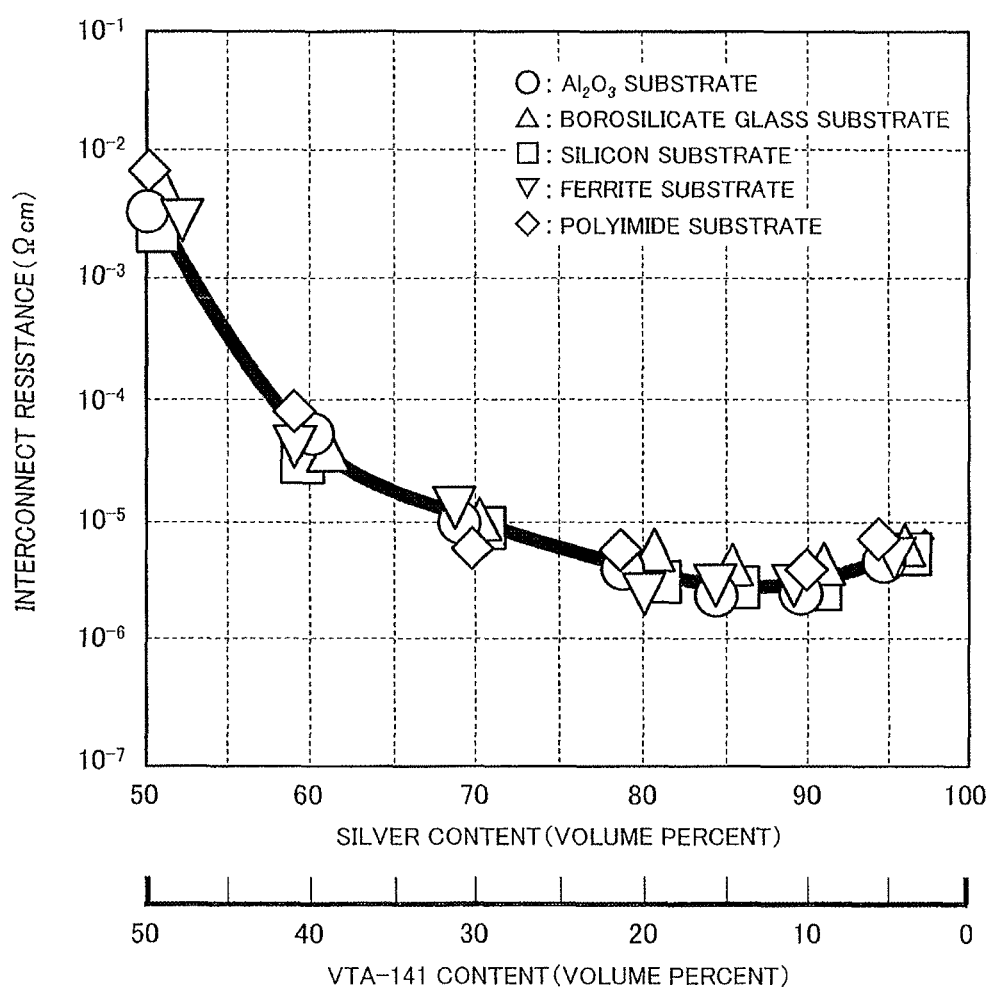
FIG. 8 is a graph illustrating how an interconnect resistance varies depending on the contents of the lead-free low-melting glass composition according to the embodiment of the present invention and Ag particles contained in a conductive material, where the interconnect resistance is determined in an electrode/interconnection formed using the conductive material.

Typically, interconnections were formed on each substrate using conductive materials each containing the lead-free low-melting glass composition VTA-141 and the Ag metal particles. FIG. 8 illustrates how the interconnect resistance of the interconnections varies depending on the contents of VTA-141 and Ag in the conductive materials. The tested substrates were five substrates, i.e., an $Al_2O_3$ substrate, a borosilicate glass substrate, a Si substrate, a ferrite substrate, and a polyimide substrate. However, little difference in interconnect resistance among the substrates was found. The interconnect resistance decreased with an increasing Ag content and a decreasing VTA-141 content and reached the order of $10^{-6}$ Ωcm at the Ag content of 70 to 95 volume percent and the VTA-141 content of 30 to 5 volume percent. The interconnect resistance reached its minimum level at the Ag content of about 85 to about 90 volume percent and the VTA-141 content of about 10 to about 15 volume percent. The lead-free low-melting glass composition according to the embodiment of the present invention can satisfactorily soften and flow, and thereby promotes the necking of Ag particles upon the interconnection formation, as is described above. Thus, the present invention enables the formation of electrodes/interconnections at such a low temperature (e.g., 300° C. in this experimental example), where the resulting electrodes/interconnections have a remarkably low interconnect resistance. The five different substrates, i.e., the $Al_2O_3$ substrate, borosilicate glass substrate, Si substrate, ferrite substrate, and polyimide substrate were investigated in this experimental example. It can be easily surmised that the present invention is applicable also to other substrates.

Table 13 shows the peel test results of the interconnections formed on the substrates. The samples were evaluated as accepted and offered a good adhesion with respect to any type of the substrates at a lead-free low-melting glass composition having the VTA-141 content of 10 volume percent or more and a Ag metal particles content of 90 volume percent or less, as is demonstrated by the data of EP-02 to EP-07 in Table 13. However, the samples suffered from an interconnection peeling, were evaluated as rejected, and were considered to have an insufficient adhesion at the VTA-141 content of 5 volume percent and the Ag content of 95 volume percent. These results demonstrated that the lead-free low-melting glass composition in the conductive material satisfactorily softens and flows upon the interconnection formation and is thereby bonded to and brought into intimate contact with the substrate; but that the glass composition, if present in an excessively low content, insufficiently comes into contact with the substrate. This demonstrated that the conductive material preferably contains the lead-free low-melting glass composition in the content of 10 volume percent or more. It should be noted, however, that even a conductive material containing the lead-free low-melting glass composition in the content of 5 volume percent can sufficiently possibly offer a good adhesion if a refinement such as pressurizing upon the interconnection formation can be made.

evaluations and considerations demonstrated that the conductive materials and corresponding conductive glass pastes according to embodiments of the present invention are very effective for the low-temperature formation of electrodes/interconnections in various electronic components.

Experimental Example 6

In this experimental example, vacuum-insulating double glass panels were prepared representatively as a glass-sealed component according to an embodiment of the present invention. Specifically, the vacuum-insulating double glass panels were prepared using a pair of soda-lime glass substrates, and a low-temperature sealing glass frit according to an embodiment of the present invention, whether and how the low-temperature sealing glass frit according to the embodiment of the present invention can be applied was evaluated. In this experimental example, a low-temperature sealing glass paste was used to form the low-temperature sealing glass frit.

Figure 9A:
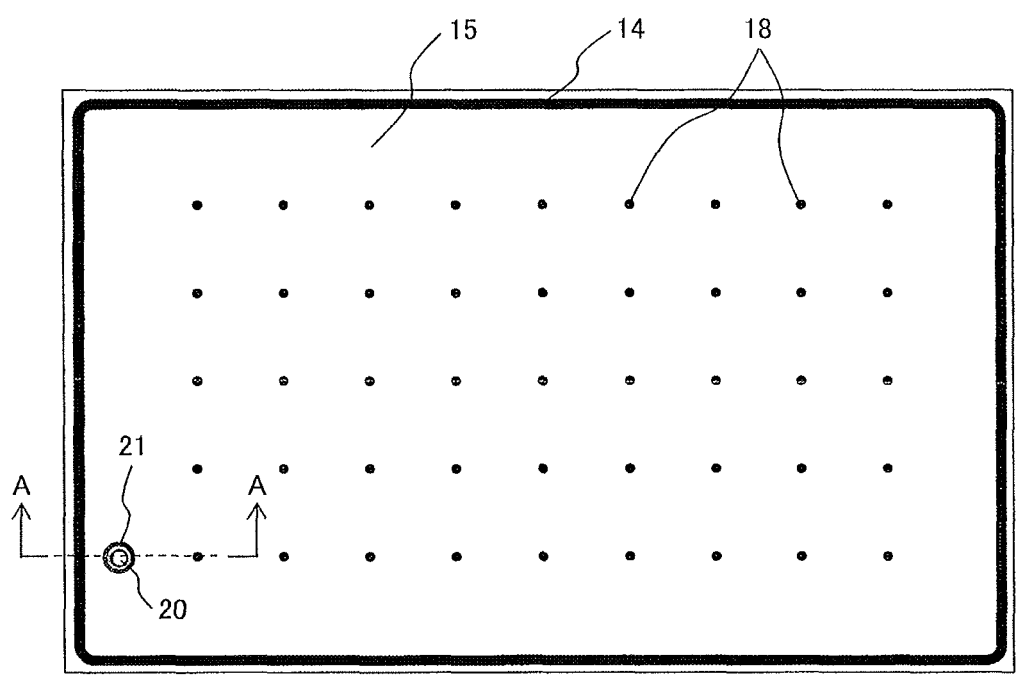
FIG. 9A is a schematic plan view of a vacuum-insulating double glass panel prepared according to an embodiment of the present invention.
Figure 9B:
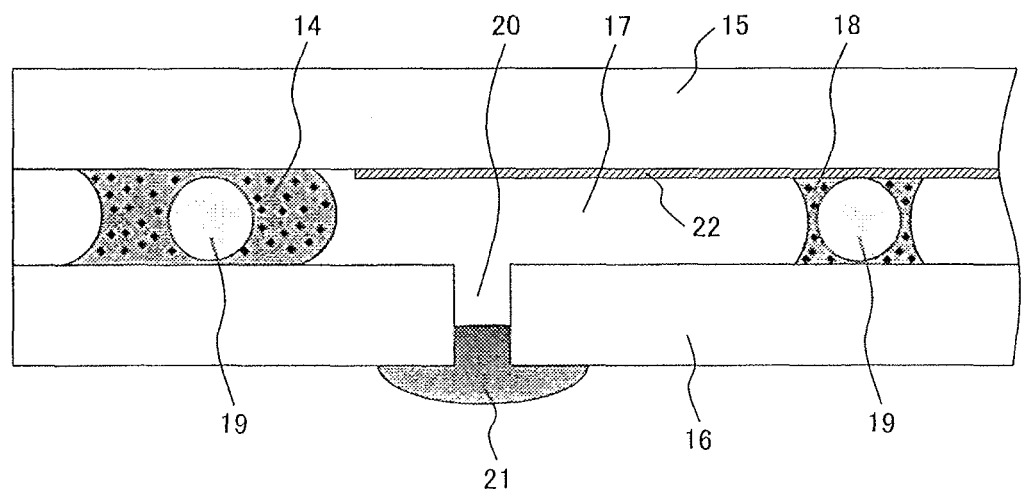
FIG. 9B is a cross-sectional view taken along the line A-A of FIG. 9A.

FIG. 9A is a schematic plan view of the prepared vacuum-insulating double glass panel. FIG. 9B is an enlarged view of a cross-section taken along the line A-A of FIG. 9A in a portion adjacent to a seal portion.

As illustrated in FIG. 9A, the vacuum-insulating double glass panel includes a soda-lime glass substrate 15 and another soda-lime glass substrate 16 (see FIG. 9B) disposed as overlying the substrate 15 with a gap (space). The panel also includes a seal portion 14 in a circumferential portion of the substrates 15 and 16. The panel includes plural spacers 18 between the two substrates 15 and 16. The spacers 18 are two-dimensionally disposed and spaced uniformly. The soda-lime glass substrate 16 includes an evacuation port 20. The gap between the two substrates 15 and 16 has been evacuated through the evacuation port 20 using a vacuum pump (not shown). The evacuation port 20 is capped with a cap 21.

TABLE 13

Electrode/interconnection peel test results

| Electrode/interconnection number | $Al_2O_3$ substrate | Borosilicate glass substrate | Silicon substrate | Ferrite substrate | Polyimide substrate |
|---|---|---|---|---|---|
| EP-01 | Rejected | Rejected | Rejected | Rejected | Rejected |
| EP-02 | Accepted | Accepted | Accepted | Accepted | Accepted |
| EP-03 | Accepted | Accepted | Accepted | Accepted | Accepted |
| EP-04 | Accepted | Accepted | Accepted | Accepted | Accepted |
| EP-05 | Accepted | Accepted | Accepted | Accepted | Accepted |
| EP-06 | Accepted | Accepted | Accepted | Accepted | Accepted |
| EP-07 | Accepted | Accepted | Accepted | Accepted | Accepted |

As is demonstrated above, the lead-free low-melting glass compositions according to the embodiment of the present invention can be expanded effectively into conductive materials and corresponding conductive glass pastes to form electrodes/interconnections at a low temperature. In this experimental example, VTA-141 was used and described as a representative lead-free low-melting glass composition. Obviously, however, other lead-free low-melting glass compositions according to embodiments of the present invention can develop performance at similar levels. Likewise, the Ag particles were used in this experimental example as metal particles to be contained in conductive materials and corresponding conductive glass pastes. Also obviously, the present invention is not limited thereto and can be applied also to Ag alloys, Cu, Al, and Sn, and alloys of them. The above As illustrated in FIG. 9B, the panel includes a space (the gap) 17 between the pair of soda-lime glass substrate 15 and 16 including the seal portion 14 in the peripheral portion (edge portion). The space 17 is maintained under vacuum. The seal portion 14 has been sealed using the low-temperature sealing glass frit according to the embodiment of the present invention. The vacuum-insulating double glass panel can be expanded typically into architectural window panes and doors of commercial-use refrigerators and freezers. The low-temperature sealing glass frit according to the embodiment of the present invention used form the seal portion 14 contains, in addition to the lead-free low-melting glass composition according to the embodiment of the present invention, low-thermal-expansion ceramic particles so as to have a coefficient of thermal expansion conformable to the coefficient of thermal expansion of the soda-lime glass substrates 15 and 16. The soda-lime glass substrates 15 and 16 have heat resistance up to a temperature of about 500° C., and the seal portion 14 may be formed at a temperature equal to or lower than that temperature. The soda-lime glass substrates 15 and 16 are susceptible to failure upon rapid heating or rapid cooling. To prevent this, heating and cooling in the sealing have to be performed gradually. The sealing is preferably performed at a temperature as low as possible so as to produce the vacuum-insulating double glass panel with better productivity. In addition, the soda-lime glass substrates 15 and 16 are susceptible to failure upon deformation. To prevent this, the plural spacers 18 are disposed in the space 17 maintained under vacuum. For allowing the space 17 to have an adequate thickness, it is effective, for example, to introduce spherical beads 19 having approximately identical particle diameters into the spacers 18 and the seal portion 14. The spacers 18 can be fixed using the low-temperature sealing glass frit according to the embodiment of the present invention, as with the seal portion 14. For obtaining the space 17 maintained under vacuum, the evacuation port 20 is previously formed in the soda-lime glass substrate 16, and the space 17 is evacuated through the evacuation port 20 using a vacuum pump. After the evacuation, the evacuation port 20 is capped with the cap 21 so as to maintain the space 17 under vacuum. The panel, when applied as an architectural window pane, may further include a heat-reflecting film 22 on the inner surface of the soda-lime glass substrate 15, where the heat-reflecting film 22 has been previously formed typically by vapor deposition.

The soda-lime glass substrates 15 and 16 used in this experimental example each had a size of 900 by 600 by 3 mm. The soda-lime glass substrate 15 bore the heat-reflecting film 22, and the soda-lime glass substrate 16 included the evacuation port 20. The panel included the spherical beads 19 having a diameter of a little under 200 μm in the seal portion 14 and the spacers 18 so as to allow the distance between the soda-lime glass substrates 15 and 16, namely, the thickness of the space 17, to be about 200 μm. The spherical beads 19 included soda-lime glass. The low-temperature sealing glass frit used in the seal portion 14 included the lead-free low-melting glass composition VTA-146 (see Tables 2 and 3) and the low-thermal-expansion ceramic particles CF-01 (see Table 4) in a blending ratio in volume percent of 50:50. The spherical beads 19 were contained in the seal portion 14 in a content of 1 volume percent with respect to the volume of the low-temperature sealing glass frit; and were contained in the spacers 18 in a content of 20 volume percent with respect to the volume of the low-temperature sealing glass frit.

(Preparation of Low-Temperature Sealing Glass Paste)

The lead-free low-melting glass composition according to the embodiment of the present invention in the form of particles, the low-thermal-expansion ceramic particles, and a solvent were blended, mixed, and yielded low-temperature sealing glass pastes. The lead-free low-melting glass composition particles used herein were VTA-146 particles having a particle diameter of about 10 μm; and the low-thermal-expansion ceramic particles were CF-01 (zirconium phosphate tungstate) particles having a particle diameter of about 30 μm. The solvent was α-terpineol, added with isobornylcyclohexanol as a viscosity modifier. The lead-free low-melting glass composition particles VTA-146 and the low-thermal-expansion ceramic particles CF-01 were blended in a ratio in volume percent of 50:50, and the low-temperature sealing glass pastes were prepared so as to have a solids content of 75 to 80 mass percent, where the "solids content" refers to the total content of VTA-146 and CF-01. The low-temperature sealing glass pastes further contained soda-lime glass spherical beads having a particle diameter of about 180 to about 200 μm in a content of 1 volume percent for the low-temperature sealing use and 20 volume percent for the spacers. The contents herein are each with respect to the solids content.

(Preparation of Vacuum-Insulating Double Glass Panel)

The vacuum-insulating double glass panel was prepared in this experimental example by a method that will be described with reference to FIGS. 10A to 12.

Figure 10A:
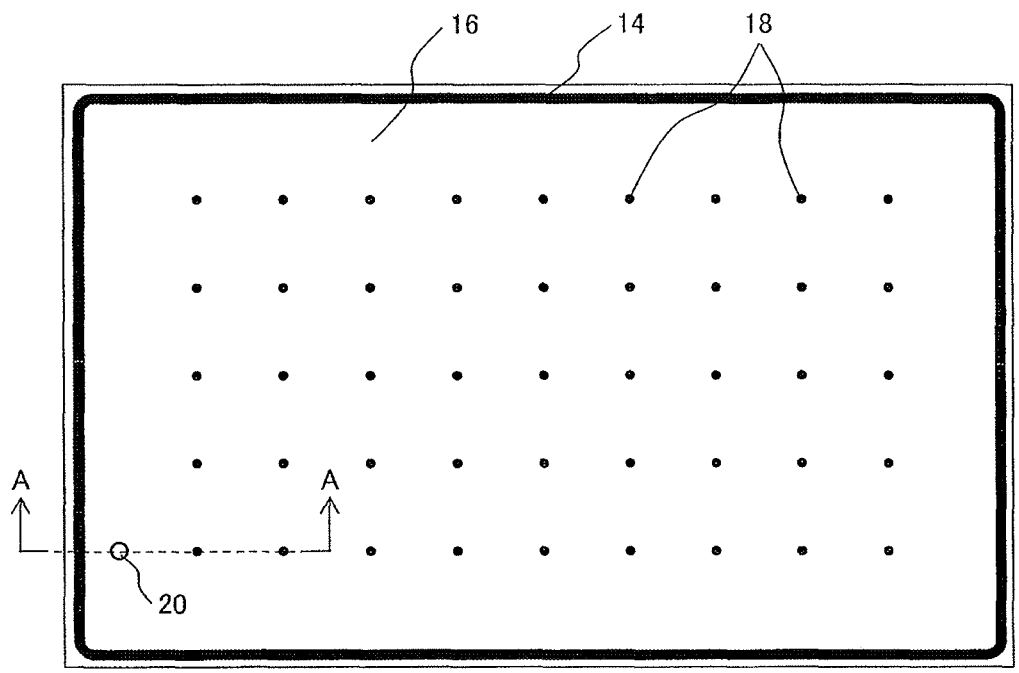
FIG. 10A is a schematic plan view illustrating a step of a method for producing the vacuum-insulating double glass panel of FIG. 9A.

FIG. 10A illustrates the soda-lime glass substrate 16 bearing the seal portion 14 and the spacers 18, where the glass substrate 16 is to constitute the vacuum-insulating double glass panel illustrated in FIGS. 9A and 9B.

As illustrated in FIG. 10A, the prepared low-temperature sealing glass pastes were applied to the peripheral portion (corresponding to the seal portion 14) and the inside (corresponding to the spacers 18) of the soda-lime glass substrate 16 each by dispensing and dried at 120° C. to 150° C. in the air. The resulting article was heated up to 220° C. at a rate of temperature rise of 7° C. per minute in the air, held for 30 minute, further heated up to 300° C. at the same rate of temperature rise as above, and held for 30 minutes to allow the seal portion 14 and the spacers 18 to be bonded to the soda-lime glass substrate 16.

Figure 10B:
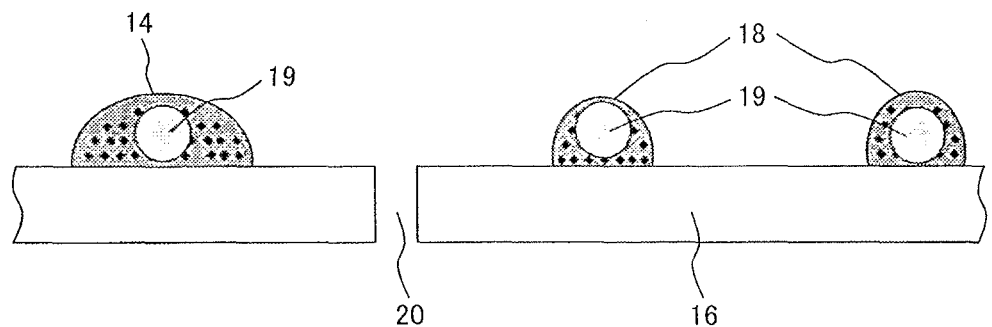
FIG. 10B is a cross-sectional view taken along the line A-A of FIG. 10A.

FIG. 10B is a cross-sectional view taken along the line A-A of FIG. 10A. As illustrated in FIG. 10B, the seal portion 14 and the spacers 18 each include the spherical bead 19.

Figure 11A:
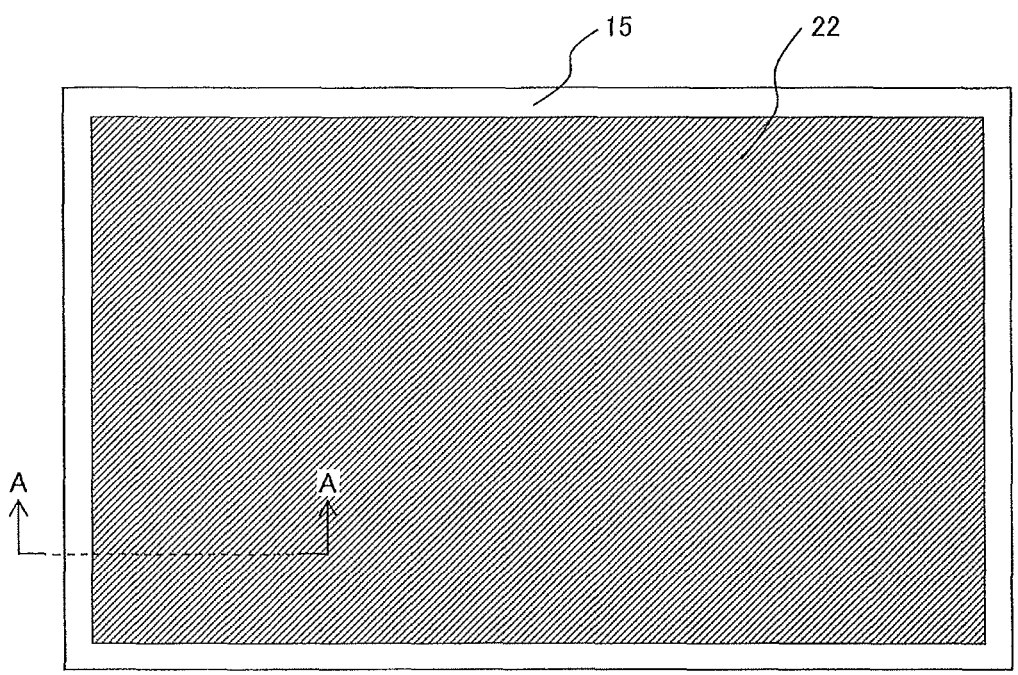
FIG. 11A is a schematic plan view illustrating another step of the method for producing the vacuum-insulating double glass panel of FIG. 9A.
Figure 11B:
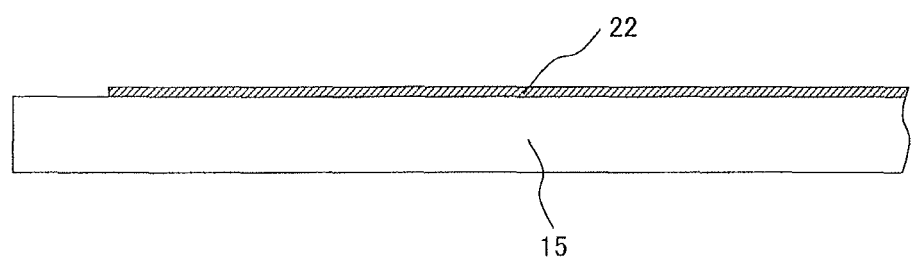
FIG. 11B is a cross-sectional view taken along the line A-A of FIG. 11A.

FIG. 11A illustrates the soda-lime glass substrate 15 to constitute the vacuum-insulating double glass panel in FIG. 9B. FIG. 11B is a cross-sectional view taken along the line A-A of FIG. 11A.

As illustrated in FIGS. 11A and 11B, the soda-lime glass substrate 15 bears the heat-reflecting film 22 on one side thereof.

Figure 12:
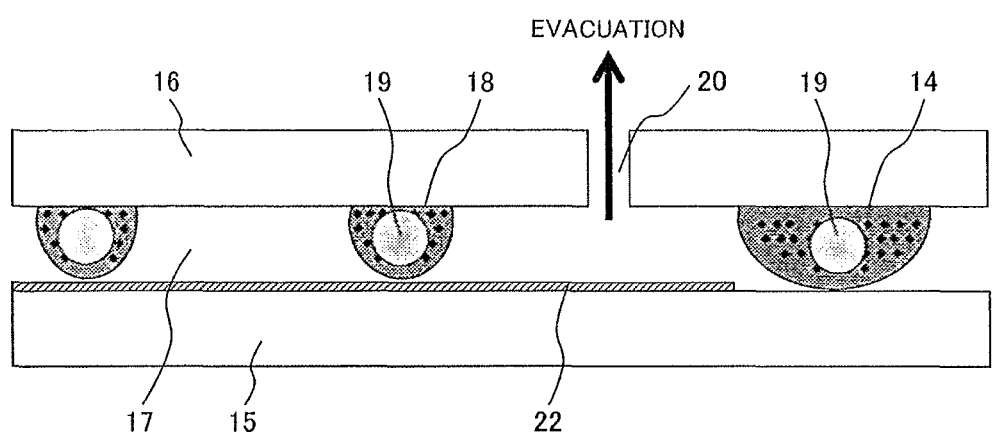
FIG. 12 is a schematic cross-sectional view illustrating yet another step of the method for producing the vacuum-insulating double glass panel of FIG. 9A.
Figure 12:
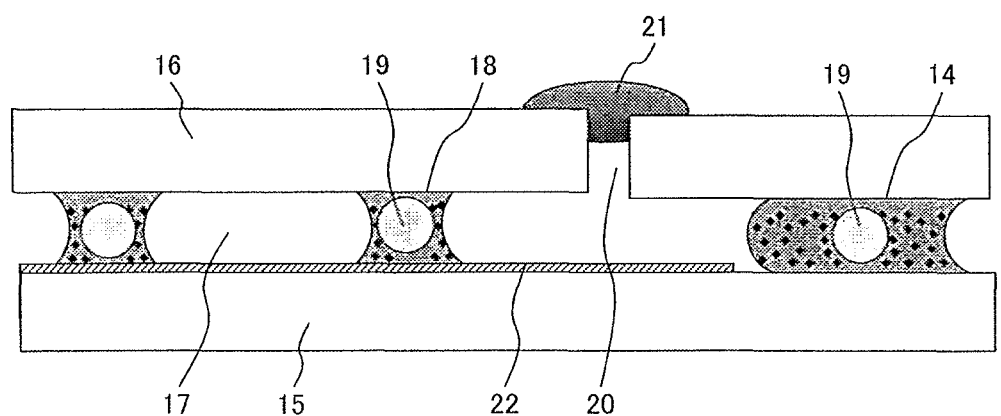

FIG. 12 illustrates a final step of the method for preparing the vacuum-insulating double glass panel illustrated in FIGS. 9A and 9B.

With reference to FIG. 12, the soda-lime glass substrates 15 and 16 were faced toward each other, aligned, and fastened with plural heat-resistant clips. This was subjected to a heat treatment with evacuation and sealed.

Figure 13:
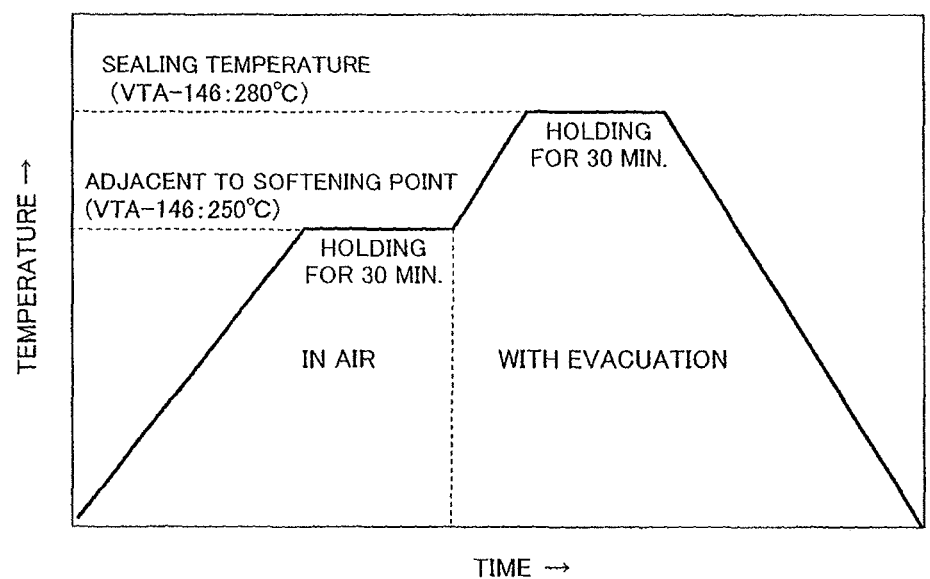
FIG. 13 is a graph illustrating a sealing temperature profile in the step of FIG. 12 of the method for producing the vacuum-insulating double glass panel.

FIG. 13 is a graph illustrating a sealing temperature profile in the heat treatment.

According to the sealing temperature profile in FIG. 13, the panel was heated up to a temperature adjacent to the softening point of the used lead-free low-melting glass composition. In this experimental example, the panel was heated up to 250° C. equal to the softening point of VTA-146 at a rate of temperature rise of 7° C. per minute in the air and held for 30 minutes. While evacuating the inside through the evacuation port 20 using a vacuum pump, the panel was heated up to 280° C. at a rate of temperature rise of 7° C. per minute, and held for 30 minutes to be sealed.

As illustrated in FIG. 12, the seal portion 14 and the spacers 18 were compressed and came into intimate contact with the two soda-lime glass substrates 15 and 16. The evacuation port 20 was then capped with the cap 21 and yielded a vacuum-insulating double glass panel. In this experimental example, ten vacuum-insulating double glass panels were prepared in the above manner.

(Evaluation Results of Prepared Vacuum-Insulating Double Glass Panels)

Initially, the ten vacuum-insulating double glass panels prepared in this experimental example were visually inspected. As a result, they were found to have no visual defects such as fracture or cracking. The spherical beads 19 in the seal portion 14 and in the spacers 18 allowed the soda-lime glass substrates 15 and 16 to be held at an approximately uniform distance (thickness of the space therebetween). Specifically, the obtained vacuum-insulating double glass panel had a predetermined space 17. The panel was further subjected to a helium leak test and was found that the panel inside was maintained under vacuum, and the panel peripheral portion was hermetically sealed.

For the determination of the reliability of the seal portion 14, three of the prepared vacuum-insulating double glass panels were immersed in warm water at 50° C. for 30 days. As a result, it was found that the inside of all the three panels could be maintained under vacuum without migration of water thereinto. Other three of the vacuum-insulating double glass panels were subjected to 1000 cycles of a thermal cycle test in the range of −50° C. to +100° C. Also in this test, all the three panels could maintain the inside under vacuum. These results demonstrated as follows. Assume that the low-temperature sealing glass frit and/or corresponding low-temperature sealing glass paste according to the embodiment of the present invention is applied to a vacuum-insulating double glass panel. In this case, the vacuum-insulating double glass panel can include a seal portion offering satisfactory thermal insulation and having high reliability. In addition, the low-temperature sealing glass frit and/or corresponding low-temperature sealing glass paste according to the embodiment of the present invention, when used, enables sealing to be performed at a remarkably low temperature and can significantly contribute to better productivity of such vacuum-insulating double glass panels.

As above, a vacuum-insulating double glass panel has been described in this experimental example representatively as a glass-sealed component according to an embodiment of the present invention. Specifically, the low-temperature sealing glass frit and/or corresponding low-temperature sealing glass paste containing the lead-free low-melting glass composition according to the embodiment of the present invention was applied to the vacuum-insulating double glass panel. The results demonstrated that the low-temperature sealing glass frit and corresponding low-temperature sealing glass paste containing the lead-free low-melting glass composition according to the embodiment of the present invention can be effectively applied to a seal portion of a glass-sealed component and provides a glass-sealed component having reliability and productivity both at satisfactory levels. Obviously, the glass frit and corresponding glass paste can be effectively expanded also into glass-sealed components other than the vacuum-insulating double glass panel.

Experimental Example 7

In this experimental example, a display was prepared representatively as a glass-sealed component according to the embodiment of the present invention. Whether and how the low-temperature sealing glass frit according to the embodiment of the present invention is applicable was determined and evaluated. The display included a multiplicity of organic light-emitting diodes (OLEDs) between a pair of borosilicate glass substrates. This experimental example employed a low-temperature sealing glass paste to form the low-temperature sealing glass frit.

Figure 14A:
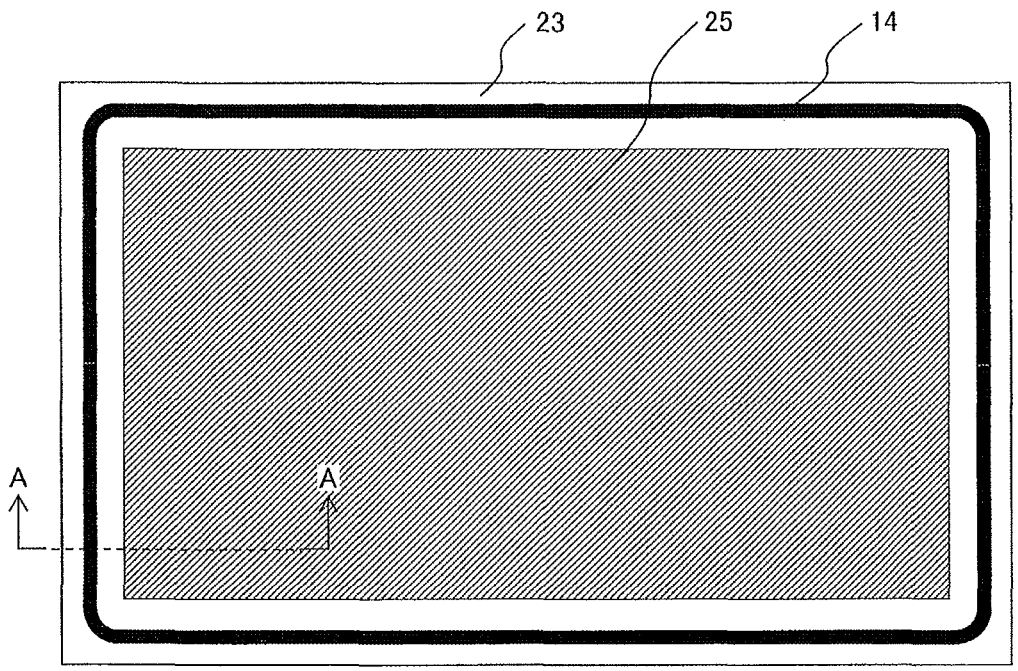
FIG. 14A is a schematic plan view of an organic light-emitting diode (OLED) display prepared according to an embodiment of the present invention.
Figure 14B:
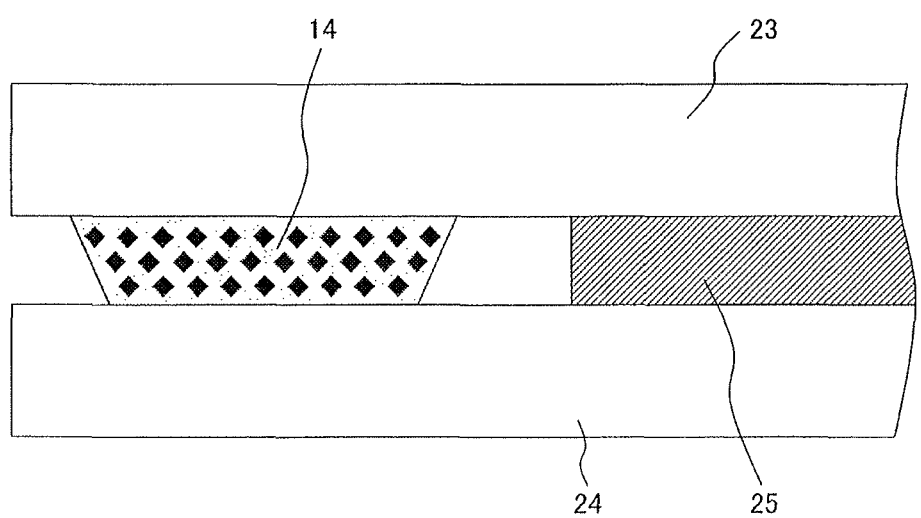
FIG. 14B is a cross-sectional view taken along the line A-A of FIG. 14A.

FIG. 14A is a schematic plan view of an OLED display according to an embodiment of the present invention. FIG. 14B is a cross-sectional view taken along the line A-A of FIG. 14A.

With reference to FIG. 14A, the OLED display includes a borosilicate glass substrate 23, another borosilicate glass substrate 24 (see FIG. 14B) disposed as overlying the borosilicate glass substrate 23 with a gap, and a seal portion 14 formed using the low-temperature sealing glass frit according to the embodiment of the present invention in a peripheral portion of the borosilicate glass substrates 23 and 24. The CLEF display includes OLEDs 25 between the borosilicate glass substrates 23 and 24.

The OLEDs 25 are susceptible to deterioration by the presence of water and/or oxygen. To prevent this, it is important for the peripheral portion, i.e., the seal portion 14 of the borosilicate glass substrates 23 and 24 to be hermetically sealed with the low-temperature sealing glass frit containing the lead-free low-melting glass composition according to the embodiment of the present invention. The low-temperature sealing glass frit according to the embodiment of the present invention used in the seal portion 14 contains, in addition to the lead-free low-melting glass composition according to the embodiment of the present invention, low-thermal-expansion ceramic particles so as to have a coefficient of thermal expansion conformable to the coefficient of thermal expansion of the borosilicate glass substrates 23 and 24 as much as possible. The low-temperature sealing glass frit to be applied to the seal portion 14 in this experimental example included the lead-free low-melting glass composition VTA-134 (see Tables 2 and 3) and the low-thermal-expansion ceramic particles CF-02 (see Table 4) in a ratio in volume percent of 45:55. The low-temperature sealing glass frit in this experimental example was formed from a low-temperature sealing glass paste further containing high viscosity α-terpineol as a solvent.

(Preparation of Low-Temperature Sealing Glass Paste)

The lead-free low-melting glass composition according to the embodiment of the present invention in the form of particles, the low-thermal-expansion ceramic particles, and the solvent were blended, mixed, and yielded the low-temperature sealing glass paste. The lead-free low-melting glass composition particles used herein were VTA-134 particles having an average particle diameter of about 1 μm, and the low-thermal-expansion ceramic particles were CF-02 particles having an average particle diameter of about 3 μm. CF-02 is a compound including mainly zirconium phosphate tungstate. The solvent was α-terpineol, added with isobornylcyclohexanol as a viscosity modifier. The low-thermal-expansion ceramic particles CF-02 contained iron tungstate ($FeWO_4$) in the zirconium phosphate tungstate particles so as to efficiently absorb a red semiconductor laser beam to thereby generate heat, as described later. The lead-free low-melting glass composition VTA-134 particles and the low-thermal-expansion ceramic particles CF-02 were blended in a ratio in volume percent of 45:55. The low-temperature sealing glass paste was prepared so as to have a solids content of about 80 mass percent, where the "solids content" refers to the total content of VTA-134 and CF-02.

(Preparation of Organic Light-Emitting Diode (OLED) Display)

The OLED display in this experimental example was prepared by a method as illustrated in FIGS. 15A to 17.

Figure 15A:
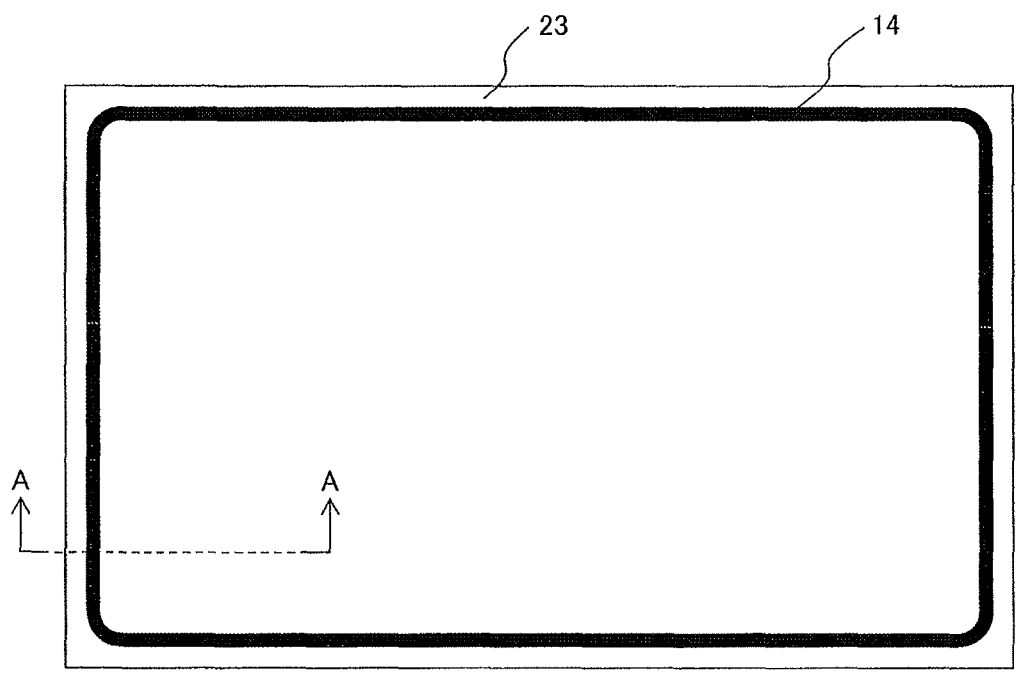
FIG. 15A is a schematic plan view illustrating a step of a method for producing the OLED display of FIGS. 19A and 14B.
Figure 15B:
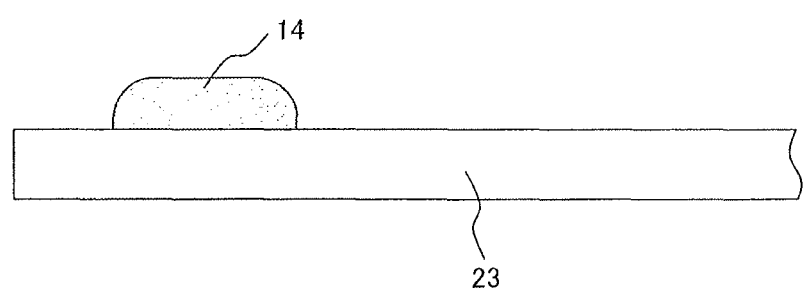
FIG. 15B is a cross-sectional view taken along the line A-A of FIG. 15A.

FIG. 15A illustrates one of a pair of substrates in the OLED display. FIG. 15B is a cross-sectional view taken along the line A-A of FIG. 15A.

As illustrated in FIG. 15A, the prepared low-temperature sealing glass paste was applied to a peripheral portion of the borosilicate glass substrate 23 by a screen process printing and dried at 120° C. to 150° C. in the air. This was heated up to 220° C. at a rate of temperature rise of 7° C. per minute in the air, held for 30 minutes, further heated up to 300° C. at the same rate of temperature rise as above, and held for 30 minutes. This gave the seal portion 14 in the peripheral portion of the borosilicate glass substrate 23. The seal portion 14 was formed in the peripheral portion of the borosilicate glass substrate 23 so as to have a line width of about 2 mm and a thickness after firing of about 15 μm.

Figure 16A:
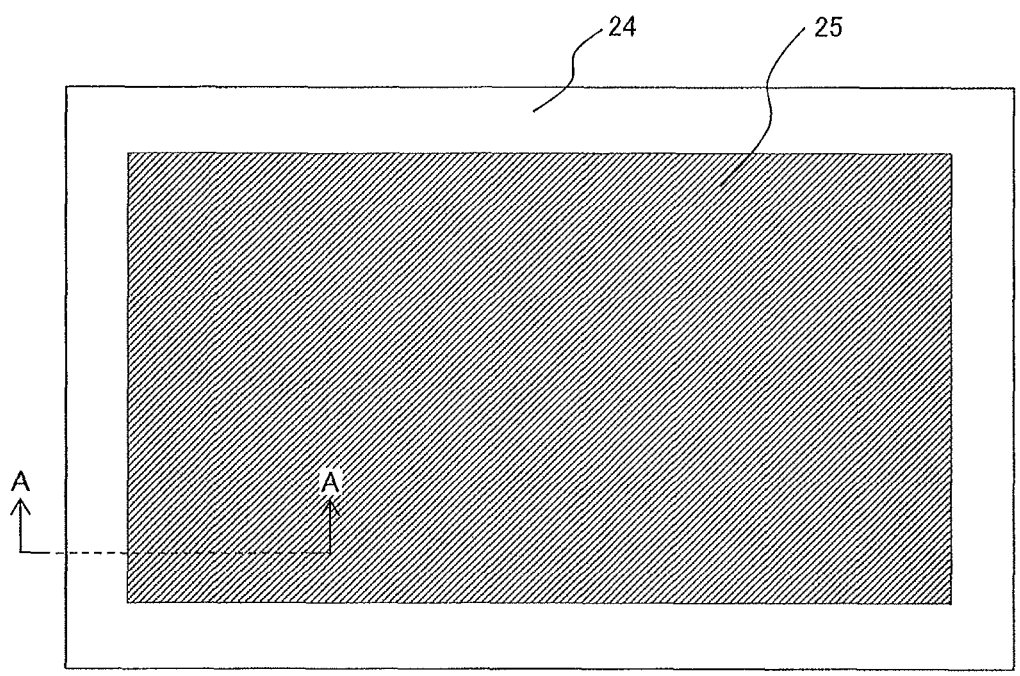
FIG. 16A is a schematic plan view illustrating another step of the method for producing the OLED display of FIGS. 14A and 14B.
Figure 16B:
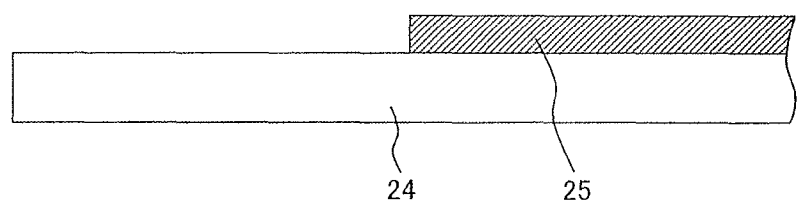
FIG. 16B is a cross-sectional view taken along the line A-A of FIG. 16A.

FIG. 16A illustrates the other of the pair of substrates to constitute the OLFD display. FIG. 16B is a cross-sectional view taken along the line A-A of FIG. 16A.

Figure 17:
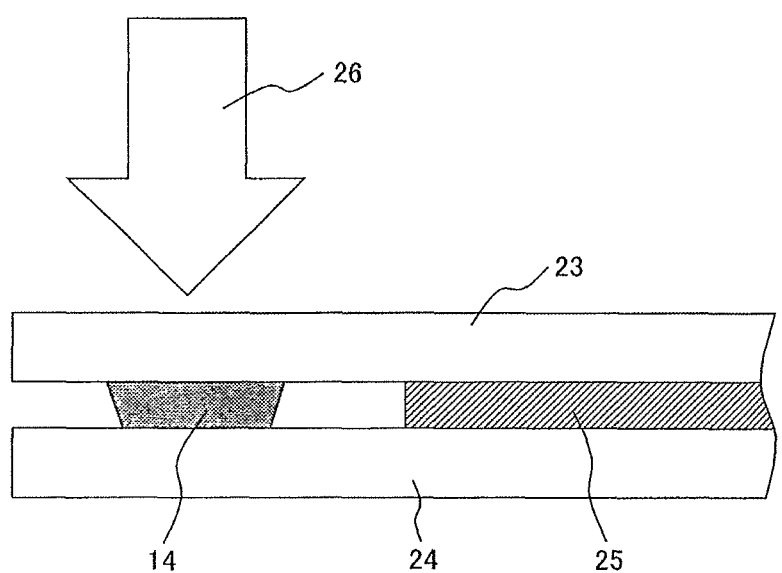
FIG. 17 is a schematic cross-sectional view illustrating yet another step of the method for producing the OLED display of FIGS. 14A and 14B.

As illustrated in these figures, a multiplicity of OLEDs 25 was formed on the borosilicate glass substrate 24. The number of the OLEDs 25 corresponds to the number of picture elements. As illustrated in FIG. 17, the borosilicate glass substrate 24 bearing the OLEDs 25 was arranged to face the borosilicate glass substrate 23 bearing the seal portion 14, and a laser beam 26 was applied in an inert gas (nitrogen) from the borosilicate glass substrate 23 side toward the seal portion 14. The laser beam 26 used herein was a red semiconductor laser beam having a wavelength of 805 nm so that the laser beam is efficiently absorbed by the lead-free low-melting glass composition and the low-thermal-expansion ceramic particles in the low-temperature sealing glass frit according to the embodiment of the present invention. The absorbed laser beam may contribute to heat generation and thereby allow the lead-free low-melting glass composition to readily soften and flow. The laser beam 26 traveled at a speed of 10 mm/second in the peripheral portion to bond the borosilicate glass substrates 23 and 24 in the peripheral portion through the seal portion 14. Thus, the OLED display was prepared.

In this experimental example, five OLED displays were prepared in the above manner. The sealing was performed using the laser beam so as to prevent or mitigate thermal damage on the OLEDs and to provide better productivity.

(Evaluation Results of Prepared Organic Light-Emitting Diode (OLED) Displays)

Initially, one of the prepared OLED displays was subjected to a lighting test and found to properly illuminate. The sample OLED display also had good adhesion and bonding properties in the seal portion. Next, the OLED display was subjected to a high-humidity/temperature test (saturated pressure cooker test) at 120° C., 100% relative humidity, and 202 kPa for one day, 3 days, and 7 days. As a comparative example, an OLED display including a portion sealed with a resin was also subjected to the test. The resin-sealed portion had a line width of about 5 mm and a thickness of about 15 μm. Both the OLED displays properly illuminated in the one-day high-humidity/temperature test, but the resin-sealed OLED display suffered from significant deterioration in illumination in 3-day and longer high-humidity/temperature tests. This is because water and/or oxygen migrated from the resin-sealed portion into the OLED display and impaired the OLEDs. In contrast, the OLED display according to the embodiment of the present invention did not suffer from deterioration in illumination of the OLEDs and had good test results even in the 7-day high-humidity/temperature test. The result indicated that the OLED display can maintain good hermeticity. In addition, the OLED display after the high-humidity/temperature test was examined to evaluate the adhesion and bonding properties of the seal portion and was found to offer not so significant deterioration as compared with the resin-sealed OLED display and to have adhesion and bonding properties similar to those before the test.

As above, the organic light-emitting diode (OLED) display has been described in this experimental example representatively as a glass-sealed component according to an embodiment of the present invention. Specifically, the low-temperature sealing glass frit and corresponding low-temperature sealing glass paste each containing the lead-free low-melting glass composition according to the embodiment of the present invention were applied to the OLED display. The results demonstrated that the low-temperature sealing glass frit and corresponding low-temperature sealing glass paste each containing the lead-free low-melting glass composition according to the embodiment of the present invention can be effectively applied to a seal portion of a glass-sealed component and provides a glass-sealed component having high functions including reliability and being obtained with excellent productivity. In addition, the results of the experimental example obviously demonstrate that the glass frit and corresponding glass paste can also be expanded into glass-sealed components that are susceptible to thermal damage. Such glass-sealed components are exemplified by lighting apparatuses bearing OLEDs; and organic solar cells.

Experimental Example 8

In this experimental example, a solar cell including silicon (Si) substrates having pn bonding was prepared representatively as an electrical/electronic component according to an embodiment of the present invention. Whether and how a conductive material according to an embodiment of the present invention is applicable to electrodes/interconnections of the solar cell was examined and evaluated. The conductive material in this experimental example was formed using a conductive glass paste.

Figure 18A:
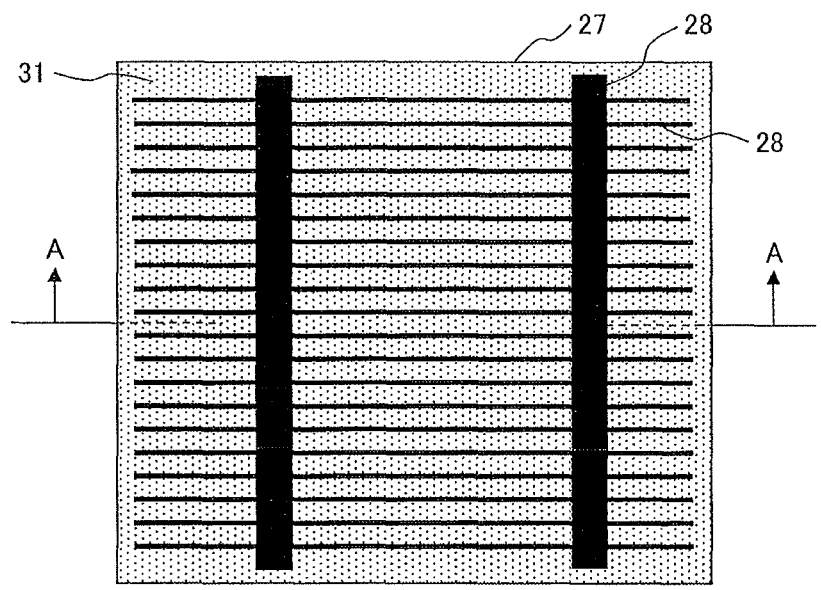
FIG. 18A is a schematic plan view of a light-receiving surface of a solar cell prepared according to an embodiment of the present invention.
Figure 18B:
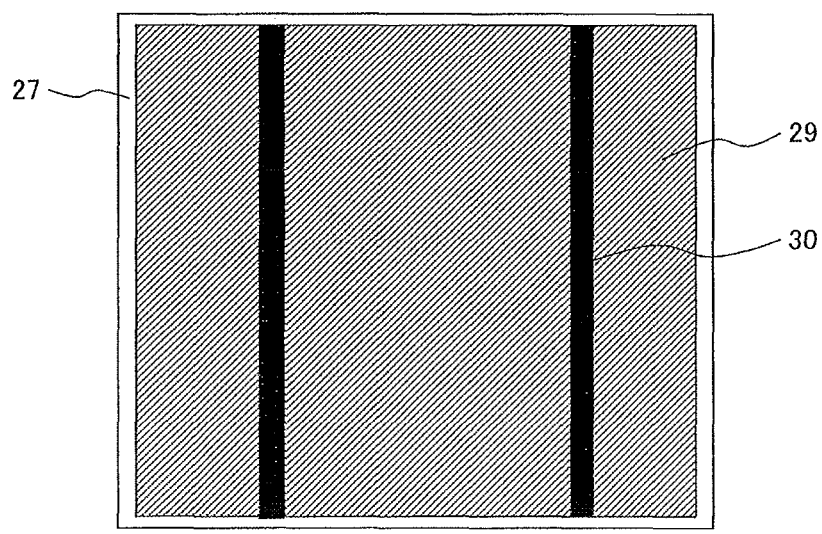
FIG. 18B is a back view of the light-receiving surface of the solar cell of FIG. 18A.
Figure 18C:
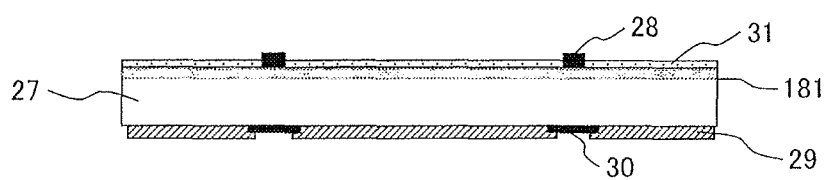
FIG. 18C is a cross-sectional view taken along the line A-A of FIG. 18A.

FIG. 18A is a schematic view of a light-receiving surface (front surface) of the prepared solar cell. FIG. 18B is a schematic view of the rear surface (backside) of the solar cell. FIG. 18C is a cross-sectional view taken along the line A-A of FIG. 18A.

As illustrated in FIG. 18A, the solar cell includes front electrodes/interconnections 28 and an antireflection film 31 on the light-receiving surface of the silicon substrate (Si substrate) 27.

As illustrated in FIG. 18B, the solar cell includes a collector electrode/interconnection 29 and output electrodes/interconnections 30 on the rear surface.

As illustrated in FIG. 18C, the solar cell includes a pn junction 181 adjacent to the light-receiving surface of the silicon substrate 27. The front electrodes/interconnections 28, collector electrode/interconnection 29, and output electrodes/interconnections 30 are formed using the conductive material according to the embodiment of the present invention.

A conventional solar cell has been prepared in the following manner. Front electrodes/interconnections 28 and output electrodes/interconnections 30 are formed using a lead-containing conductive glass paste containing silver (Ag) particles and lead-containing low-melting glass composition particles. A collector electrode/interconnection 29 is formed using a lead-containing conductive glass paste containing aluminum (Al) particles and lead-containing low-melting glass composition particles. These lead-containing conductive glass pastes are applied to the both sides of a silicon substrate 27 typically by a screen process printing, dried, fired at 500° C. to 800° C. in the air, and yield electrodes/interconnections on the both sides of the silicon substrate 27. Unfortunately, the conventional solar cell not only contains hazardous lead, but also has various disadvantages as follows. Typically, such high-temperature firing to form the electrodes/interconnections causes the solar cell to warp significantly and thereby causes the silicon substrate 27 to be susceptible to failure (breakage). The high-temperature firing also induces a reaction between Al in the collector electrode/interconnection 29 and Ag in the output electrodes/interconnections 30 to form brittle intermetallic compounds. The brittle intermetallic compounds, if receiving stress in a focused manner, may cause the silicon substrate 27 to be susceptible to defects such as cracks.

In this experimental example, the silicon substrate 27 including the pn junction was a solar-cell-use single-crystal silicon substrate having a size of 150 by 150 by 0.2 mm. In addition, a silicon nitride (SiN) antireflection film 31 was formed on the light-receiving surface of the silicon substrate 27. The antireflection film 31 had a thickness of about 100 nm. The front electrodes/interconnections 28 and the output electrodes/interconnections 30 were formed using a conductive material. The conductive material contained the lead-free low-melting glass composition VTA-102 (see Table 1) and spherical silver (Ag) particles having an average particle diameter of about 1.5 μm in a blending ratio in volume percent of 15:85. The collector electrode/interconnection 29 was formed using another conductive material. This conductive material contained the lead-free low-melting glass composition VTA-125 (see Table 1) and spherical aluminum (Al) particles having an average particle diameter of about 3 μm in a blending ratio in volume percent of 10:90.

(Preparation of Conductive Glass Paste)

The lead-free low-melting glass composition according to the embodiment of the present invention VTA-102 or VTA-125 in the form of particles, the silver (Ag) or aluminum (Al) metal particles, and a solvent were blended, mixed, and yielded conductive glass pastes. The conductive glass paste to form the front electrodes/interconnections 28 and the output electrodes/interconnections 30 employed VTA-102 particles having an average particle diameter of about 1 μm and spherical Ag particles having an average particle diameter of about 1.5 μm in a blending ratio in volume percent of 15:85. The solvent used was α-terpineol, added with isobornylcyclohexanol as a viscosity modifier. The conductive glass paste to form the collector electrode/interconnection 29 employed VTA-125 particles having an average particle diameter of about 1 μm and spherical Al particles having an average particle diameter of about 3 μm in a blending ratio in volume percent of 10:90. The solvent used was α-terpineol, added with isobornylcyclohexanol as a viscosity modifier. Each of the conductive glass pastes had a solids content of about 80 mass percent, where the "solids content" refers to the total content of the lead-free low-melting glass composition particles and the metal particles.

(Preparation of Solar Cell)

The solar cell as illustrated in FIGS. 18A to 18C was prepared by a method that will be described below.

The silicon substrate 27 (150 by 150 by 0.2 ram) used herein bore the antireflection film 31 on the light-receiving surface. The above-prepared conductive glass paste containing VTA-102 particles and Ag particles was applied to the light-receiving surface of the silicon substrate 27 by a screen process printing and dried at 120° C. to 150° C. This was heated in a tunnel furnace up to 220° C. at a rate of temperature rise of about 20° C. per minute, held for 10 minutes, further heated up to 290° C. at the same rate of temperature rise as above, and held for 5 minutes to form the front electrodes/interconnections 28 on the light-receiving surface of the silicon substrate 27. Next, the above-prepared conductive glass paste containing VTA-102 particles and Ag particles was applied to the rear surface of the silicon substrate 27 by the screen process printing and dried at 120° C. to 150° C. The above-prepared conductive glass paste containing VTA-125 particles and Al particles was applied by the screen process printing and dried at 120° C. to 150° C. This was fired under the same heating conditions as in the formation of the front electrodes/interconnections 28 and thereby formed the collector electrode/interconnection 29 and the output electrodes/interconnections 30 on the rear surface of the silicon substrate 27. The front electrodes/interconnections 28 received two thermal hystereses. This allowed the front electrodes/interconnections 28 to have good electrical connection to the silicon substrate 27. The front electrodes/interconnections 28, collector electrode/interconnection 29, and output electrodes/interconnections 30 were formed in the above manner and yielded a solar cell according to an embodiment of the present invention. In this experimental example, ten solar cells were prepared in the above manner.

(Evaluation Results of Prepared Solar Cells)

Initially, the ten solar cells prepared in this experimental example were visually inspected. As a result, the silicon substrate 27, as well as the front electrodes/interconnections 28, collector electrode/interconnection 29, and output electrodes/interconnections 30 formed on the silicon substrate 27, offered no defects such as fracture and cracking, no significant warpage, and no appearance disadvantages. This effect was achieved by the lead-free low-melting glass compositions according to the embodiments of the present invention. Specifically, the electrodes/interconnections could be formed at a significantly low temperature. Next, the prepared ten solar cells were further examined and found to have electrical connection between the silicon substrate 27 and the front electrodes/interconnections 28 and to establish ohmic contact between the silicon substrate 27 and the collector electrode/interconnection 29 and between the silicon substrate 27 and the output electrodes/interconnections 30. The ten solar cells were further examined using a solar simulator to evaluate the generation efficiency. As a result, the solar cells were found to have a generation efficiency of about 18% as high as the generation efficiency of conventional equivalents, even though the solar cells were prepared at a remarkably low temperature. To determine the reliability, three of the prepared solar cells were immersed in warm water at 50° C. for 5 days and examined to measure the generation efficiency in a similar manner as above. The conventional solar cell suffered from corrosion of the electrodes/interconnections and had significantly lower generation efficiency of about 12% to about 13%. In contrast, the solar cells prepared in this experimental example little suffered from corrosion of the electrodes/interconnections and offered approximately no deterioration in generation efficiency. This is probably because the specific reaction of the lead-free low-melting glass composition according to the embodiment of the present invention with Ag or Al can give solar cells having such high reliability, as described in Experimental Example 4.

Next, an overlap portion of the collector electrode/interconnection 29 and the output electrodes/interconnections 30 on the rear surface was disintegrated and examined. As a result, the overlap portion was found to include no brittle intermetallic compound that is formed by the reaction between Ag and Al. Thus, the silicon substrate 27 came to resist defects such as cracking even when receiving stress in a focused manner. In addition, the silicon substrate significantly less suffered from warpage, and this contributed less failure of the solar cell when handled typically upon assemblage into a module. Thus, the brittle intermetallic compounds were prevented from forming and the solar cell less suffered from warpage. This is because the solar cell according to the embodiment of the present invention can be fired at a significantly low temperature (290° C.) as compared with the firing temperatures (500° C. to 800° C.) of the conventional solar cells.

As above, the solar cell has been described in this experimental example representatively as an electrical/electronic component according to an embodiment of the present invention. Specifically, the solar cell included electrodes/interconnections formed using the conductive material and corresponding conductive glass paste each containing the lead-free low-melting glass composition according to the embodiment of the present invention. The conductive material and corresponding conductive glass paste each containing the lead-free low-melting glass composition according to the embodiment of the present invention can be effectively applied to electrodes/interconnections of not only such solar cells, but also various electrical/electronic components. The conductive material and corresponding conductive glass paste can provide electrical/electronic components that have higher functions such as reliability and excel typically in productivity and yield.

Experimental Example 9

In this experimental example, a quartz resonator package was prepared representatively as an electrical/electronic component according to an embodiment of the present invention. Whether and how the conductive material and the low-temperature sealing glass frit according to embodiments of the present invention are applicable to conductive junctions and/or seal portions of the package was examined and evaluated. In this experimental example, the conductive material and the low-temperature sealing glass frit were formed respectively using a conductive glass paste and a low-temperature sealing glass paste.

FIGS. 19A to 19F illustrate how to prepare the quartz resonator package. FIG. 19G is a schematic cross-sectional view of the prepared quartz resonator package.

The quartz resonator package illustrated in FIG. 19G includes a ceramic substrate 33 and a quartz resonator 32. The ceramic substrate 33 includes interconnections 34. The quartz resonator 32 is disposed over the ceramic substrate 33 via conductive junctions 35. The interconnections 34 and the conductive junctions 35 are electrically connected to each other. This allows the quartz resonator 32 to be electrically connected to the outside. The package further includes a ceramic cap 36 to protect the quartz resonator 32. The ceramic cap 36 is hermetically bonded to a peripheral portion of the ceramic substrate 33 in the seal portion 37. The conductive junctions 35 are formed using the conductive material according to the embodiment of the present invention, and the seal portion 37 is formed using the low-temperature sealing glass frit according to the embodiment of the present invention.

The quartz resonator package is prepared in the following manner.

Figure 19A:
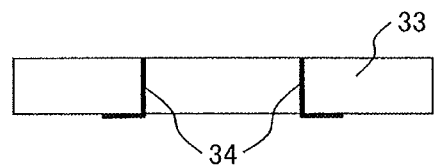
FIG. 19A is a schematic cross-sectional view illustrating a step of a method for producing a quartz resonator package according to an embodiment of the present invention.
Figure 19B:
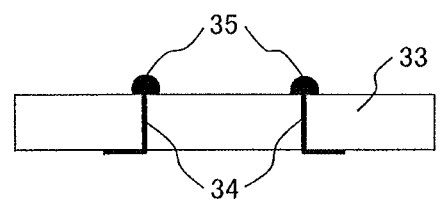
FIG. 19B is a schematic cross-sectional view illustrating another step of the method for producing a quartz resonator package according to the embodiment of the present invention.
Figure 19C:
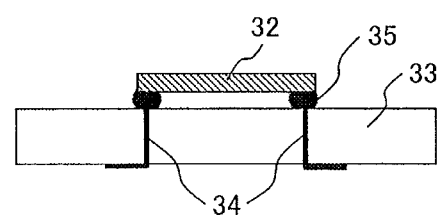
FIG. 19C is a schematic cross-sectional view illustrating yet another step of the method for producing a quartz resonator package according to the embodiment of the present invention.

Initially, the ceramic substrate 33 bearing the interconnections 34 is prepared (FIG. 19A). Next, the conductive glass paste is applied onto the interconnections 34, dried, heated in the air or in an inert gas to allow the lead-free low-melting glass composition in the conductive glass paste to soften and flow to thereby form the conductive junctions 35 (FIG. 19B).

The quartz resonator 32 is arranged on the conductive junctions 35 (FIG. 19C), heated in an inert gas or in a vacuum to allow the lead-free low-melting glass composition in the conductive junctions 35 to soften and flow again to thereby establish electric connection.

Figure 19D:
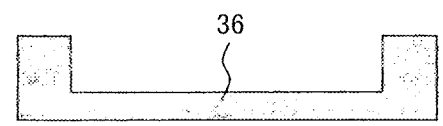
FIG. 19D is a schematic cross-sectional view illustrating still another step of the method for producing a quartz resonator package according to the embodiment of the present invention.
Figure 19E:
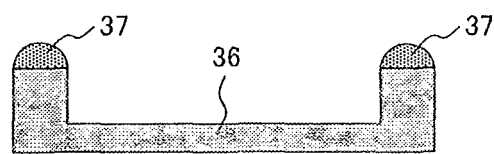
FIG. 19E is a schematic cross-sectional view illustrating another step of the method for producing a quartz resonator package according to the embodiment of the present invention.

Independently, the ceramic cap 36 is prepared (FIG. 19D). The low-temperature sealing glass paste is applied to a peripheral portion of the ceramic cap 36 (FIG. 19E), dried, and heated in the air to allow the lead-free low-melting glass composition in the low-temperature sealing glass paste to soften and flow to thereby form the seal portion 37.

Figure 19F:
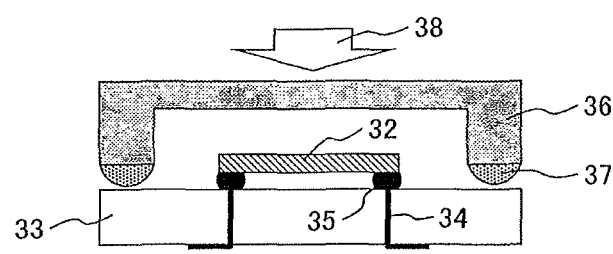
FIG. 19F is a schematic cross-sectional view illustrating yet another step of the method for producing a quartz resonator package according to the embodiment of the present invention.
Figure 19G:
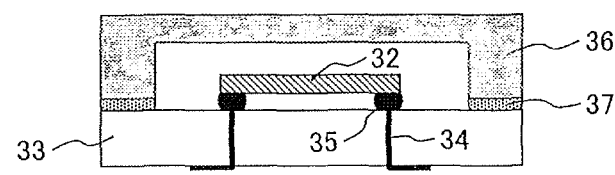
FIG. 19G is a schematic cross-sectional view of a quartz resonator package produced by the method illustrated in FIGS. 19A to 19E.

The ceramic substrate 33 bearing the quartz resonator 32 and the conductive junctions 35 (see FIG. 19C) is arranged as illustrated in FIG. 19F to face the ceramic cap 36 including the seal portion 37 (see FIG. 19S) and heated in an inert gas or in a vacuum while applying some load 38 to allow the lead-free low-melting glass composition in the seal portion 37 to soften and flow again. This gives the quartz resonator package (FIG. 19G).

The process may be performed carefully so as to prevent the conductive junctions 35 from separating from the quartz resonator 32 and the interconnections 34. For this reason, the ceramic cap 36 and the ceramic substrate 33 are preferably sealed at a temperature equal to or lower than the softening point of the lead-free low-melting glass composition in the conductive junctions 35. Specifically, the lead-free low-melting glass composition to be contained in the low-temperature sealing glass paste preferably differs from, and has a softening point lower than, the lead-free low-melting glass composition to be contained in the conductive glass paste. The two lead-free low-melting glass compositions may have a difference in softening point between them of 20° C. or higher, and preferably 40° C. or higher.

(Preparation of Conductive Class Paste and Low-Temperature Sealing Glass Paste)

In this experimental example, the lead-free low-melting glass composition to be contained in the conductive glass paste was VTA-142 having a softening point of 280° C. (see Tables 2 and 3); and the lead-free low-melting glass composition to be contained in the low-temperature sealing glass paste was VTA-132 having a softening point of 240° C. (see Tables 2 and 3). VTA-142 and VTA-132 have a difference in softening point of 40° C. and enable sealing without problems such as separation of the conductive junctions 35. This means that the conductive junctions 35 and seal portion 37 both at satisfactorily levels can be obtained at once.

Initially, particles of a lead-free low-melting glass composition according to an embodiment of the present invention, metal particles, and a solvent were blended, mixed, and yielded the conductive glass paste for the formation of the conductive junctions 35. The lead-free low-melting glass composition particles used herein were VTA-142 particles having an average particle diameter of about 3 μm; the metal particles were spherical silver (Ag) particles having an average particle diameter of about 1.5 μm; and the solvent was α-terpineol. The paste was further added with isobornylcyclohexanol as a viscosity modifier. The VTA-142 particles and the Ag particles were blended in a ratio in volume percent of 30:70. The conductive glass paste was prepared so as to have a solid content of about 80 mass percent, where the "solids content" refers to the total content of VTA-142 and Ag.

Separately, particles of a lead-free low-melting glass composition according to an embodiment of the present invention, low-thermal-expansion ceramic particles, and a solvent were blended, mixed, and yielded the low-temperature sealing glass paste for the formation of the seal portion 37. The lead-free low-melting glass composition particles used herein were VTA-132 particles having an average particle diameter of about 3 μm; the low-thermal-expansion ceramic particles were CF-01 (zirconium phosphate tungstate) particles having an average particle diameter of about 10 μm (see Table 4); and the solvent was α-terpineol. The paste was further added with isobornylcyclohexanol as a viscosity modifier. The VTA-132 particles and the CF-01 particles were blended in a ratio in volume percent of 70:30. The low-temperature sealing glass paste was prepared so as to have a solids content of about 80 mass percent, where the "solids content" refers to the total content of VTA-132 and CF-01.

(Preparation of Quartz Resonator Package)

The quartz resonator package was prepared in this experimental example by a method that will be illustrated specifically below. The ceramic substrate 33 and the ceramic cap 36 used in this experimental example were both made of aluminum oxide (α-Al$_2$O$_3$).

The prepared conductive glass paste was applied onto the interconnections 34 in the ceramic substrate 33 by dispensing and dried at 120° C. to 150° C. in the air (FIGS. 19A and 19B). This was heated up to 220° C. at a rate of temperature rise of 20° C. per minute in the air, held for 20 minutes, heated up to 330° C. at the same rate of temperature rise as above, and held for 10 minutes to form the conductive junctions 35 on the interconnections 34 of the ceramic substrate 33. The heating temperature 330° C. is higher than the softening point of VTA-142 by 50° C.

Next, the quartz resonator 32 was arranged on the formed conductive junctions 35, heated up to 330° C. at a rate of temperature rise of 20° C. per minute in an inert gas (argon), and held for 10 minutes to connect the quartz resonator 32 to the conductive junctions 35 (FIG. 19C).

Independently, the prepared low-temperature sealing glass paste was applied to the peripheral portion of the ceramic cap 36 by the screen process printing and dried at 120° C. to 150° C. in the air (FIGS. 19D and 19O). This was heated up to 220° C. at a rate of temperature rise of 10° C. per minute in the air, held for 20 minutes, further heated up to 280° C. at the same rate of temperature rise as above, and held for 10 minutes to form the seal portion 37 in the peripheral portion of the ceramic cap 36. The heating temperature of 280° C. is higher than the softening point of VTA-132 by 40° C.

The ceramic cap 36 bearing the seal portion 37 was arranged so as to face the ceramic substrate 33 connected to the quartz resonator 32. The resulting article was placed in a dedicated fixture and applied with a load (FIG. 19F). This was heated up to 280° C. at a rate of temperature rise of 10° C. per minute in a vacuum, held for 10 minutes to seal the ceramic cap 36 and the ceramic substrate 33, and yielded the quartz resonator package (FIG. 19G). In this experimental example, twenty-four quartz resonator packages were prepared in the above manner.

(Evaluation Results of Prepared Quartz Resonator Packages)

Initially, eighteen of the quartz resonator packages prepared in this experimental example were visually inspected using a stereoscopic microscope. As a result, the packages offered little misregistration of the ceramic cap 36 upon sealing, did not offer defects such as devitrification due to crystallization, fracture, and cracking in the seal portion 37, and had no defects in appearance.

Next, whether the conductive junctions 35 in the sealed ceramic cap 36 was electrically connected to the quartz resonator 32 and to the interconnections 34 was examined by a conduction test from the interconnections 34 on the rear surface of the ceramic substrate 33. The results verified that the quartz resonators went into action in all the prepared quartz resonator packages. In addition, five of the prepared quartz resonator packages were subjected each to a helium leak test and were found that the package inside was maintained under vacuum, and the peripheral portion was hermetically sealed with the seal portion 37. To verify the reliability of the seal portion 37, five of the prepared quartz resonator packages were each subjected a high-humidity/temperature test (saturated pressure cooker test) at 120° C., 100% relative humidity, and 202 kPa for 3 days. The samples were subjected to the helium leak test again and were found that all the quartz resonator packages after the high-humidity/temperature test maintained the hermeticity and adhesion of the seal portion 37.

The results demonstrated as follows. Assume that a conductive material and/or a corresponding conductive glass paste each containing a lead-free low-melting glass composition according to an embodiment of the present invention is applied to a conductive junction; and that a low-temperature sealing glass frit and/or a corresponding low-temperature sealing glass paste each containing a lead-free low-melting glass composition according to an embodiment of the present invention is applied to a seal portion. This can give quart resonator packages that have high reliability after consideration of influence on the environmental burden. In this experimental example, the conductive material and others are applied to a quartz resonator package representatively as an electrical/electronic component and a glass-sealed component according to an embodiment of the present invention. Obviously, however, the conductive material and corresponding conductive glass paste, low-temperature sealing glass frit, and corresponding low-temperature sealing glass paste according to embodiments of the present invention can be effectively expanded not only into such quartz resonator packages, but also into many of electrical/electronic components and glass-sealed components each including a conductive junction and/or a seal portion.

In Experimental Examples 6 to 9, the vacuum-insulating double glass panels, OLED displays, solar cells, and quartz resonator packages have been described representatively as glass-sealed components and electrical/electronic components according to embodiments of the present invention. Obviously, however, the present invention is not limited to these examples and can be applied to many of glass-sealed components and electrical/electronic components such as image display devices, personal digital assistants, IC ceramic packages, semiconductor sensors, multilayer capacitors, LEDs, and multilayered circuit boards.

What is claimed is:

1. A lead-free low-melting glass composition comprising:
  a principal component which includes a vanadium oxide, a tellurium oxide and a silver oxide;
  an optional secondary component which includes at least one selected from the group consisting of BaO, WO$_3$ and P$_2$O$_5$; and
  an additional component which includes at least one selected from the group consisting of oxides of elements in Group 13 of periodic table,
  wherein a total content of the principal component is 85 mole percent or more in terms of V$_2$O$_5$, TeO$_2$ and Ag$_2$O, contents of $TeO_2$ and $Ag_2O$ each is 1 to 2 times as much as a content of $V_2O_5$, and wherein a content of the secondary component is 0 to 13 mole percent, and a content of the additional component is 0.1 to 3.0 mole percent.

2. The lead-free low-melting glass composition according to claim 1, wherein the additional component includes at least one selected from the group consisting of $B_2O_3$, $Al_2O_3$, $Ga_2O_3$ and $In_2O_3$, and wherein the content of the additional component is 0.1 to 2.0 mole percent in terms of oxide.

3. The lead-free low-melting glass composition according to claim 1, having a softening point of 280° C. or lower, the softening point being determined by differential thermal analysis as a second endothermic peak temperature.

4. The lead-free low-melting glass composition according to claim 3, having a crystallization onset temperature higher than the softening point by 60° C. or more, the crystallization onset temperature being determined by the differential thermal analysis.

5. A low-temperature sealing glass frit comprising:

the lead-free low-melting glass composition according to claim 1; and low-thermal-expansion ceramic particles, wherein a content of the lead-free low-melting glass composition is 40 or more volume percent and less than 100 volume percent, and a content of the low-thermal-expansion ceramic particles is greater than 0 volume percent and 60 or less volume percent.

6. The low-temperature sealing glass frit according to claim 5, wherein the low-thermal-expansion ceramic particles include at least one selected from the group consisting of zirconium phosphate tungstate, quartz glass, zirconium silicate, aluminum oxide, mullite and niobium oxide.

7. The low-temperature sealing glass frit according to claim 5, wherein the low-thermal-expansion ceramic particles is formed of at least one of zirconium phosphate tungstate and a compound including mainly zirconium phosphate tungstate, and wherein the content of the low-thermal-expansion ceramic particles is 30 to 50 volume percent.

8. A low-temperature sealing glass paste comprising:

particles formed of the lead-free low-melting glass composition according to claim 1;

low-thermal-expansion ceramic particles; and a solvent.

9. The low-temperature sealing glass paste according to claim 8, wherein the low-thermal-expansion ceramic particles include at least one selected from the group consisting of zirconium phosphate tungstate, quartz glass, zirconium silicate, aluminum oxide, mullite and niobium oxide, and wherein the solvent includes at least one of α-terpineol and diethylene glycol n-butyl ether acetate.

10. A conductive material comprising:

the lead-free low-melting glass composition according to claim 1; and metal particles, wherein a content of the lead-free low-melting glass composition is 5 or more volume percent and less than 100 volume percent, and a content of the metal particles is greater than 0 volume percent and 95 or less volume percent.

11. The conductive material according to claim 10, wherein the metal particles include at least one selected from the group consisting of silver, silver alloys, copper, copper alloys, aluminum, aluminum alloys, tin and tin alloys.

12. The conductive material according to claim 10, wherein the metal particles include at least one of silver and aluminum, and wherein a content of the metal particles is 10 to 90 volume percent.

13. A conductive glass paste comprising:

particles formed of the lead-free low-melting glass composition according to claim 1; and a solvent.

14. The conductive glass paste according to claim 13, further comprising metal particles.

15. The conductive glass paste according to claim 14, wherein the metal particles include at least one selected from the group consisting of silver, silver alloys, copper, copper alloys, aluminum, aluminum alloys, tin and tin alloys.

16. The conductive glass paste according to claim 13, wherein the solvent includes at least one of α-terpineol, and diethylene glycol n-butyl ether acetate.

17. A glass-sealed component having a seal port ion including 40 to 100 volume percent of a lead-free low-melting glass phase, wherein the lead-free low-melting glass phase includes a principal component including a vanadium oxide, a tellurium oxide and a silver oxide, and the lead-free low-melting glass phase includes the principal component in a total content of 85 mole percent or more in terms of oxide, and contents of $TeO_2$ and $Ag_2O$ are each 1 to 2 times as much as a content of $V_2O_5$, and wherein the lead-free low-melting glass phase further includes a secondary component including at least one selected from the group consisting of BaO, $WO_3$ and $P_2O_5$, and a total content of the secondary component is greater than 0 mole percent and 13 mole percent or less in terms of oxide, wherein the lead-free low-melting glass phase further includes an additional component including at least one selected from the group consisting of $B_2O_3$, $Al_2O_3$, $Ga_2O_3$ and $In_2O_3$, and a content of the additional component in the lead-free low-melting glass phase is 0.1 to 2.0 mole percent.

18. The glass-sealed component according to claim 17, wherein the additional component includes at least one selected from the group consisting of $Al_2O_3$, $Ga_2O_3$ and $In_2O_3$, and a content of the additional component in the lead-free low-melting glass phase is 0.1 to 1.0 mole percent.

19. The glass-sealed component according to claim 17, being one of a vacuum-insulating double glass panel and a display panel.

20. An electrical/electronic component comprising at least one unit selected from the group consisting of electrodes, interconnections, and conductive junctions, wherein the unit includes 5 or greater volume percent and less than 100 volume percent of a lead-free low-melting glass phase, and greater than 0 volume percent and 95 or less volume percent of metal particles, the lead-free low-melting glass phase including a principal component, a secondary component and an additional component, wherein the principal component includes a vanadium oxide, a tellurium oxide and a silver oxide, a total content of the principal component in the lead-free low-melting glass phase being 85 mole percent or more in term of $V_2O_5$, $TeO_2$ and $Ag_2O$, contents of $TeO_2$ and $Ag_2O$ each being 1 to 2 times as much as a content of $V_2O_5$, wherein the secondary component includes at least one selected from the group consisting of BaO, $WO_3$ and $P_2O_5$, a total content of the secondary component in the lead-free low-melting glass phase being greater than 0 mole percent and 13 mole percent or less in terms of oxide and, wherein the additional component includes at least one selected from the group consisting of $B_2O_3$, $Al_2O_3$, $Ga_2O_3$, and $In_2O_3$, a content of the additional component in the lead-free low-melting glass phase being 0.1 to 2.0 mole percent, the metal particles including at least one selected from the group consisting of silver, silver alloys, copper, copper alloys, aluminum, aluminum alloys, tin and tin alloys.

* * * * *